United States Patent [19] | [11] 4,277,675
Mar et al. | [45] Jul. 7, 1981

[54] NON-SEQUENTIAL COUNTER

[75] Inventors: Clarence Y. Mar; Michael J. Caruso, both of Houston, Tex.

[73] Assignee: Texas Instruments Incorporated, Dallas, Tex.

[21] Appl. No.: 23,369

[22] Filed: Mar. 23, 1979

Related U.S. Application Data

[63] Continuation of Ser. No. 901,894, May 1, 1978, abandoned, which is a continuation of Ser. No. 735,917, Oct. 27, 1976, abandoned.

[51] Int. Cl.³ .............................................. H03K 23/22

[52] U.S. Cl. .......................... 235/92 MB; 235/92 SH; 235/92 LG; 307/221 R

[58] Field of Search ....... 235/92 SH, 92 NG, 92 LG, 235/92 MB; 307/221 R, 223 R; 328/37, 43

[56] References Cited

U.S. PATENT DOCUMENTS 2,845,617 7/1958 Turvey .......................... 235/92 MB
3,716,725 2/1973 Freeman .............................. 307/223
3,816,764 6/1974 King .................................. 307/223 R
3,875,377 4/1975 Hirsch ............................. 235/92 LG
3,911,330 10/1975 Fletcher et al. ................. 235/92 SH
3,962,701 6/1976 Heimbigner ...................... 307/223 R
3,978,413 8/1976 Frohwerk ........................ 307/221 R

*Primary Examiner*—Joseph M. Thesz
*Attorney, Agent, or Firm*—Melvin Sharp; Leo N. Heiting; William K. McCord

[57] ABSTRACT

Disclosed is a non-sequential counter. The non-sequential counter comprises, in a preferred embodiment, six inverters coupled together as a three stage shift counter, the input of which is generated according to a feedback term provided by the outputs of each one of the inverter stages. Counters having more than three stages are also disclosed. The feedback term is provided by disclosed decoder circuitry. The non-sequential counter counts through all possible states; thus, a counter having N stages will count non-sequentially through $2^N$ possible binary states.

5 Claims, 41 Drawing Figures

Fig. 5a
Fig. 5b
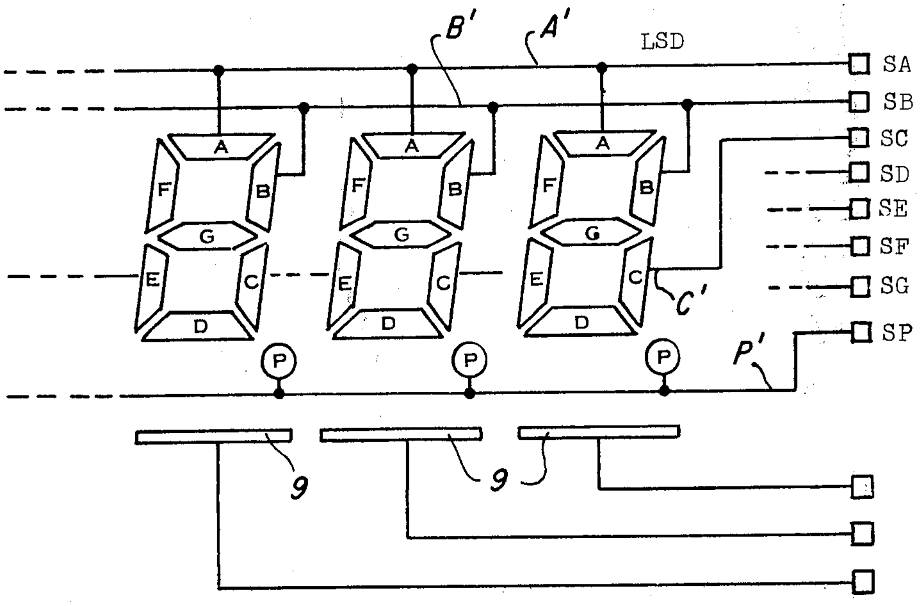

DATA WORD FORMAT

MASK CODE FORMAT

| MASK NAME | MASK FIELD CODE |
|---|---|
| ALL | 0001 |
| MANT | 0010 |
| EXP | 0101 |
| MMSD | 0000 |
| MAEX | 0011 |
| LLSD | 0100 |
| FMAEX | 0111 |
| FLAG | 1001 |
| DGT 13 | 1101 |
| DGT 14 | 1000 |
| DGT 15 | 1111 |
| DIGIT | 1010 |

202
225
4x.2 caps.
1
218
219
212
207
213
217
237
254
MASKØ
216
204b
204a
SHIFT
STORE
228
229
274
BCDR
CL S31
5
VDD
IO
EXCH DUAL SPEED
SHIFT REGISTER
440
ADDER COND SET
C/B STROBE
MASK
MSKΦ
TGLEXCA
MDP
FLGOP
1RS
2RS
S31·P2
S1·P2
S0·Φ1
S0·Φ2
VSS
P2
401
413
414
434
437
438
441
442
443
444
460
461
462
463
464
468
469
470
471
472
473
474
475
476
477
470a
471a
472a
473a
474a
475a
476a

46

A

| | (MSB) W | V | U | DECODE SEG | DISP SEG | KEYBOARD SCAN-KS | HOLD |
|---|---|---|---|---|---|---|---|
| DISP1 | 1 | 1 | 1 | D | — | — | 1 |
| | 1 | 1 | 0 | A | D | KS6 | 1 |
| | 1 | 0 | 1 | B | A | KS5 | 1 |
| | 0 | 1 | 0 | C | B | KS2 | 1 |
| | 1 | 0 | 0 | E | C | KS4 | 1 |
| | 0 | 0 | 0 | F | E | KS0 | 1 |
| | 0 | 0 | 1 | G | F | KS1 | 1 |
| | 0 | 1 | 1 | P | G | KS3 | 0 (REL. HOLD) |
| DISP2 | 1 | 1 | 1 | D | P | KS7 | 1 |
| | 1 | 1 | 0 | A | D | KS6 | 1 |

NON-SEQUENTIAL COUNTER

This is a continuation of copending patent application Ser. No. 901,894, filed May 1, 1978, which is now abandoned, which was a continuation of Ser. No. 735,917, filed Oct. 27, 1976, now abandoned.

TABLE OF CONTENTS

Background of the Invention
Brief Description of the Drawings
Detailed Description of Specific Embodiment
Detailed Description of System Logic Diagram
The ROM and Program Counter
The Subroutine Stack
The Branch Logic and Condition Latch
The Test Circuitry
The Instruction Word Decoder Logic
Register Address Buffer
Storage Register Input/Output Circuit
The Operational Register Selector Gates
Arithmetic Unit
Register R5
Scan Generator Counter and Segment/Keyboard Scan
Keyboard Logic
Display Decoder
Output Register
State Time Generator
Register Configuration
Tables
Claims

BACKGROUND OF THE INVENTION

Electronic calculator systems of the type wherein all of the main electronic functions are integrated in a single large cell integrated semiconductor chip or in a small number of such chips, are described in the following U.S. Patents, which are assigned the assignee of this invention:

U.S. Pat. No. 3,919,532 issued to Michael J. Cochran and Charles P. Grant on Nov. 11, 1975 and entitled "CALCULATOR SYSTEM HAVING AN EXCHANGE DATA MEMORY REGISTER".

U.S. Pat. No. 3,934,233 issued to Roger J. Fisher and Gerald D. Rogers on Jan. 20, 1976 and entitled "READ-ONLY-MEMORY FOR ELECTRONIC CALCULATOR".

U.S. Pat. No. 3,931,507 issued Jan. 6, 1976 to George L. Brantingham entitled "POWER-UP CLEAR IN AN ELECTRONIC DIGITAL CALCULATOR".

The concepts of these prior applications have made possible vast reductions in the cost of small personal-size calculators. Continuing efforts to reduce the cost of these products include the design of a single chip calculator system for use in large capacity calculators, such as scientific or business calculators. The chip disclosed herein may be utilized in scientific or business calculators for instance, because this chip has provisions for a number of storage registers, in addition to operational registers, as well as sufficient capacity to solve the more complicated mathematical expressions and functions used in scientific and business calculators including, for example, trigonometric and logarithmic relationships.

The present invention relates to a non-sequential counter. An entire electronic calculator system including the non-sequential counter of this invention is disclosed. The electronic calculator disclosed is a serial, word organized calculator. It should be evident, however, that the invention disclosed is operable with other types of electronic calculators and devices. In the prior art, it is known to provide a non-sequential counter having N bit positions (and therefore 2N inverters) wherein the feedback term (i.e. the bit to be shifted into the least significant bit position) is generated by an exclusive OR circuit responsive to the two most significant bit positions. That is, if the two most significant bits are of the same state (either both ones or both zeros), a logical one is shifted into the least significant bit position for the next number to be generated. By using this prior art method, the counter will count through $2^N-1$ states, which is one less than the number of states possible for a counter having N bit positions. This result occurs because this prior art counter is incapable of counting to a binary number having a one in each one of the bit positions. In the prior art, it was known to use additional logic circuitry for forcing the counter into a state where logical ones occupied every bit position and to force the counter of that particular state. For example, see FIGS. 9 and 19 and the discussion relating thereto in U.S. Pat. No. 3,989,939. While this prior art counter was effective for counting through the $2^N$ states by using the additional logical circuitry, the additional logical circuitry highly complicated the design of the counter.

It is therefore one object of this invention to provide a simplified non-sequential counter. It is another object of this invention to provide a non-sequential counter having N bit positions and capable of counting through $2^N$ states. It is yet another object of this invention to provide an N bit position non-sequential counter capable of counting through $2^N$ states without the necessity of circuitry to force the counter into and out of a particular state.

The foregoing objects are achieved according to the present invention as is now described. In a preferred embodiment of the invention, a non-sequential shift register is provided on an electronic calculator semiconductor chip. The non-sequential counter utilized on the calculator chip is a three bit counter and is provided as part of the segment scan circuitry for driving the segments of the characters of the display. The counter's output is also provided as an input to the display decoder for decoding which segments are to be actuated during a particular segment scanning cycle. The three bit non-sequential counter includes six inverters coupled by clocked transfer gates to form a shift register. An output from each of the inverter stages is provided to a feedback logic circuit which decodes the present state of the counter and determines whether a logical zero or one should be loaded into the least significant bit position of the counter during the next incrementing cycle. In the embodiment disclosed, the feedback logic circuit comprises an AND gate responsive to the output of the least significant bit position in false logic and the output of the second bit position in true logic, an OR gate responsive to the AND gate and to the output of the most significant bit position in true logic, another OR gate responsive to the output of the least significant bit position in true logic and the outputs of the second bit position and the most significant bit position in false logic and a NAND gate responsive to the outputs of the two OR gates. The NAND gate provides the bit to be inserted into the least significant bit position of the shift register. Further, counters having more than three bit positions are disclosed as well as how the particular arrangement of the feedback logic gates may be developed.

BRIEF DESCRIPTION OF THE DRAWINGS

The novel features believed characteristic of the invention are set forth in the appended claims. The invention itself, however, as well as a preferred mode of use, further objects and advantages thereof, will be best understood by reference to the following detailed description of an illustrative embodiment when read in conjunction with the accompanying drawings, wherein:

FIGS. 5(*a*) and 5(*b*) depict a segmented display and a manner in which a calculator system may be interconnected therewith;

DETAIL DESCRIPTION OF SPECIFIC EMBODIMENT

Figure 1:
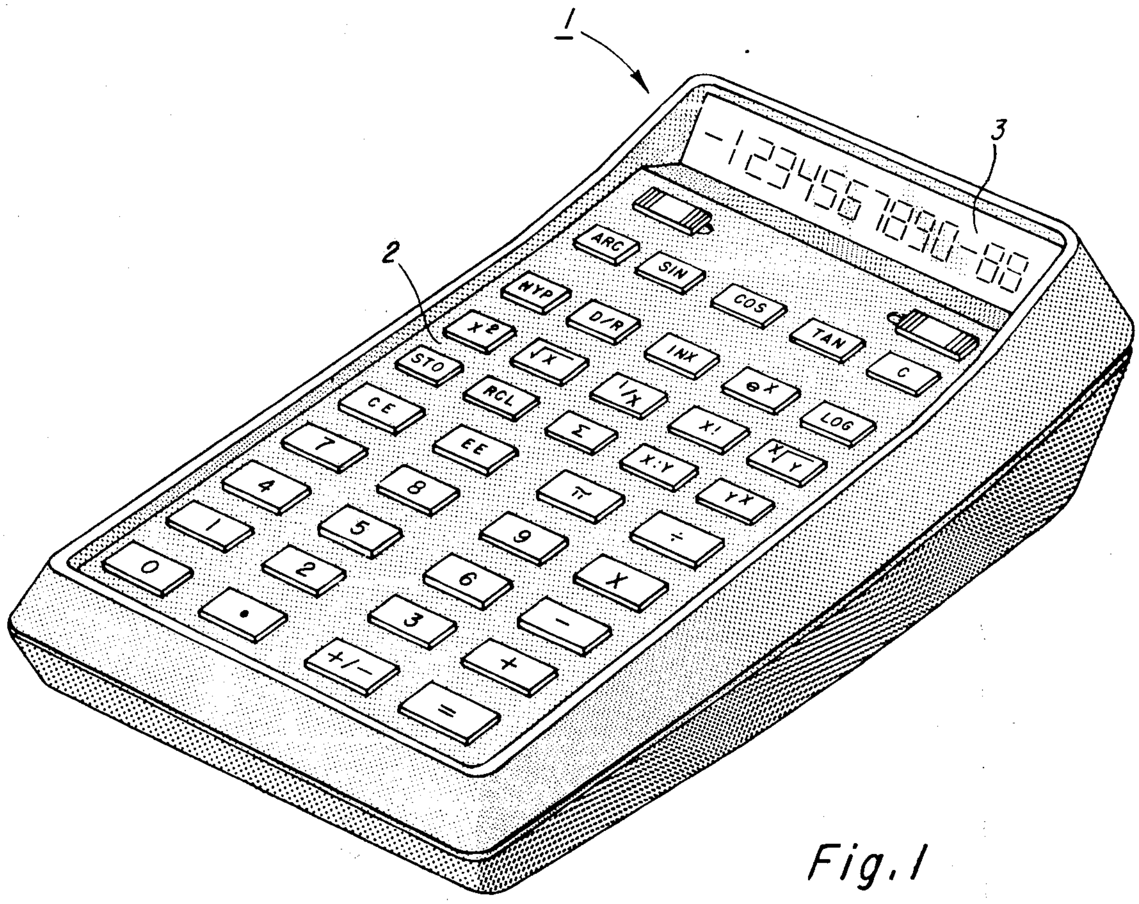
FIG. 1 is pictorial view of a portable, electronic, hand-held calculator of the type which may embody the present invention.

Referring to FIG. 1, an electronic portable calculator the type which may employ features of this invention is shown in pictorial form. The calculator 1 comprises the keyboard 2 and the display 3. The display 3, in one embodiment, consists of twelve digits or characters, each provided by an array of light-emitting diodes, a vacuum fluorescent tube, liquid crystal devices or other display means. The display is preferably implemented having eight mantissa digits, two exponent digits, and two annotator places for signs, et cetera (one place for the mantissa and one place for the exponent), thereby permitting outputting of data in scientific notation. Ordinarily, the display would be of the seven segment or eight segment variety, with provision for indicating a decimal point for each digit. The keyboard 2 or other such input means preferably includes a set of number keys (0–9), a decimal point key, a plurality of function command keys including, for example, exponential, logarithm and trigonometrical funtions. The expoential and logarithmic function command keys include, for example, $X^2$, the square root of X, the reciprocal of X, $e^X$, the common log of X, and the natural log of X. The trigonometrical functions include for instance the sine, cosine, tangent and their inverses, the hyperbolic sine, hyperbolic cosine, and hyperbolic tangent of X and inverse hyperbolic functions. Other function command keys include store (STO), and recall (RCL), keys for respectively storing and recalling a number stored in one of the memory or storage registers implemented on the chip. The enter exponent key (EE) allows exponent entry of the number displayed in scientific notation. A plus/minus key is provided for changing the sign of the display number. An exchange key (X:Y) is provided for exchanging operator and operand of an arithmetic function. More conventional function command keys are supplied, including the clear key (C), the clear entry key (CE), and the plus (+), minus (−), multiply (×), divide (÷), and equal (=) keys.

Figure 2:
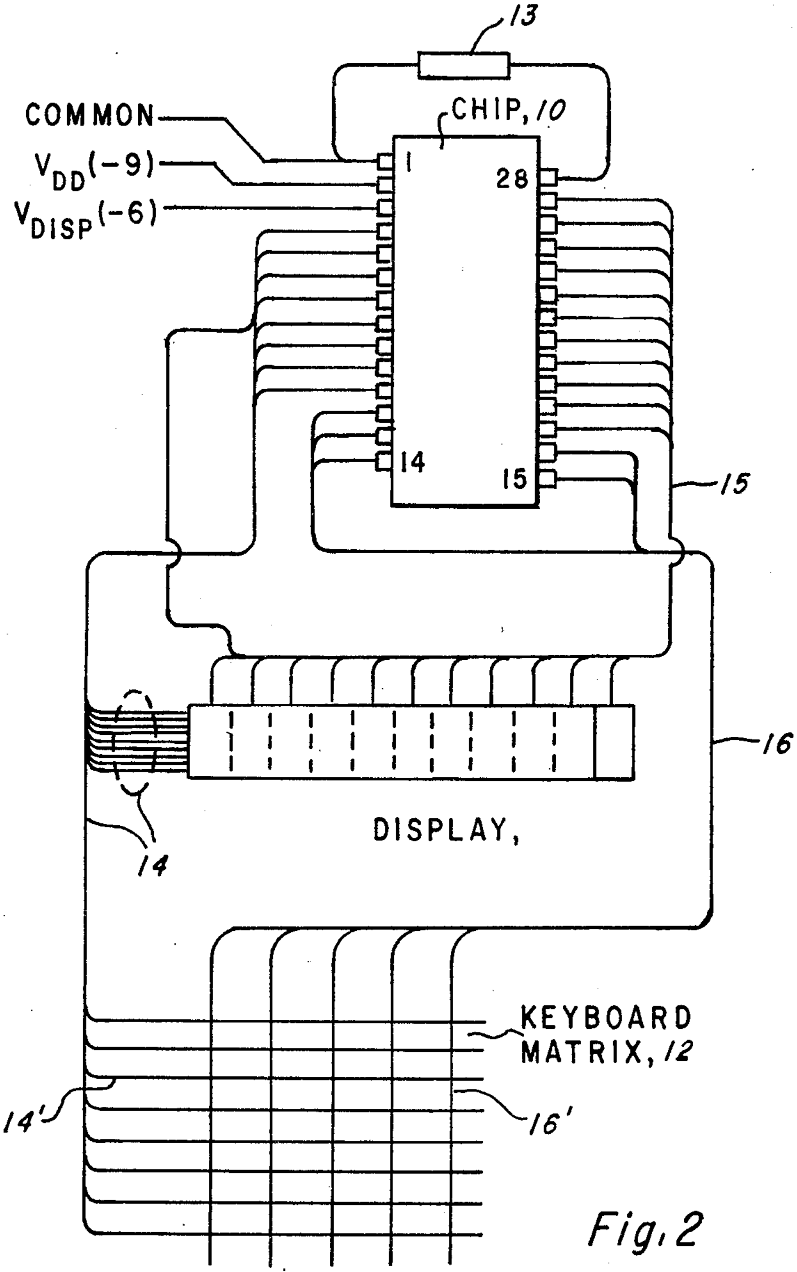
FIG. 2 is a functional schematic diagram of a single chip calculator system of the type which may embody the present invention.

Referring now to FIG. 2 there is shown a functional schematic diagram of the single chip calculator system. A single chip 10 is shown here in a standard twenty-eight pin dual-in-line package; however, it is to be understood that how the chip 10 is shown as being interconnected with a twelve-character display 11 utilizing a segment scan technique. Each of the 7 segments of the character plus the decimal point for each character position are individually connected in common to the segment scan conductors 14. An individual common lead for each character position is connected by bus 15 to chip 10. The details of segment scanning are explained with reference to FIGS. 3 and 5 and it should be evident to one trained in the art that the number of segments selected and the number of characters selected is a design choice.

Chip 10 is interconnected with an X/Y matrix keyboard 12 utilizing five column conductors 16' and eight row conductors 14', the row conductors 14' being individually connected to the segment scan conductors 14 and the column conductors 16' being individually connected via bus 16 to chip 10. An X/Y matrix keyboard having five column conductors 16' and eight row conductors 14' may accommodate up to 40 switches located at the intersections of the conductors; however, the number of conductors 14' and 16' and consequently the number of switches is a design choice. The chip 10 is further connected to a source of DC electrical power through a common connection (Vss) at pin 1, a Vdd connection at pin 2, and a $V_{DISP}$ connection at pin 3 for the display. Further, a resistor 13 is connected between pins 28 and 1 as a means of controlling the chip's oscillator frequency. External resistor 13 could of course be implemented on chip 10, however, resistor 13 is preferably implemented off chip 10 in order to be able to "fine tune" the frequency of the clock oscillator implemented on chip 10.

Figure 3:
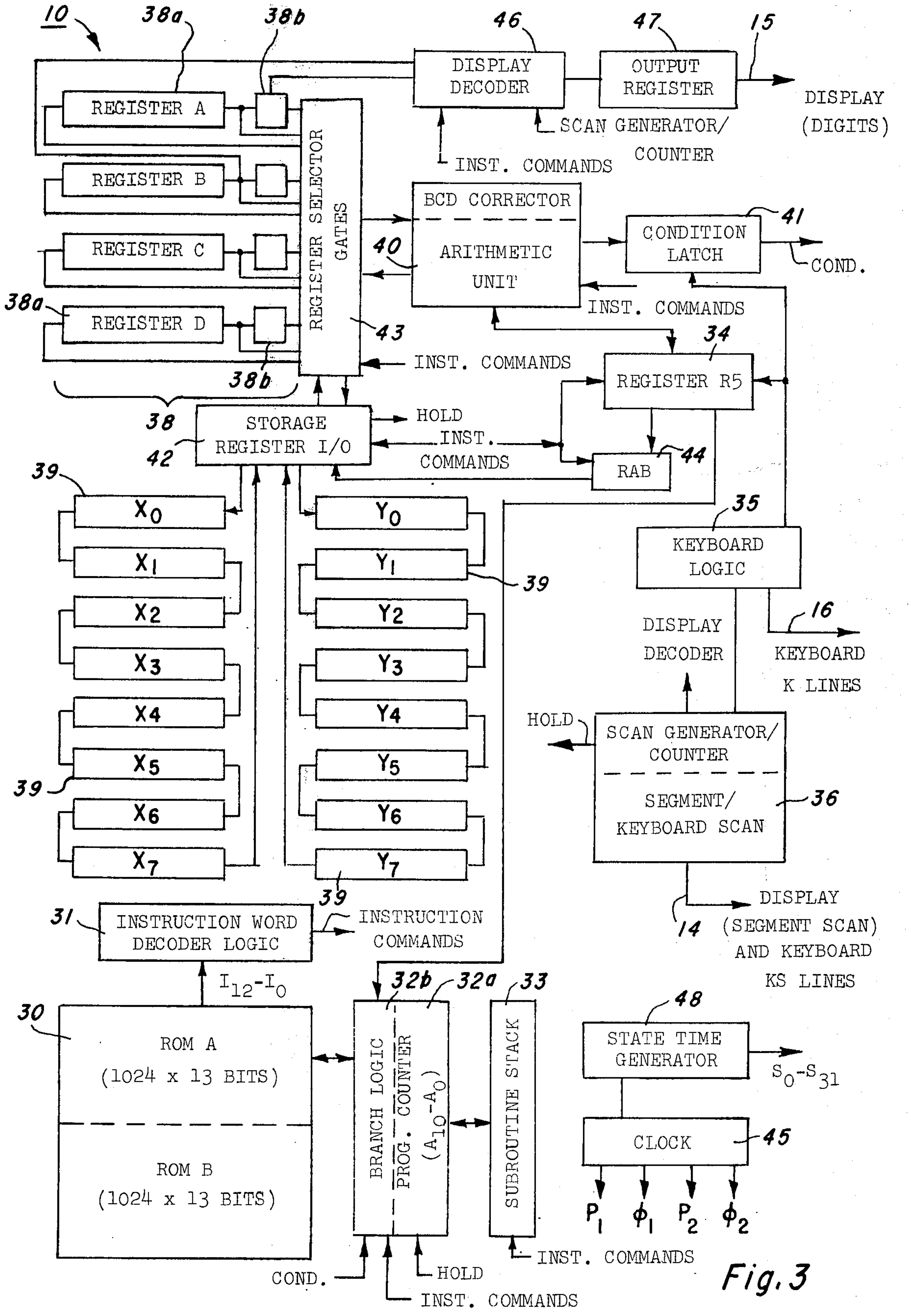
FIG. 3 depicts a functional block diagram of the single chip calculator system embodying the present invention.

Referring now to FIG. 3 there is shown a functional block diagram of the single chip calculator system of this invention showing various circuits implemented on chip 10. A detailed description of the individual function blocks will be discussed subsequently with regard to FIGS. 7, 8, 9, 10 and 11, with only a general functional description of the basic system here set forth. It is to be understood that on the block diagram of FIG. 3, a connection represented by a single line may represent a plurality of actual hardware interconnections, and for ease and simplicity of illustration, a single line may represent a plurality of different functions. The calculator system of this invention includes on chip 10 a main program read-only-memory (ROM) 30, preferably having two sections which may be referred to as ROM A and ROM B. The reason for denoting that ROM 30 has two sections will be subsequently explained in regard to the instruction words implementable in ROM 30. Main program ROM 30 is responsive to an eleven bit ROM address ($A_{10}$–$A_0$) stored in program counter 32*a* and produces, in response thereto, a thirteen bit instruction word ($I_{12}$–$I_0$), which is provided to instruction word decoder logic 31. Instruction word decoder logic 31 interprets the instruction word received from ROM 30 and produces in response thereto a plurality of command signals to the other circuits implemented on chip 10. These command signals direct how data is transferred within chip 10, how the data is manipulated by arithmetic unit 40 and serves several other functions which will be explained with reference to the circuits receiving the command signals.

Program counter circuit 32*a* includes an add-one circuit and is associated with branch logic 32*b*. The add-one circuit in program counter 32*a* increments the ROM address stored in the address register in program counter 32*a* by adding the number one to the address stored in the address register during each instruction cycle, thereby causing the instruction words stored in ROM 30 to be read out sequentially. At times, however, it is advantageous to be able to execute the same instruction word repetitively and therefore the add-one circuit in program counter 32*a* is responsive to a HOLD command which disables the add-one circuit allowing the address stored in program counter 32*a* to remain unchanged. Branch logic 32*b* is responsive to commands generated by instruction word decoder logic 31 for inserting a new ROM address in program counter 32*a*, thereby permitting the program stored in ROM 30 to "branch" to a new location in ROM 30 rather than cycling sequentially through the instruction words stored in ROM 30. As will be seen with respect to the discussion of the instruction word set and the details of the branch logic 32*b* and program counter 32*a* circuits, a branch instruction received from instruction word decoder logic 31 may be either a conditional or an unconditional branch. If unconditional, the branch automatically occurs. If conditional, however, the branch instruction is executed only if the state of the condition latch 41 matches the state of a selected bit in the conditional branch instruction. If a match does not occur, program counter 32*a* merely cycles to the next sequential ROM address. Thus, branch logic 32*b* and program counter 32*a* circuits are interfaced with condition latch 41.

If a branch is to be accomplished, the program counter must be updated with the new ROM address by branch logic 32*b*. This new ROM address is typically derived from the branch instruction, but as will be seen from the discussion regarding the instruction word set, the new ROM address may also be derived from an address stored in an auxiliary register called R5 register 34. Since R5 register 34 can be loaded with an address corresponding the depression of a particular switch or key on keyboard matrix 12 (FIG. 12) or with number from an operational register 38 supplied via arithmetic unit 40, the new ROM address can be made dependent on the particular keyboard key depressed or can be an "indirect" address generated in one of the operational registers.

Branch logic and program counter circuit 32 is further interconnected with a subroutine stack 33. Subroutine stack 33 is preferably a three level stack having eleven bits per level which receives an incremented ROM address from program counter 32*a* in response to an unconditional branch command (CALL) and supplies the most recently received ROM address back to program counter 32*a* in response to a RETURN command received from instruction word decoder logic 31. The ROM address loaded into subroutine stack 33 in response to an unconditional branch command is the incremented address to which program counter 32*a* would have otherwise cycled. Therefore, when an unconditional branch instruction is encountered in ROM 30, program counter 32*a* is caused to branch to the address specified by the unconditional branch command and then increments that address by one each instruction cycle until another branch or a return command is received. When a return command is encountered, the most recently stored address in subroutine stack 33 is loaded back into program counter 32*a*, thus the addressing of the program stored in ROM 30 "returns" to the instruction address following the last unconditional branch instruction word location. Since subroutine stack 33 is a three level stack, three levels of subroutining are possible. Should a fourth address be loaded into subroutine stack 33, the first stored address is lost and only the second through fourth addresses will remain in subroutine stack 33.

R5 register 34 is an eight bit register which stores the two least significant digits generated by arithmetic unit 40 unless keyboard logic 35 in combination with a keyboard scan circuit in the scan generator/counter 36 indicates that one of the calculator keyboard keys has been depressed, in which case, an address associated with the key depressed is loaded into R5 register 34. The keyboard key address loaed into R5 register 34 may then be loaded into program counter 32*a* upon a "Branch on R5" instruction command, thereby permitting the keyboard to address ROM 30. Alternatively, a "branch on R5" instruction command may be utilized to perform indirect addressing by using the contents of one or two of the operational registers 38, as aforementioned. Since program counter 32*a* is an eleven bit counter, the three most signficant bits (MSB's) are loaded with zeros when the eight bit address from R5 register 34 is loaded into program counter 32*a*.

Figure 6A:
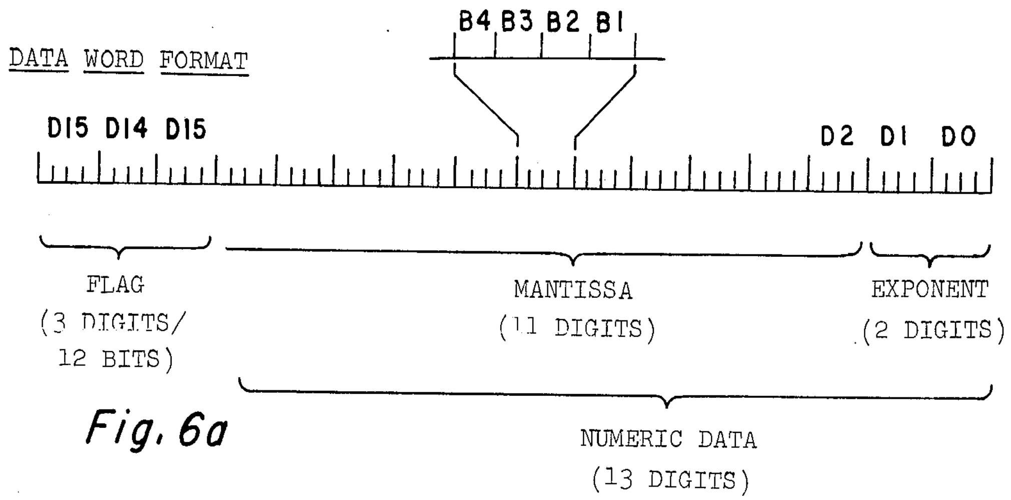
FIGS. 6(*a*) and 6(*b*) depict the format of the data word stored in the operational and storage registers of the calculator system, the MASK codes which are used in the instruction words implemented in the read-only memory and how these various masks relate to the data words.

Referring briefly to FIG. 6*a*, the format of the data stored in the various operational and storage registers implemented on chip 10 is depicted along with the effect of the various mask codes used in many instruction words. With respect to the format of the data, it can be seen that there are sixteen digits (D0–D15) in a data word; preferably, the three most significant digits (MSD's) provide twelve flag bits and the thirteen least significant digits (LSD's) provide thirteen digits for numeric data. However, as will be seen, the calculator system disclosed has sufficient flexibility to permit the three MSD's to be used either partially or totally for data storage in addition to the thirteen LSD's, if desired during certain operations. Whether the calculator is operating in hexadecimal or binary coded decimal (BCD), four binary bits are required to represent each digit. The data word is serially organized, so each data word comprises 64 (e.g. 16×4) binary bits.

Referring again to FIG. 3, chip 10 is provided with four operational registers (register A–D) 38 and sixteen data storage registers ($X_0$–$X_7$ and $Y_0$–$Y_7$) 39. The operational registers 38 and the storage registers 39 are each 64 bit shift registers, accommodating the 64 bit format of the data words. The sixteen data storage registers 39 are separated into X and Y groups, each group comprising eight serially connected registers, thus each group of eight registers may be viewed as a 512 (e.g. 64×8) bit shift register. Both groups of shift registers are interconnected with storage register input-output (I/O) circuit 42. The first bit clocked out of a storage register 39 is the least significant bit of digit DO.

The operational registers 38 are similarly 64 bit registers, the 38*a* portion having sixty bits of capacity and the 38*b* portions having four bits of capacity. The operational registers 38, including the point of junction between 38*a* and 38*b* portions, are interconnected with a plurality of register selector gates 43 which control the exchange of data between the operational registers and with arithmetic unit 40. As will be subsequently discussed in greater detail, the separation of operational registers A–D 38 into the aforementioned sixty bit and four bit portions and the connection therebetween with register selector gates 43, facilitates right or left shifting of data, because then it is desirable for the register selector gates 43 to be able to selectively pick off the data word starting with the D15 digit, which is stored in portion 38*b* or the DO digit, which is stored in portion 38*a* at the beginning of an instruction cycle (state S0) for instance. Storage register I/O circuit 42 is interconnected with register A to permit movement of a data word between a selected storage register 39 and operational register A.

A data word may be either outputted from Register A 38 and stored in a selected storage register and stored in Register A. To effect such movement of a data word between Register A and a selected storage register 39, an appropriate instruction word from ROM 30 is received by instruction word decoder logic 31 indicating (1) from which group, X or Y, the particular storage register 39 is to be selected and (2) whether the data word is being moved from Register A to a storage register or from a storage register to Register A. The contents of an address register, register address buffer (RAB) 44, indicates which one of the eight storage registers in the addressed group is being selected.

RAB 44 is a three bit address register which can be loaded either from R5 register (three least significant bits) or from three selected bits of an instruction word as directed by appropriate instruction commands. The data words stored in the eight storage registers 39 in each group normally recirculate, with each 64 bit data word moving to an adjacent storage register location during each instruction cycle. Thus, during one instruction cycle the contents of $X_0$ shifts to $X_1$ while the contents of $X_1$ shifts to $X_2$ and so forth. This shifting, of course, is responsive to the outputs from clock 45. I/O circuit 42 further includes a three bit counter which is likewise responsive to clock generator 45 for indicating which one of the eight data words stored in the addressed group is ready to be read out of $X_7$ or $Y_7$. Thus the three bit counter implemented in I/O circuit 42 increments by one each instruction cycle. When a data word is to be read from or into a selected storage register 39, RAB 44 is first loaded with a three bit binary number indicating which one of the eight data word locations in a group is to be addressed. Then an instruction word is decoded by instruction word decoder logic 31 commanding I/O circuit 42 to select the proper group, X or Y, and to count instruction cycles until the counter contained therein matches the state of RAB 44. Thus it can be seen that it could require up to seven instruction cycles for the selected data word in one of the groups, X or Y, to be shifted into a position preparatory to reading out of or into that group. Thus I/O circuit 42 generates the HOLD command which inhibits incrementing program counter 32 until the counter in I/O circuit 42 matches the state of RAB 44 and the desired data is moved between the appropriate group and Register A.

Arithmetic unit 40 is a serially organized arithmetic unit which includes a binary coded decimal (BCD) corrector. The BCD corrector may be disabled by an appropriate instruction command thereby permitting arithmetic unit 40 to operate either in hexadecimal base or in binary coded decimal base, as desired. As aforementioned, the data format preferably includes twelve flag bits. These flag bits are used, for instance, during many problems for keeping tract of ths results of certain logical operations. Including the flag bits in the data words stored in the operational registers 38A and 38B and in the storage registers 39 is an important feature of this invention which permits greater programming flexibility in implementing the instruction words into ROM 30 and further simplifies chip 10 in that it eliminates the need for the discrete or dedicated flag registers or latches used in the prior art, and permits the flags to be processed in arithmetic unit 40 rather than in separate flag logic circuitry as done in the prior art. Arithmetic unit 40 is responsive to selected flag bits and selected instruction commands (Table I, Section 7) for setting the condition latch 41. Thus, in accordance with selected instruction words (Table I, Section 7), the twelve flags may be individually set, reset, toggled, or tested. Further, the three MSD's used for flags may be arithmetically operated upon in hexadecimal using appropriate instruction words (see Table I) with appropriate flag masks (see FIG. 6).

The "set flag" instruction (see Table I, Section 7) loads a binary one into the addressed flag bit, while the "reset flag" instruction loads a zero; and "toggle" changes a zero flag to one or a one flag to a zero. The "flag test" instruction causes the condition latch (COND) to be set only if the tested flag has been previously set, e.g., contains a binary one. Thus the flag bits can be advantageously used to determine whether or not a condition branch instruction will cause a branch to occur.

Register A and Register B are outputted to display decoder 46 is response to a display instruction command. The contents of Register A contains the digits to be displayed by the display 11 (FIG. 2) and Register B is loaded with bits which indicate the position of the decimal point and whether or not a particular digit is to be blanked. By using Register B to store digit blanking and non-blanking codes along with a decimal point and negative sign codes, which codes are loaded into Register B in accordance with instruction words contained in ROM 30, is another important feature of this invention eliminating the need for using discrete leading zero blanking circuitry, as used in the prior art. The display decoder 46 is connected to output register 47 which provides the digit scan lines to the display 11 via lines 15. The scan generator 36, display decoder 46 and output register 47 cooperate to drive the display 11 (FIG. 2) using the segment scan display technique disclosed by U.S. Pat. No. 4,014,012.

Figure 4A:
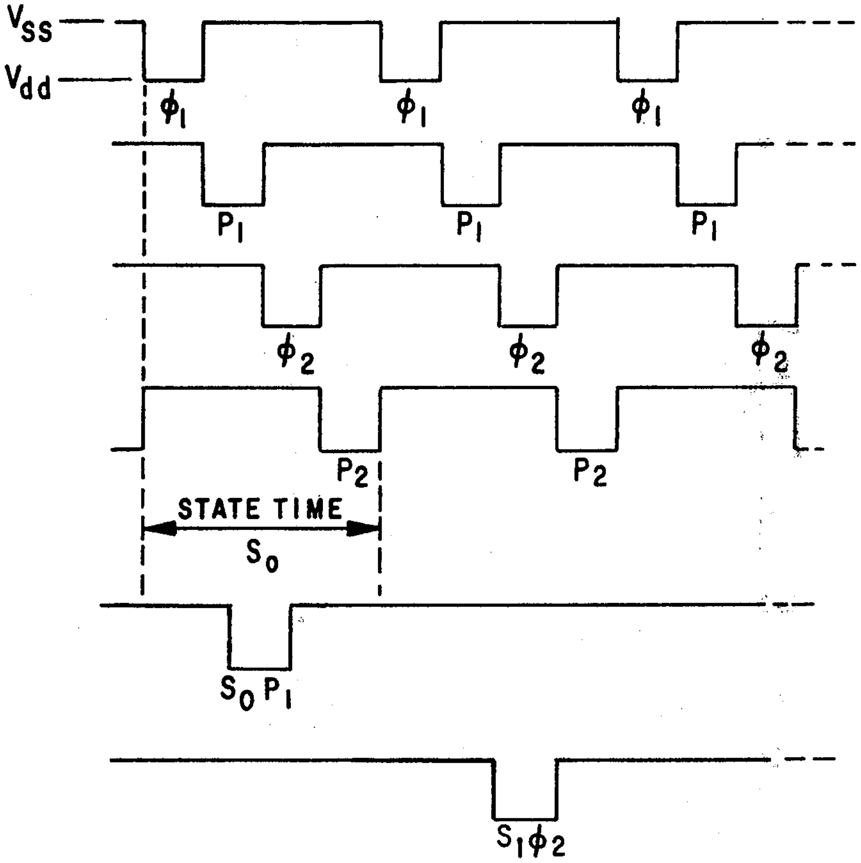
FIG. 4(*a*) and 4(*b*) depict the timing signals generated by a clock implemented in the calculator system, the timing signals being shown in representative form.
Figure 4B:
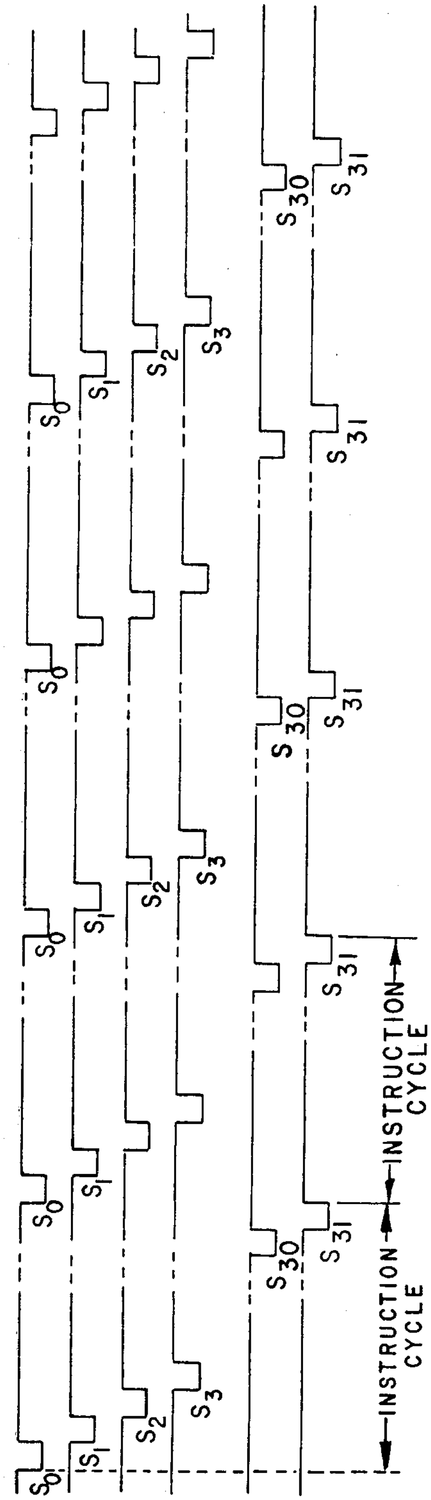

Referring now to FIGS. 4*a* and 4*b*, there is shown, in representative form, the timing signals generated by the clock generators 45 implemented on chip 10. The clock generators 45 may be of conventional design, and are not shown in detail herein. The clock generators sequentially generate $\phi$1, P1, $\phi$2 and P2 clock pulses, each pulse having a pulse width time of approximately 0.625 microsecond in this embodiment. The precise frequency of the clock generator is typically "fine tuned" using an external resistor 13 (FIG. 2). A full sequence of the four above-identified clock pulses comprise one state time (S0, S1, S2, etc.), each state time having a duration of approximately 2.5 microseconds in this embodiment. One state time represents the time needed for two bits of a data word to be clocked out of a register. Thus, it requires two state times for a four bit hexadecimal or BCD numeral to be inputted into the arithmetic unit 40 from an operational register 28. Since sixteen digits in all comprise one data word (as is shown in FIG. 6), thirty-two state times (S0–S31) are required to output all sixteen digits from a register. Thus, thirty-two state times (S0–S31) represent one instruction cycle, as is depicted in FIG. 4*b*, and an instruction cycle has a duration of approximately 80 microseconds in this embodiment. The state times are generated by state time generator 48.

As will subsequently be discussed, the clock is responsive to a decoded display instruction for slowing the speed of the clock during display operations. During display operation, the period of a state time is ten microseconds and the period of an instruction cycle is 320 microseconds.

In addition, clock pulses may be provided at every $P_1$ and $P_2$ time which are simply labeled P and other clock pulses are provided at every $\phi$1 and $\phi$2 time, which are simply labeled $\phi$, as is shown in FIG. 4*a*. Further, clock pulses are provided at selected P or $\phi$ times in selected state times (for instance S1.$\phi$2), as is also exemplified in FIG. 4*a*.

Referring now to FIGS. 5*a* and 5*b*, there is shown diagramatically in FIG. 5*a* the ten decimal digits, 0–9, displayable by a seven segment character display along with an eighth segment used as a decimal point. With respect to FIG. 5*b*, the seven character segments are labeled segments A–G and the decimal point segment is labeled P. For each character position there is a common cathode 9 provided for the eight segments, as is shown in FIG. 5*b*. The eight segments A–G and P for each character position are respectively connected in common by segment conductors $S_A$–$S_G$ and $S_p$. Chip 10 uses segment scanning according to the method disclosed by U.S. Pat. No. 4,014,012, wherein the segments are scanned sequentially and the digit cathods are selectively energized in conjunction with the scanning of the segment electrodes to form the characters 0–9 and a decimal point. By using the segment scanning method of U.S. Pat. No. 4,014,012, the segment amplifiers generally used heretofore in the prior art are eliminated. Thus, chip 10 may be directly interconnected with display 11.

Referring again to FIG. 3, scan generator counter 36 sequentially energizes the $S_A$–$S_G$ and $S_p$ conductors (FIG. 5*b*) via lines 14 and pins SEG A–SEG G and SEG P (FIG. 11). Output register 47 is loaded each time a different segment is scanned with a twelve bit binary code indicating whether the cathodes 9 (FIG. 5*b*), associated with each of the twelve character positions, should be energized via lines 15 and pins D1–D12 (FIG. 11) permitting the scanned segment in the corresponding character positions to actuate.

Referring again to FIG. 6*a*, there is shown the format of the data word stored in operational registers 38A and 38B and storage registers 39 (FIG. 3). As aforementioned, each data word comprises sixteen digits of serial data, each digit comprising four serial bits. Thus, an entire data word comprises 64 (e.g., 16×4) bits. The three most significant digits of the data word preferably comprise the twelve flag bits and the thirteen remaining digits comprise numerical data, the first eleven digits thereof preferably being the mantissa and the least significant two digits being the exponent.

As aforementioned, associating the twelve flag bits with the thirteen digits of numeric data in one data word storage location is an important feature of this invention which eliminates the need for separate flag registers.

Figure 6B:
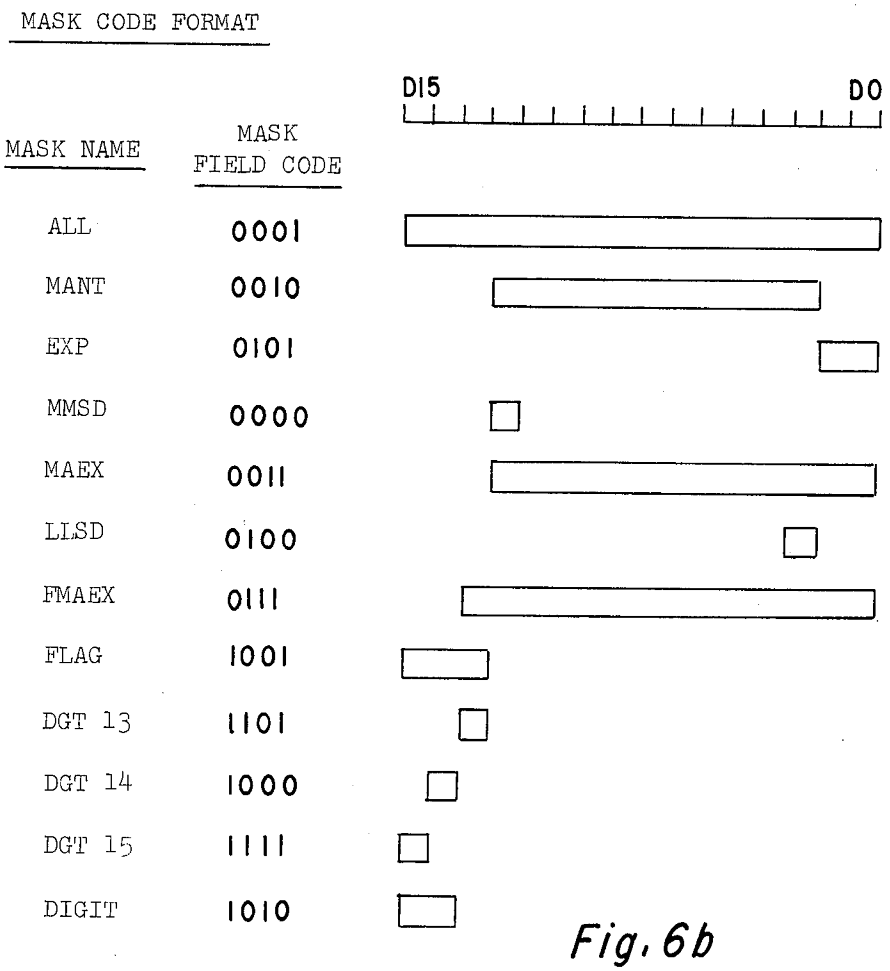
Figure 9:
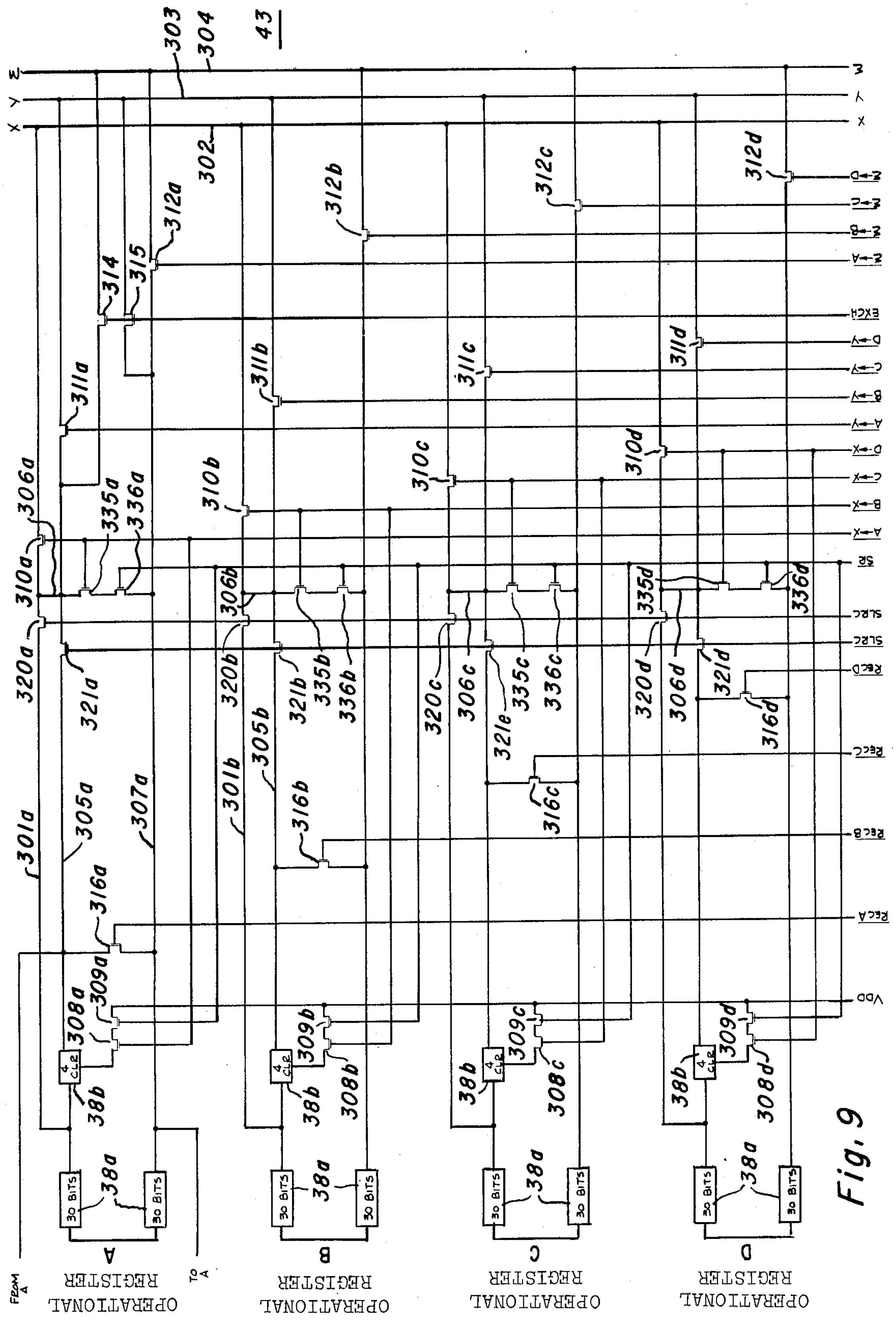
FIG. 9 is a logic diagram of the operational register selector gates.
Figure 10A:
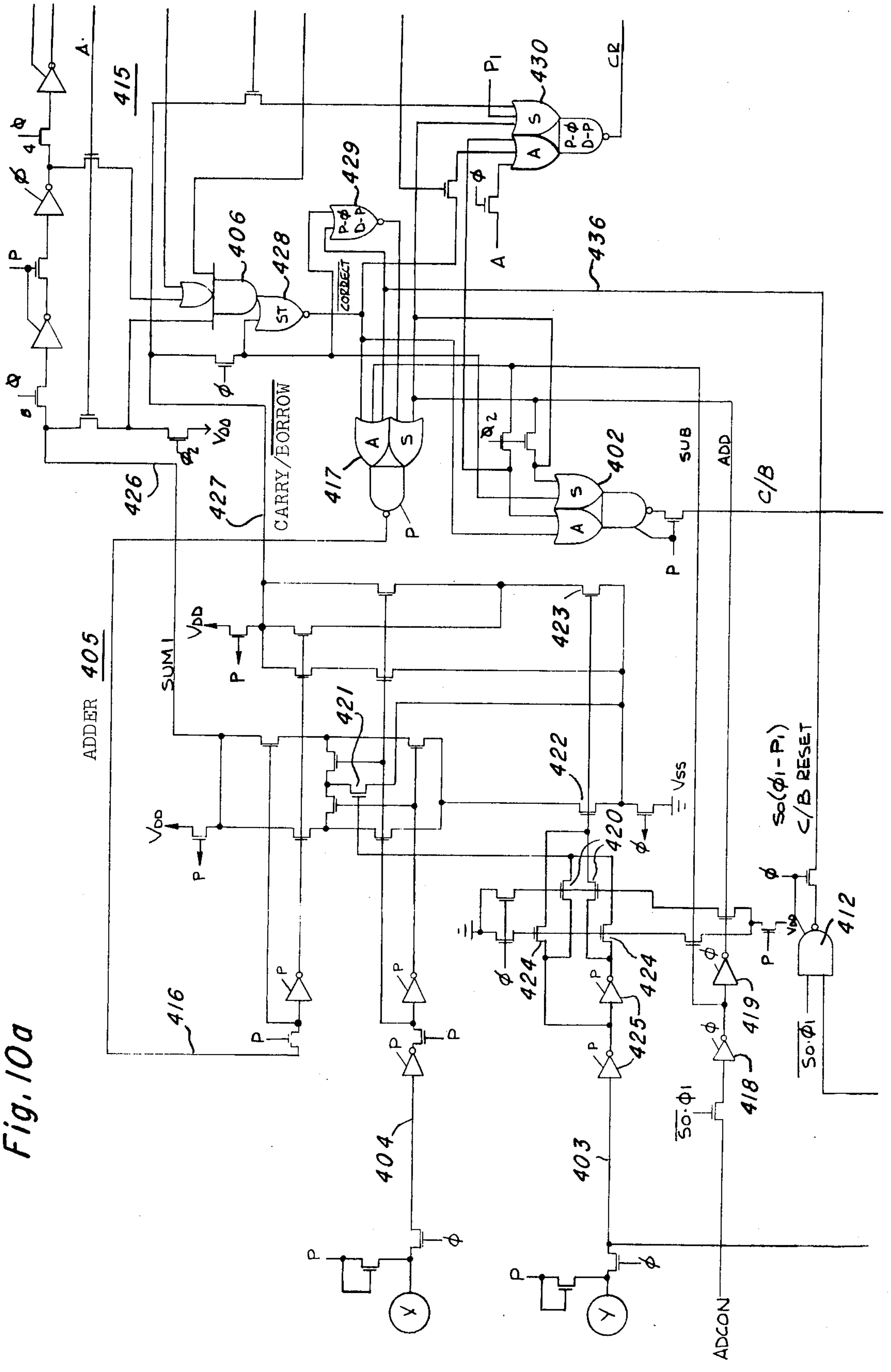
FIGS. 10(*a*)–10(*d*) form a logic diagram of the arithmetic unit and the R5 register.
Figure 10B:
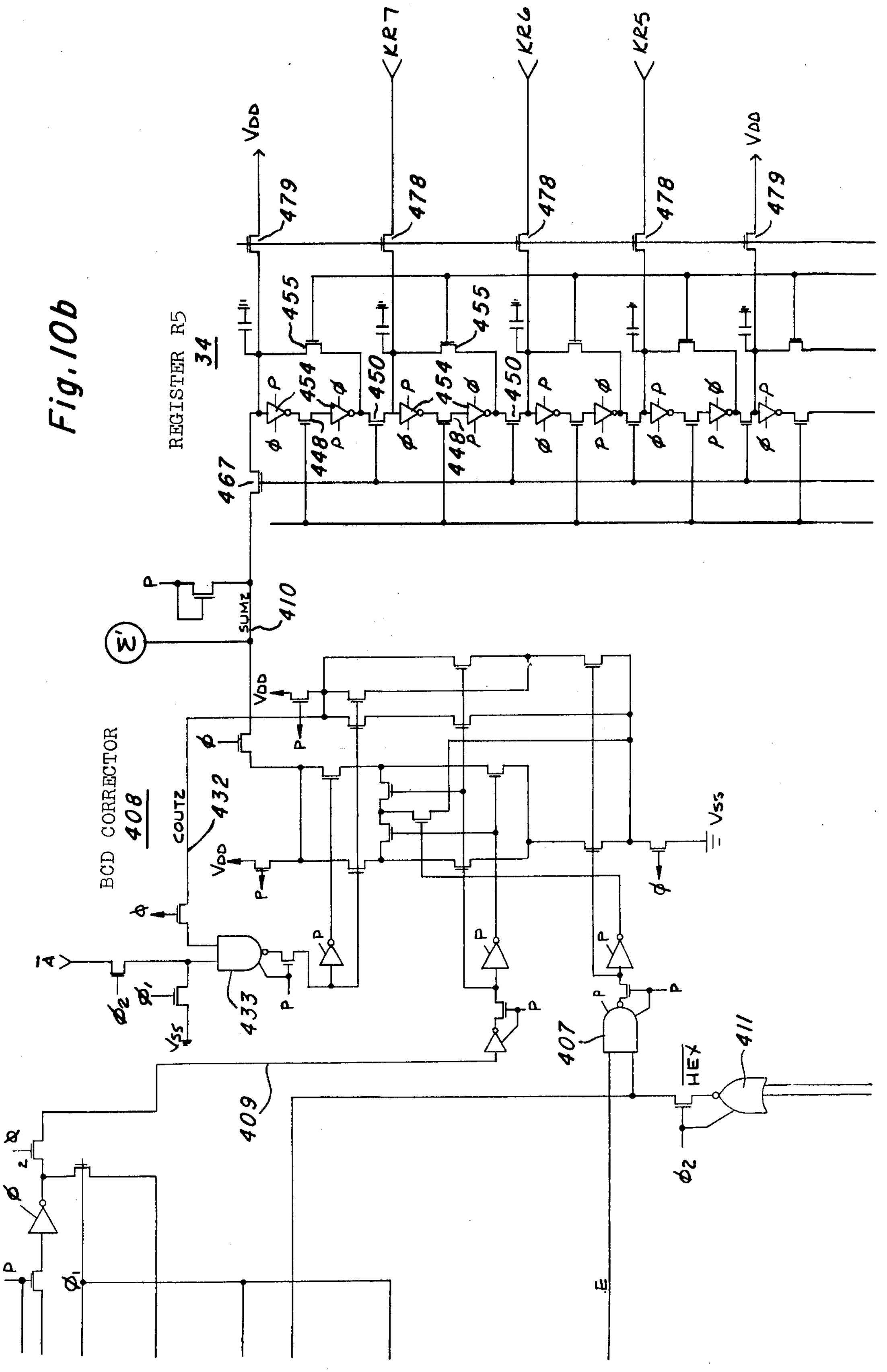
Figure 10C:
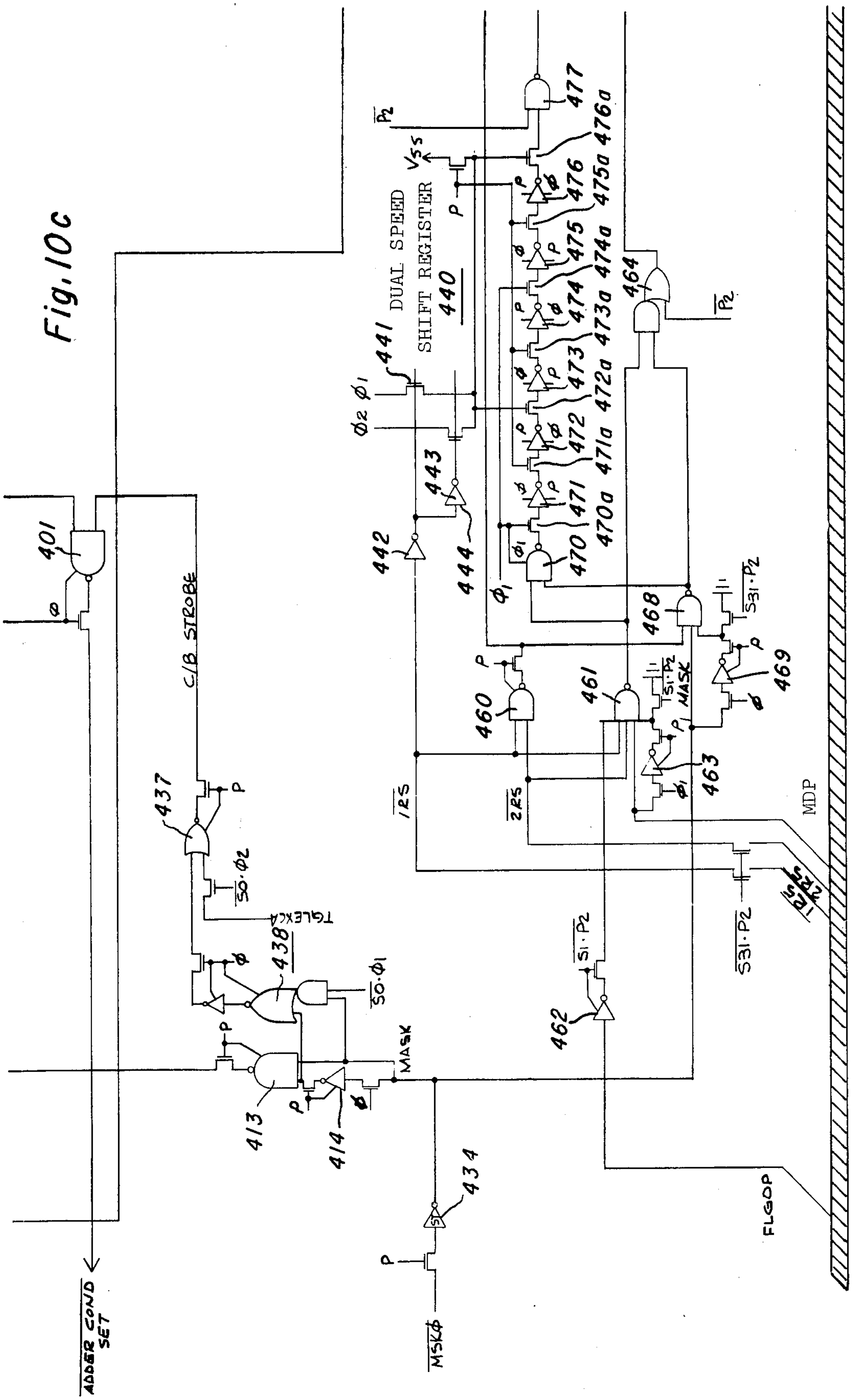
Figure 10D:
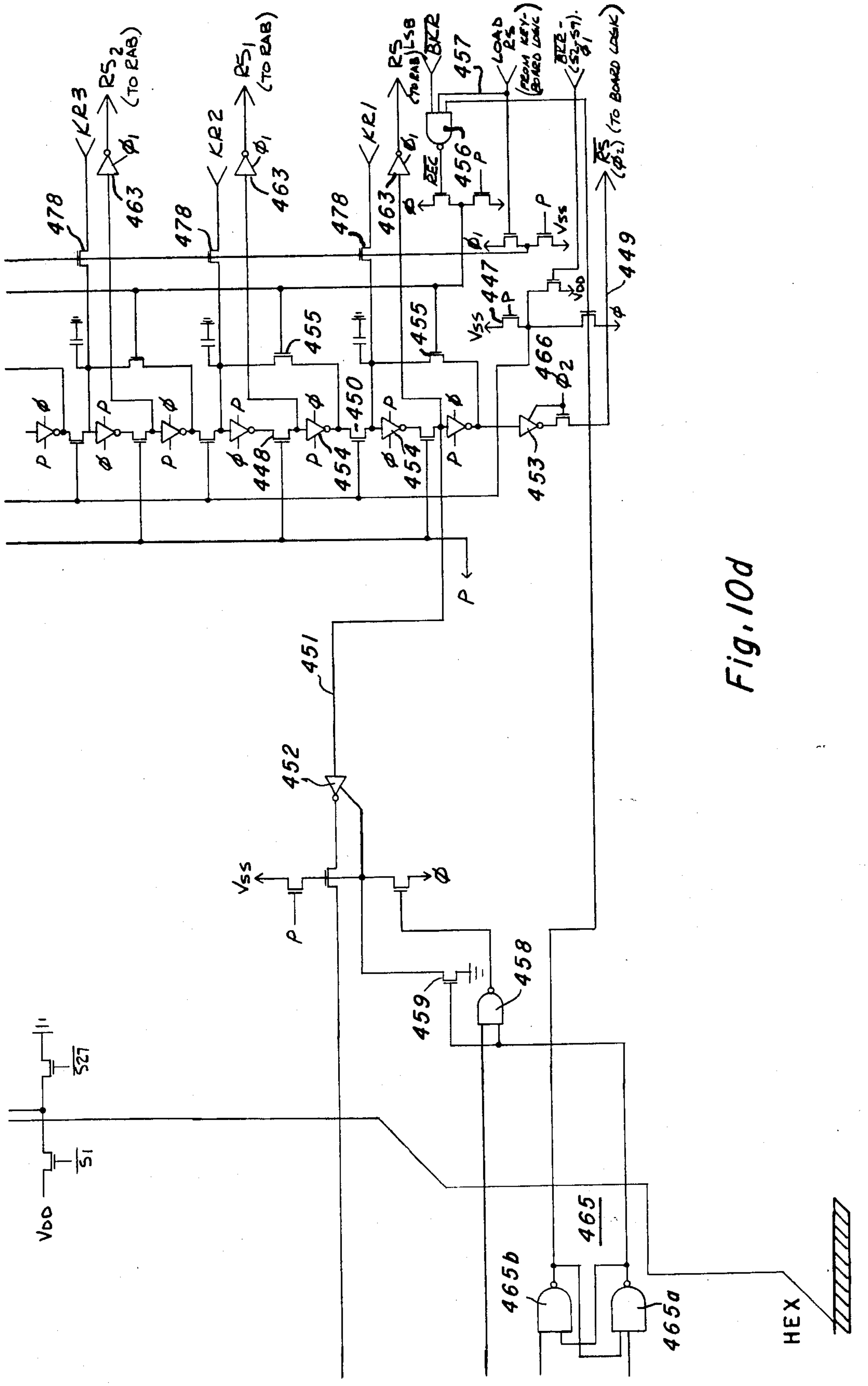
Figure 11A:
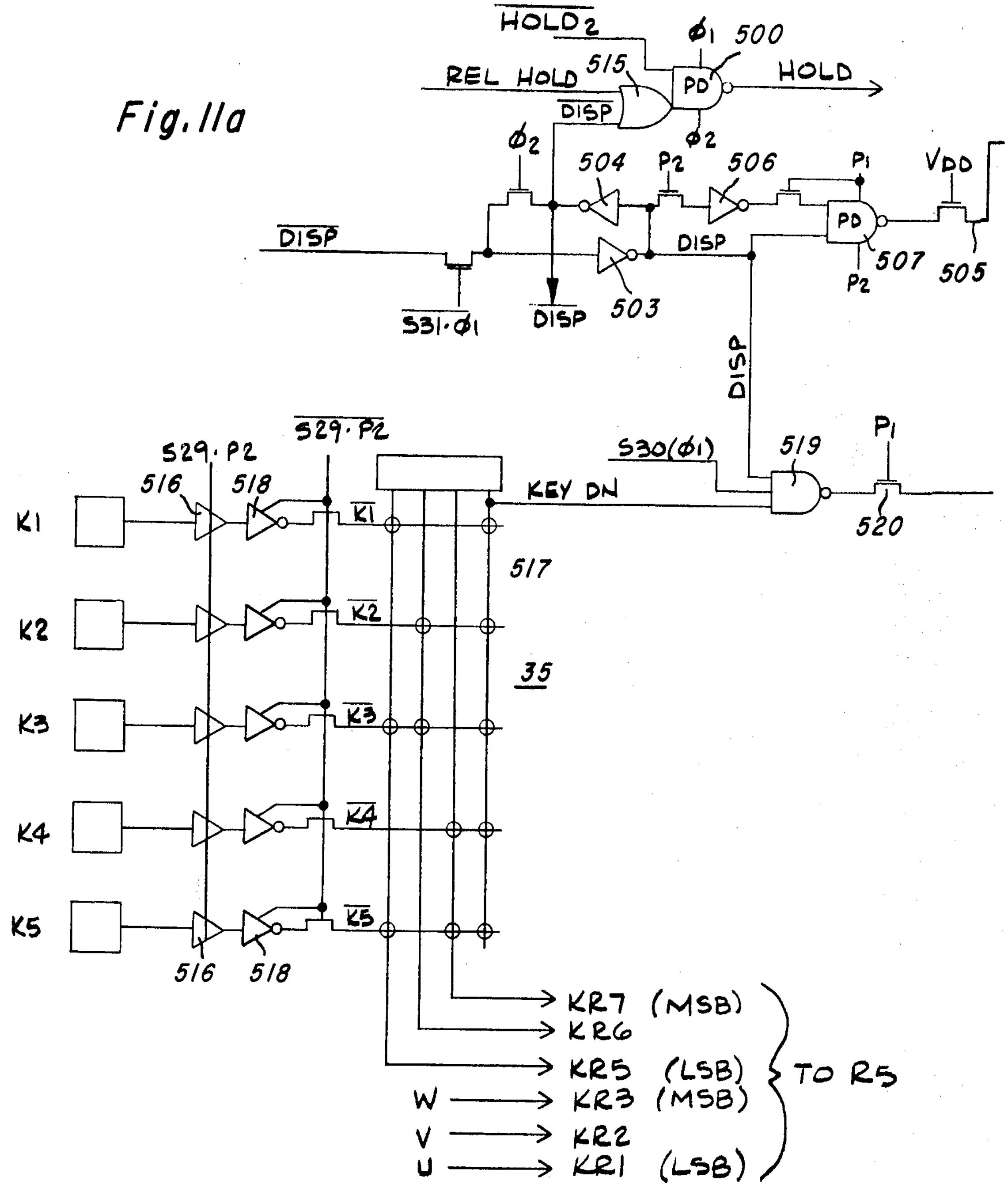
FIGS. 11(*a*)–11(*f*) form a logic diagram of segment-/keyboard scan and scan generator counter, keyboard logic, display decoder, output register and state time generator.
Figure 11B:
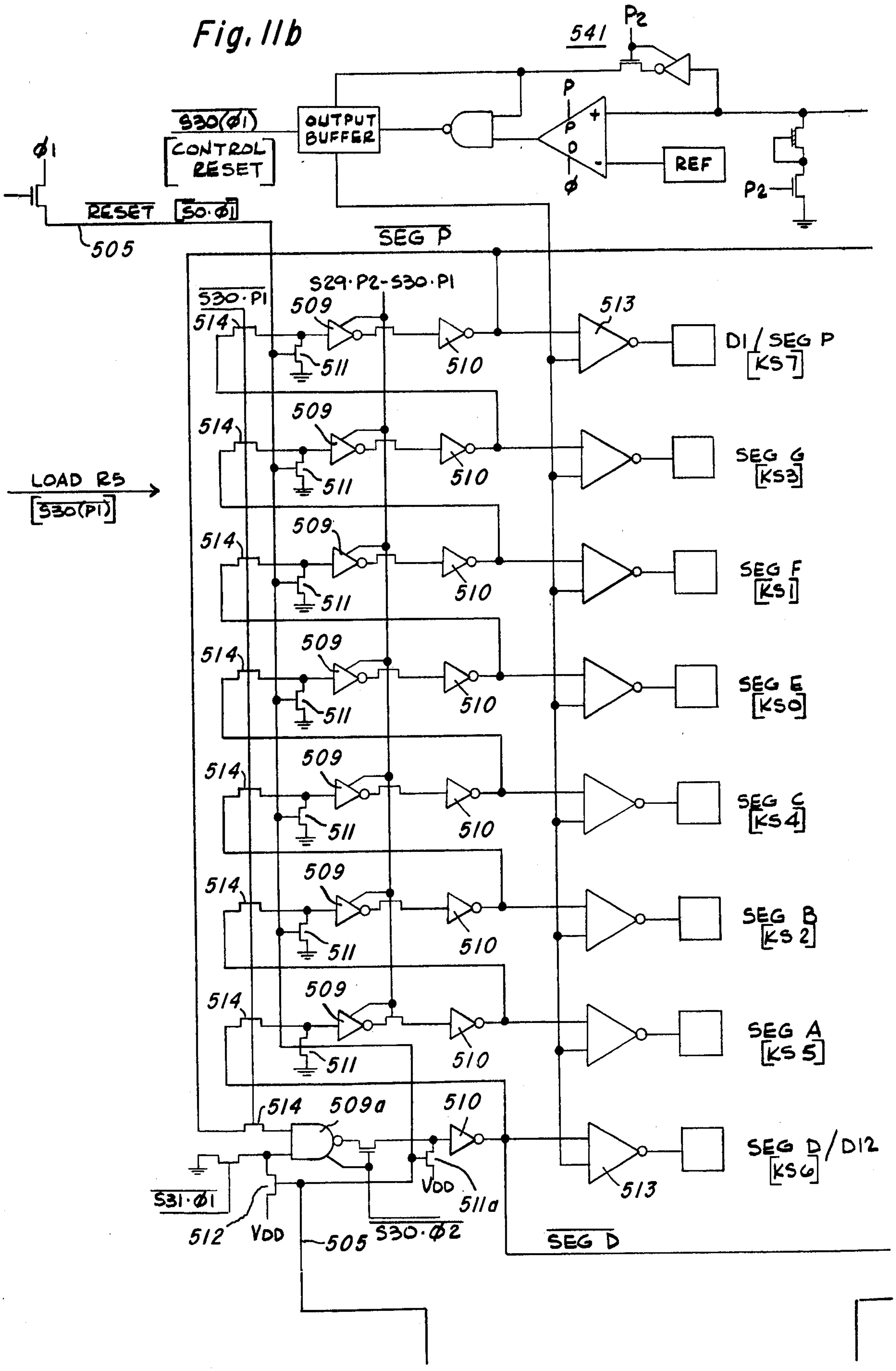
Figure 11C:
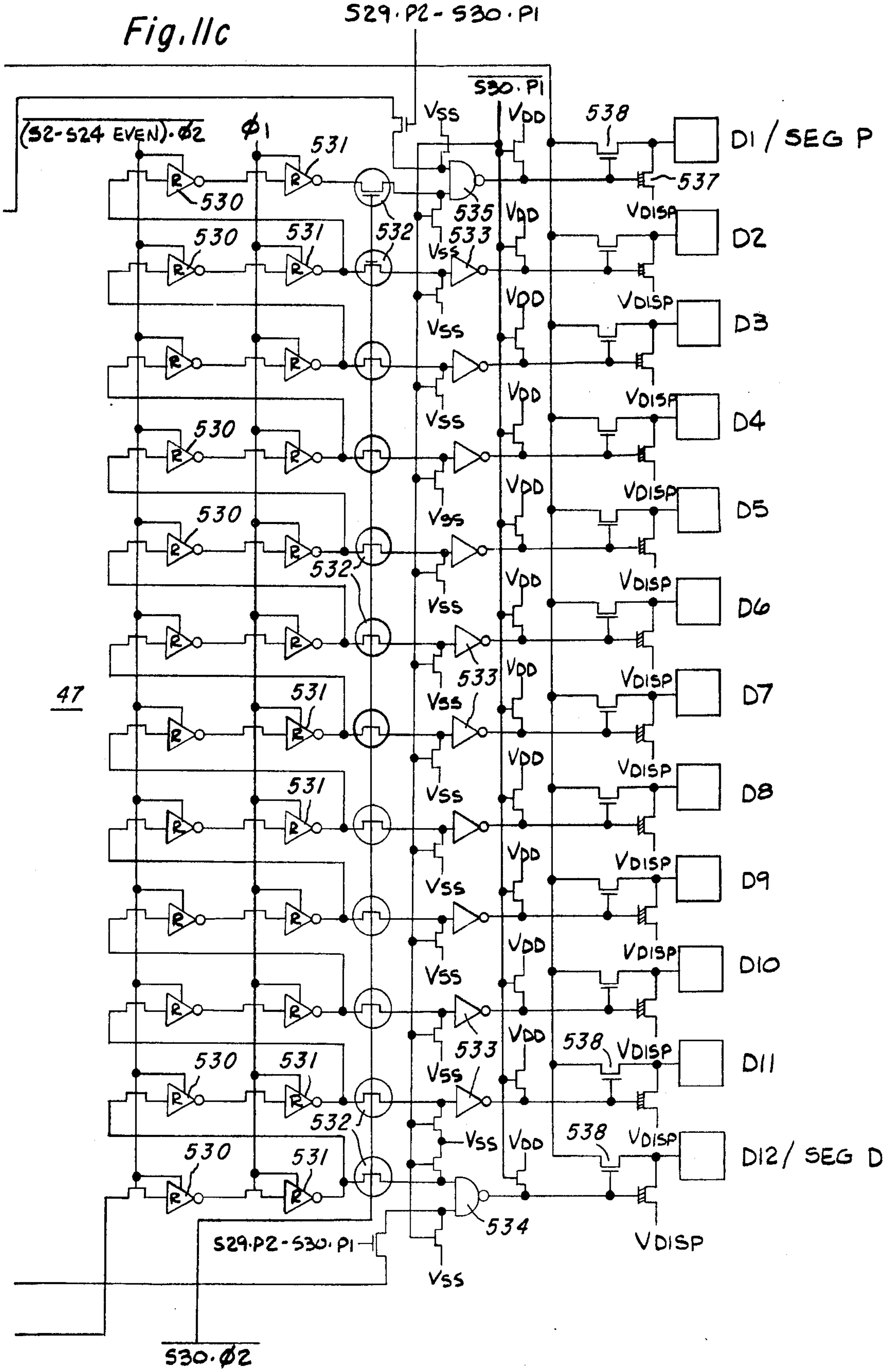
Figure 11D:
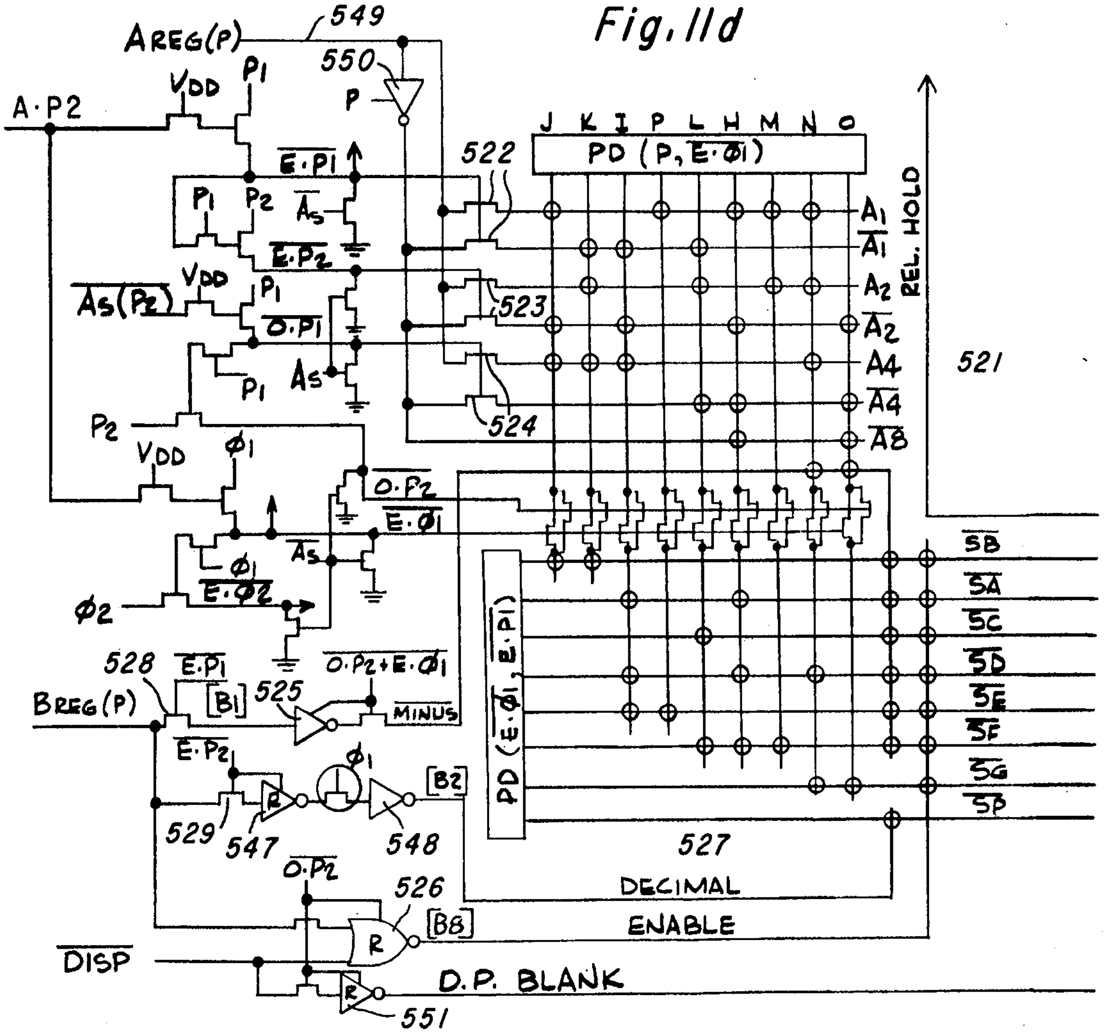
Figure 11E:
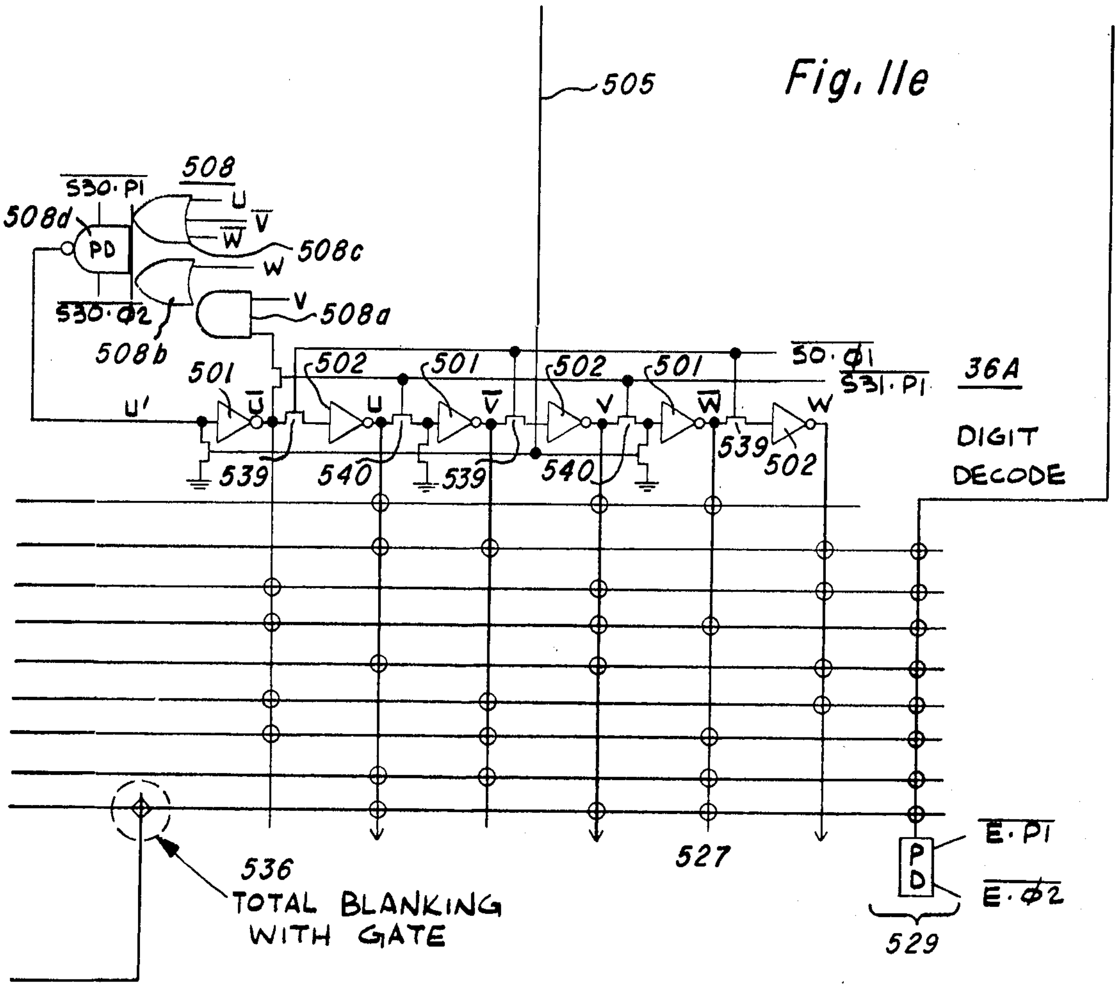
Figure 11F:
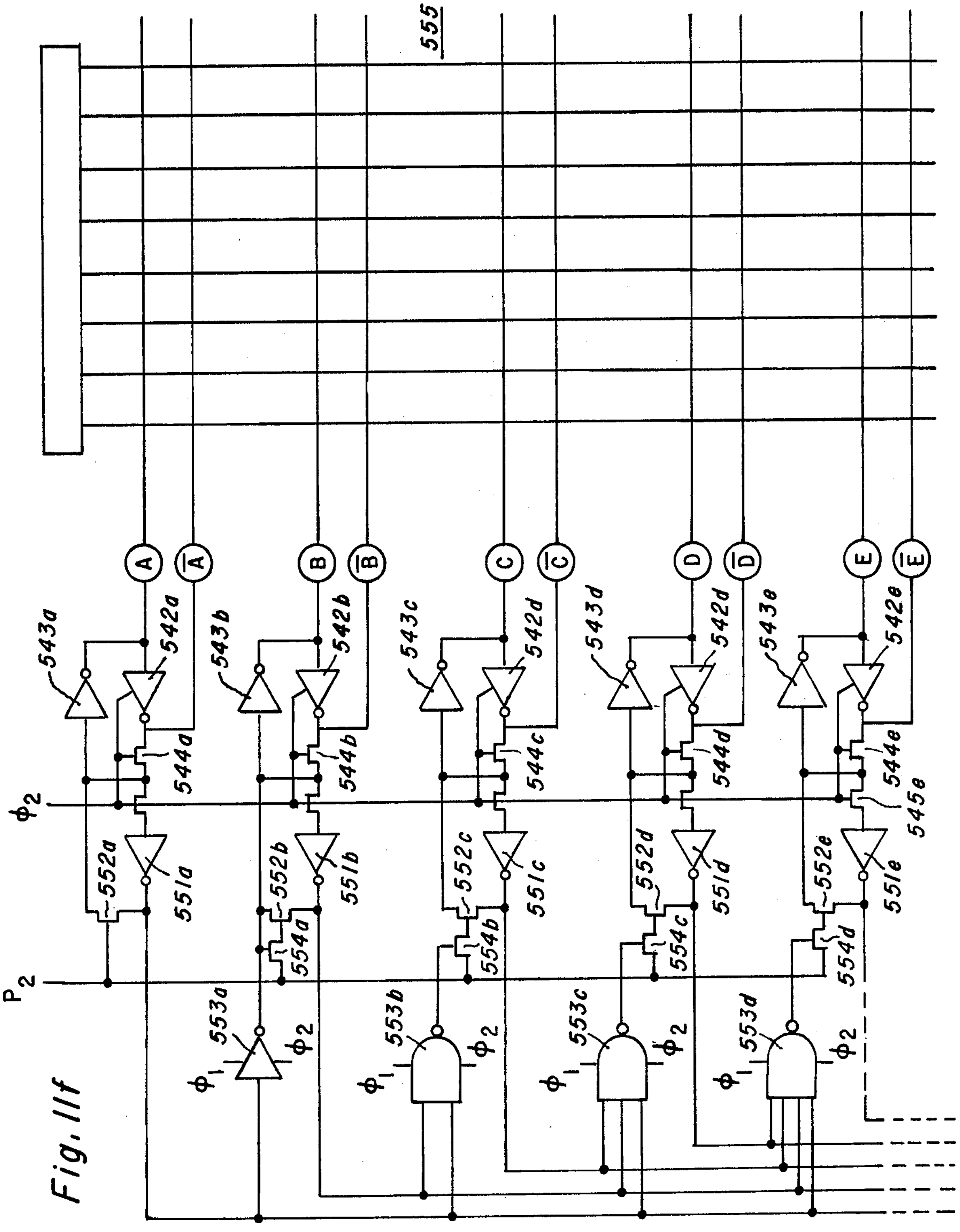

In FIG. 6*b* there is shown the mask codes which are incorporated in many of the instruction words implemented in ROM 30; the set of instruction words storable in ROM 30 and decodable by instruction word decoder logic 31 (FIG. 3) are described in TABLE I. The set of instruction words stored in ROM 30 in this embodiment are listed in TABLE IV. As can be seen from TABLE I, a mask field code (MF) is used in many of the possible instruction words. The mask field denotes to the register selector gates 43 (FIG. 3) which digits of the sixteen digit data words are to be passed to the arithmetic unit 40 (FIG. 3) and which digits are to be recirculated. The mask codes are needed, because it is often desirable to perform some arithmetic of flag logic operation on only the mantissa or only the exponent or both the mantissa and the exponent or on a particular flag bit or perhaps the whole data word. As can be seen from FIG. 6*b*, there are twelve masks, having codes 0000 through 1011, which are listed and are associated with a rectangle beneath a representation of a sixteen-digit data word. The digits enclosed by the rectangle associated with a particular mask are permitted (by the mask decoder logic 200 (FIG. 8) in instruction word decoder logic 31 when the associated mask code is received) to pass through arithmetic unit 40 while those digits outside the rectangle are recirculated via gates 316*a–d* (FIG. 9). As will be seen with respect to the detailed discussion of the mask logic (FIG. 8), the mask codes cause the register selector gates 43 (FIGS. 3 and 9) to operate in timed relation with the data being outputted from an operational register 38 in accordance with the state times indicated by state time generator 48 (FIG. 3). The masks of FIG. 6*b* operate on complete digits, but certain individual bits may be selected by further mask arrangements as will be explained henceforth.

Figure 12:
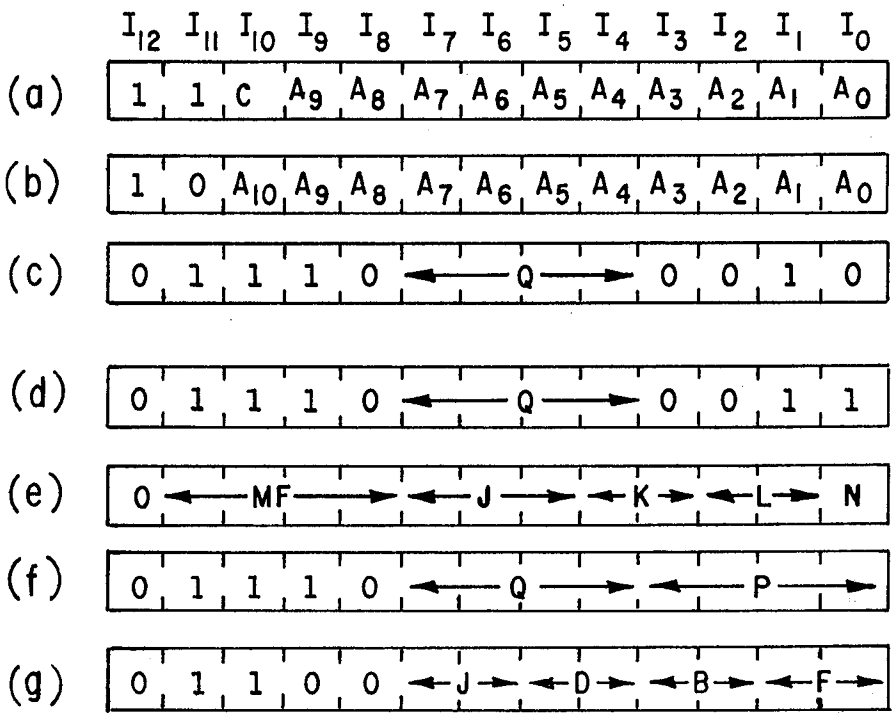
FIGS. 12(*a*)–12(*g*) depict the format of various instruction words described in Table I.

Referring now to FIG. 12, TABLE I, there are shown the set of possible instruction words stored in ROM 30, decoded by instruction word decoder logic 31 and utilized by the remainder of the system. TABLE I refers to FIG. 12 for drawings representative of the various types of instructions. As can be seen, the instruction word comprises thirteen binary bits ($I_{12}$–$I_0$). A thirteen bit instruction word length provides for the possibility of having up to $2^{13}$ or approximately 8,000 different instruction codes; however, it will soon be evident that not all these possible instructions are used. Looking first to the first two instructions, namely the "branch on condition" and the "branch unconditionally" instructions, it will be seen that there is a 1 in the $I_{12}$ position. Since all remaining instructions use a 0 in the $I_{12}$ position, it will be seen that there are approximately 4,000 variations of the first two instructions. The "branch unconditionally" instruction has a zero in the $I_{11}$ position following the one in the $I_{12}$ position and an address in the $I_{10}$–$I_0$ positions. Since the "branch unconditionally" address contains 11 bits and since the program counter 32a contains 11 bits, the "branch unconditionally" instruction can cause the branch anywhere within ROM 30, including branches between ROM A and ROM B. The "branch on condition" instruction instruction, on the other hand, contains only a ten bit address because the $I_{10}$ bit is used as a condition bit. If the state of the condition bit ($I_{10}$) matches the state of the condition latch, the branch will occur; if there is no match, the branch instruction is ignored. There being only ten bits in the address for the "branch on condition" instruction, when the branch is executed only the ten least significant bits are loaded into the eleven bit address register of program counter 32a. The most significant bit in the program counter remains unchanged. Since a zero in the most significant bit ($A_{10}$) in the program counter addresses only those instruction words in that part of ROM 30 denoted as ROM A, and a one in the most significant bit ($A_{10}$) in the program counter addresses only those instruction words located in that portion of ROM 30 denoted as ROM B, the "branch on condition" instruction only permits branching within the confines of either ROM A or ROM B. The unconditional branch instruction may be also considered a "CALL" instruction inasmuch as an incremented address (the location following the location of the unconditional branch instruction) is stored in the subroutine stock 33 if the branch is accomplished.

The next listed instruction words in TABLE I, namely "Branch to R 5" and "Return" will be discussed subsequently.

Referring to part five of TABLE I, the operations under mask control contain a zero in the $I_{12}$ position, the mask field code in the $I_{11}$–$I_8$ positions, and on operational code in the $I_7$–$I_0$ positions. The operational code is divided into two bit J, three bit K, two bit L, and one bit N fields, as shown in TABLE I. For certain special operations the L and N fields are combined into one three bit field (LN field). TABLE I explains in detail the operations performed in response to particular binary codes entered into the aforementioned J, K, L, and N fields.

Remembering that the mask field, i.e., $I_{11}$–$I_8$ has only 12 possible mask codes (0000-0101, 0111-1010, and 1101 and 1111), while a four bit binary number has sixteen possible codes associated therewith, then there are four codes which may be loaded into the mask field position, namely 0110, 1011, 1100 and 1110, which will not be decoded as a mask operation. Two of these four codes, 1110 and 1100, are decoded by instruction word decoder logic 31. The 1110 code is referred to as the miscellaneous non-mask code; the family of instruction words using the miscellaneous non-mask code are explained in Part 6 of TABLE I. The miscellaneous non-mask operations have a four bit Q and four bit P fields in addition to the zero and the $I_{12}$ position and the 1110 in the $I_{11}$–$I_8$ positions. In this instruction set, the Q field is ignored by decoder logic 31 unless specifically referred to in this instruction set; the P field is decoded to perform the operations indicated, which are generally operations not making use of the arithmetic unit 40. Thus, these operations relate to transforming data between the storage registers and the operational registers, storing three bit codes in RAB 44 (FIG. 3), storing the contents of R5 register 34 (FIG. 3) in the program counter 32a, or enabling or disabling the BCD corrector in arithmetic unit 40.

The "Return" instruction (Section 4 of TABLE I) and "Branch to R5" location (Section 3 of TABLE I) may be considered as part of the miscellaneous non-mask code since these two instructions also have a 1110 in their $I_{11}$–$I_8$ positions. The Return instruction causes a branch to the address most recently stored in subroutine stack 33.

Other non-mask operations include the flag operations which are defined by a 1100 in the mask field MF. The flag operations are explained in detail in Part 7 of TABLE I. Although generally referred to as a non-mask operation, the flag operations may be thought of as very detailed mask operation in the calculator disclosed, because a specific flag bit in a data word is examined or operated upon rather than merely operating on a particular one or set of digits using the normal mask codes defined in FIG. 6. Flag operations have not heretofore been thought of as being similar to mask operations, since the flags have been typically stored in special registers of latches separate from the numeric data.

DETAILED DESCRIPTION OF SYSTEM LOGIC DIAGRAM

The various parts of the system of FIG. 3 will now be described with reference to FIGS. 7, 8, 9, 10, 11 and 13 which depict in detail the logic circuit implemented on chip 10 to form the circuits depicted by the block diagrams of FIG. 3. The following discussion with reference to FIGS. 7–11 will refer to the logic signals available at many points on chip 10. It should be remembered that a logical zero corresponds to a negative voltage, that is, $V_{dd}$, while a logical one refers to a zero voltage, that is, $V_{ss}$. It should further be remembered that the P-channel MOS transistors depicted in FIGS. 7–11 become conductive when a logical 0, i.e., a negative voltage, is applied at their respective gates. When a logic signal is referred to which is unbarred, i.e., has no bar across the top of it, the logic signal is to be interpreted as "true" logic; that is, a binary one indicates the presence of the signal (Vss) whereas the binary zero indicates a lack of the signal (Vdd). Logic signal names including a bar across the top thereof are in "false" logic; that is, a binary 0 (Vdd voltage) indicates the presence of the signal whereas a binary 1 (Vss voltage) indicates that the signal is not present. FIGS. 7–11 do not depict the clock generators implemented on chip 10, the clocks generating clock pulses $\phi_1$, $P_1$, $\phi_2$, $P_2$, in accordance with the clocking signals depicted in FIG. 4a. The clock generators are of conventional design and are responsive to decoded display instruction command signal for decreasing the frequency of the clock, as aforementioned.

THE ROM AND PROGRAM COUNTER

Figure 7A:
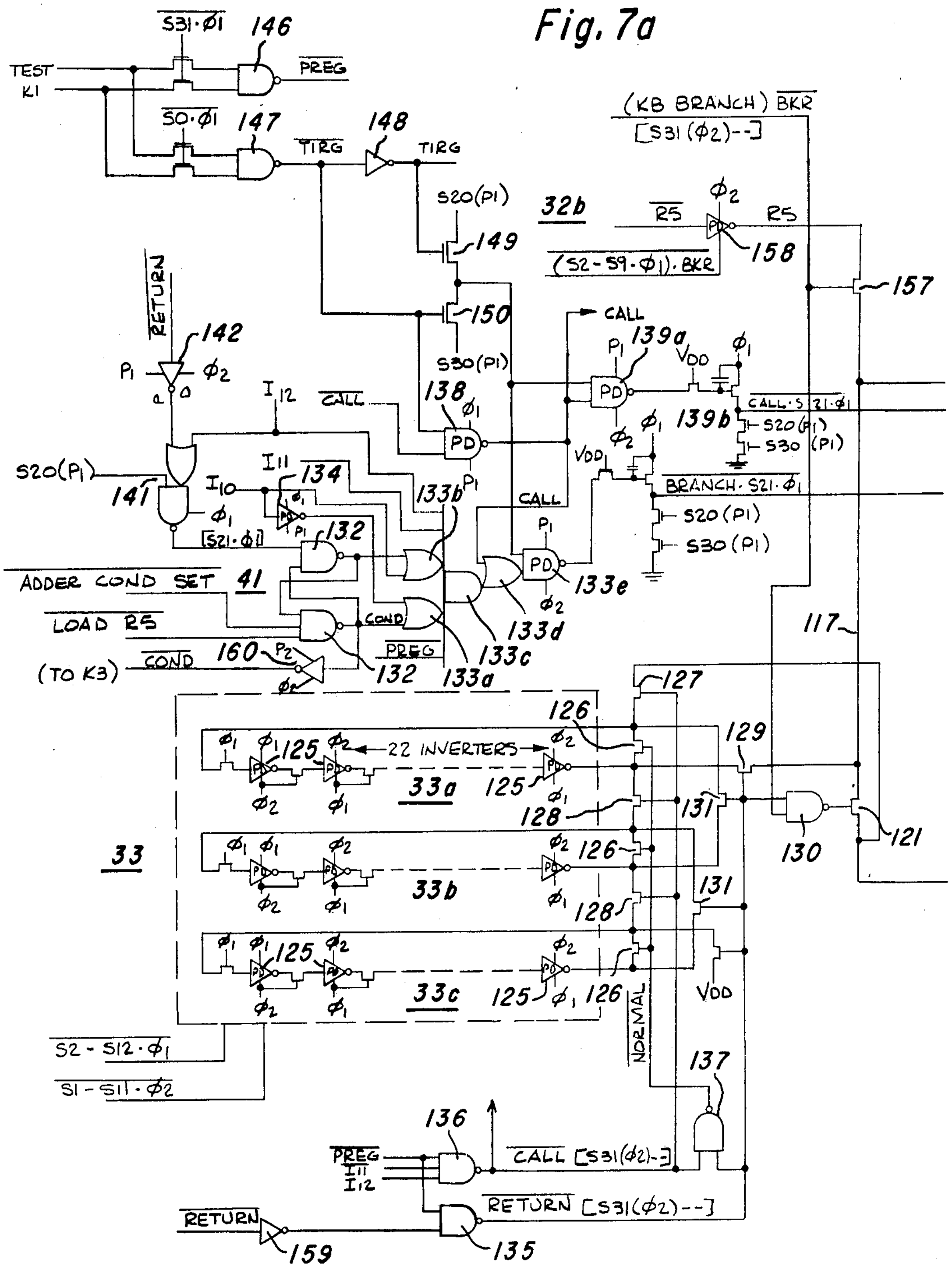
FIGS. 7(*a*)–7(*c*) form a logic diagram of the program counter, the branch logic, the test circuitry, the subroutine stack and the read-only memory of the calculator system.
Figure 7B:
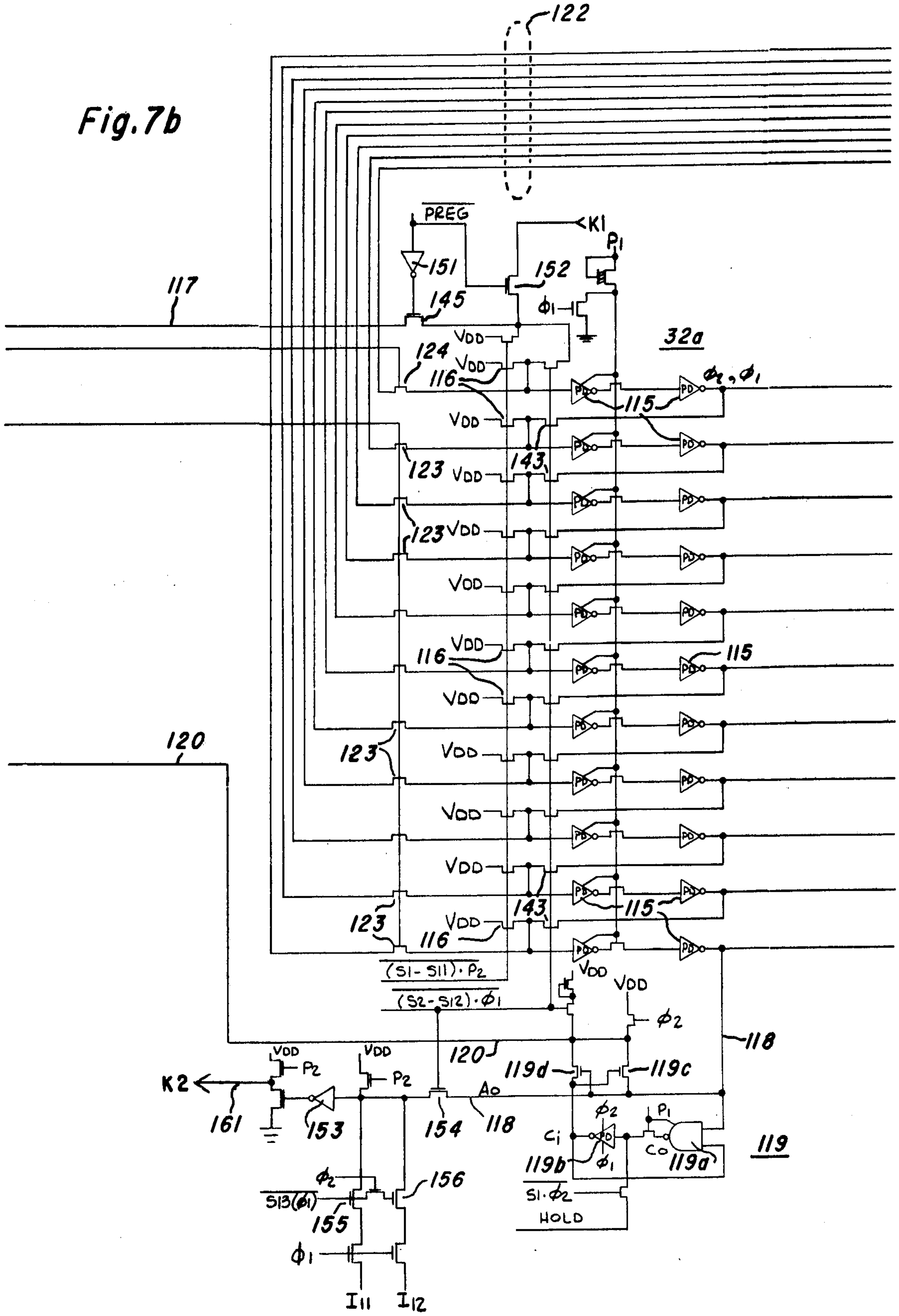
Figure 7C:
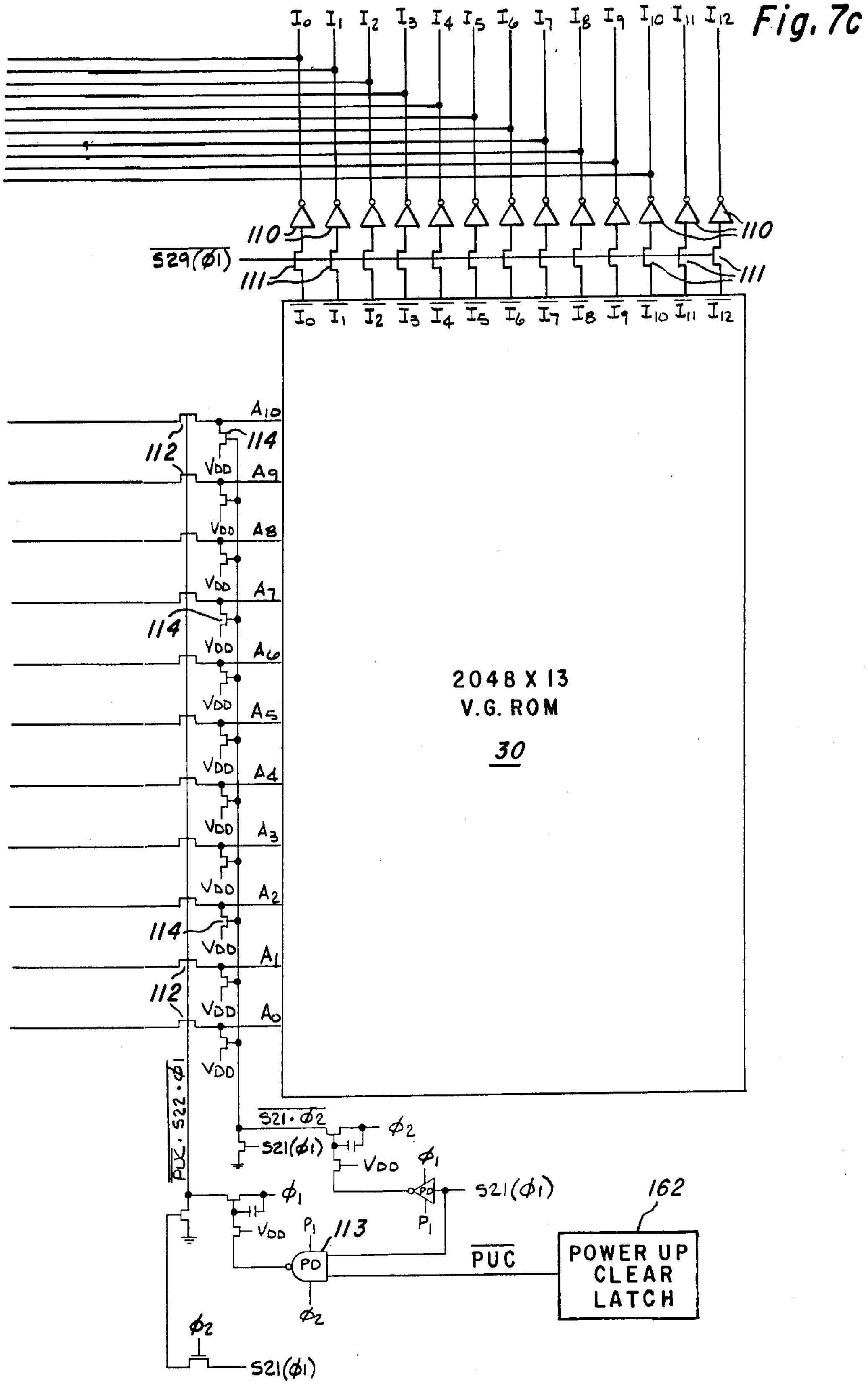
Figure 8A:
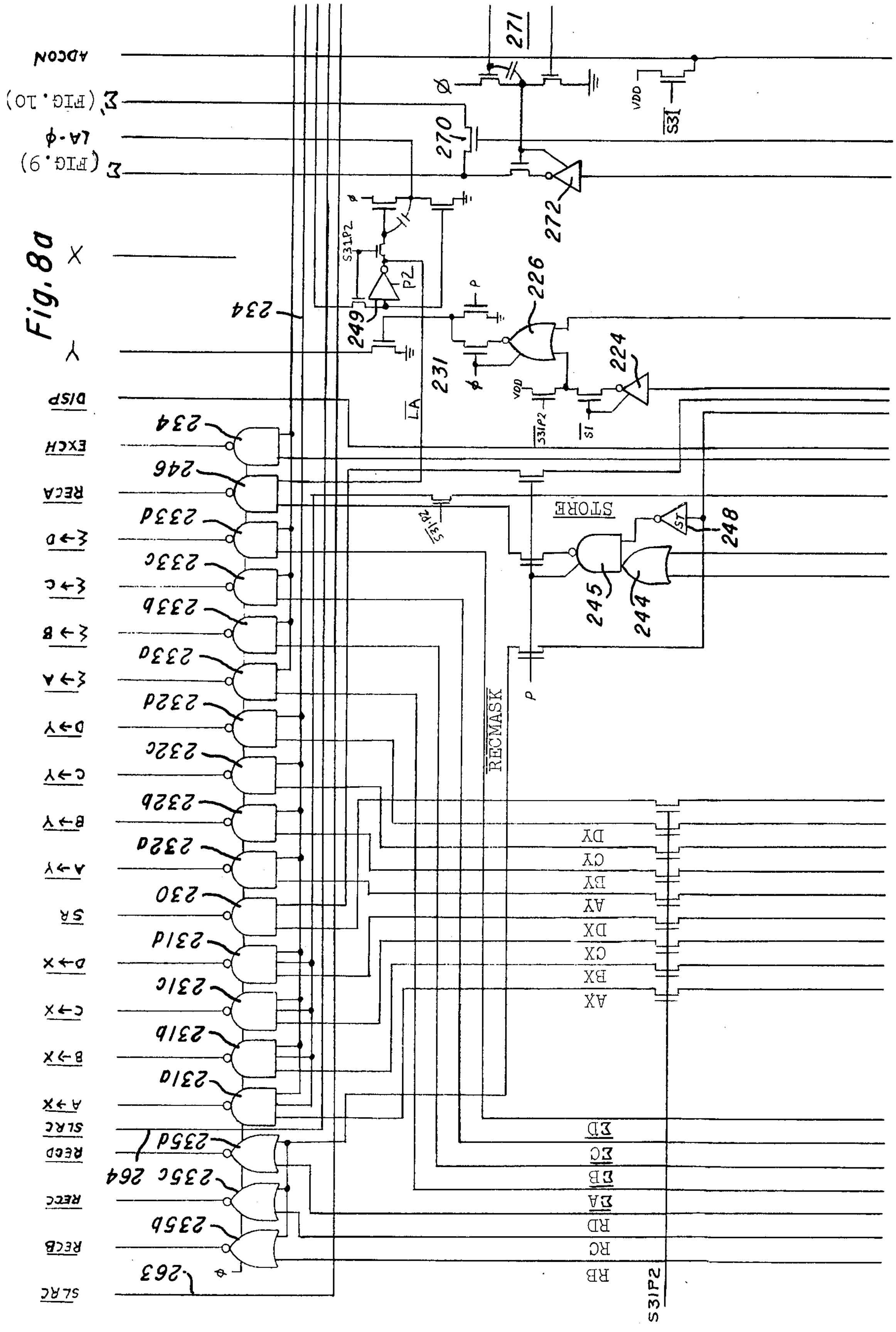
FIGS. 8(*a*)–8(*i*) form a logic diagram of the instruction word decoder logic; the operational registers, the storage registers, the register address buffer, and the counter associated with the storage registers.
Figure 8B:
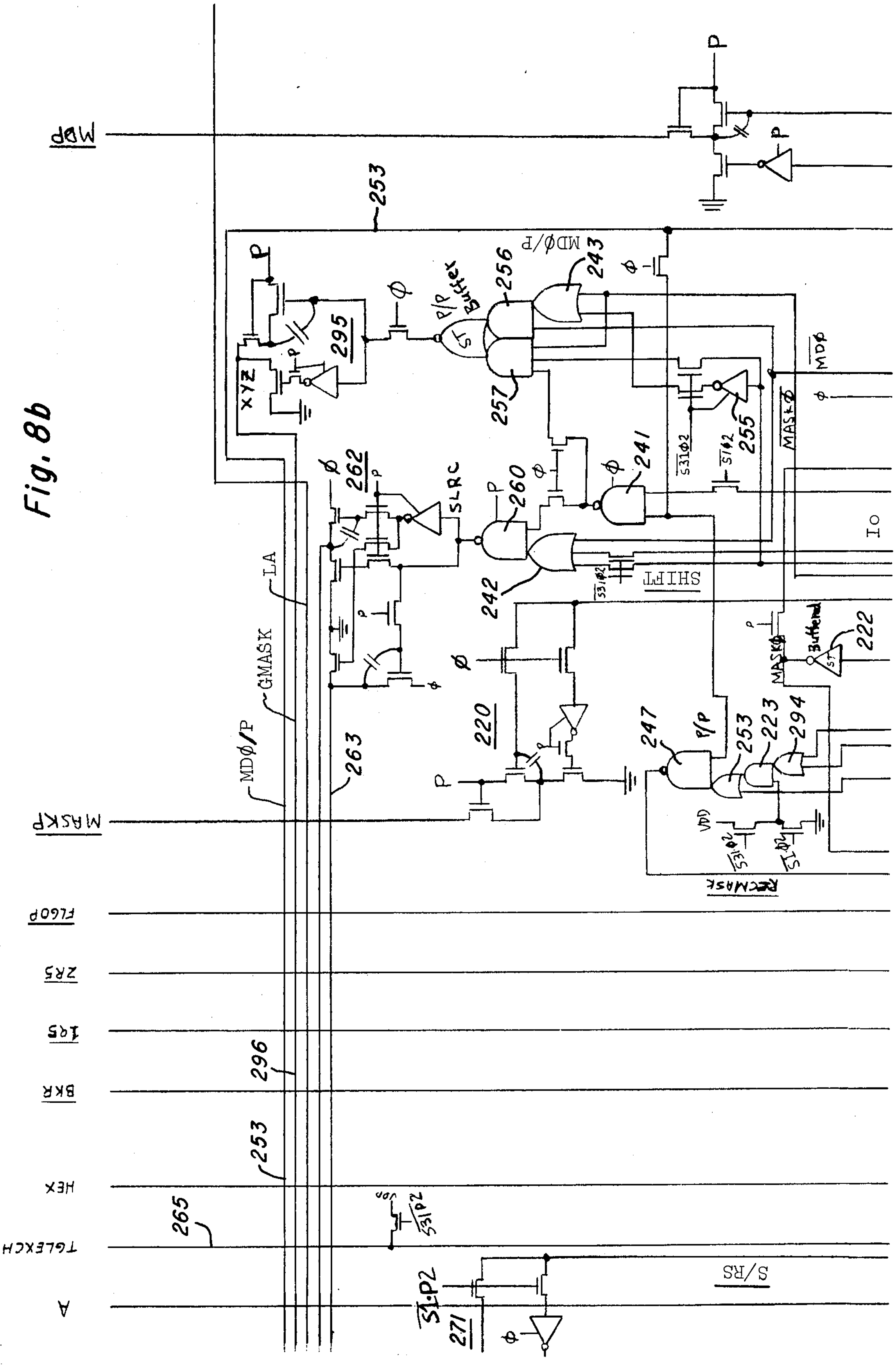
Figure 8C:
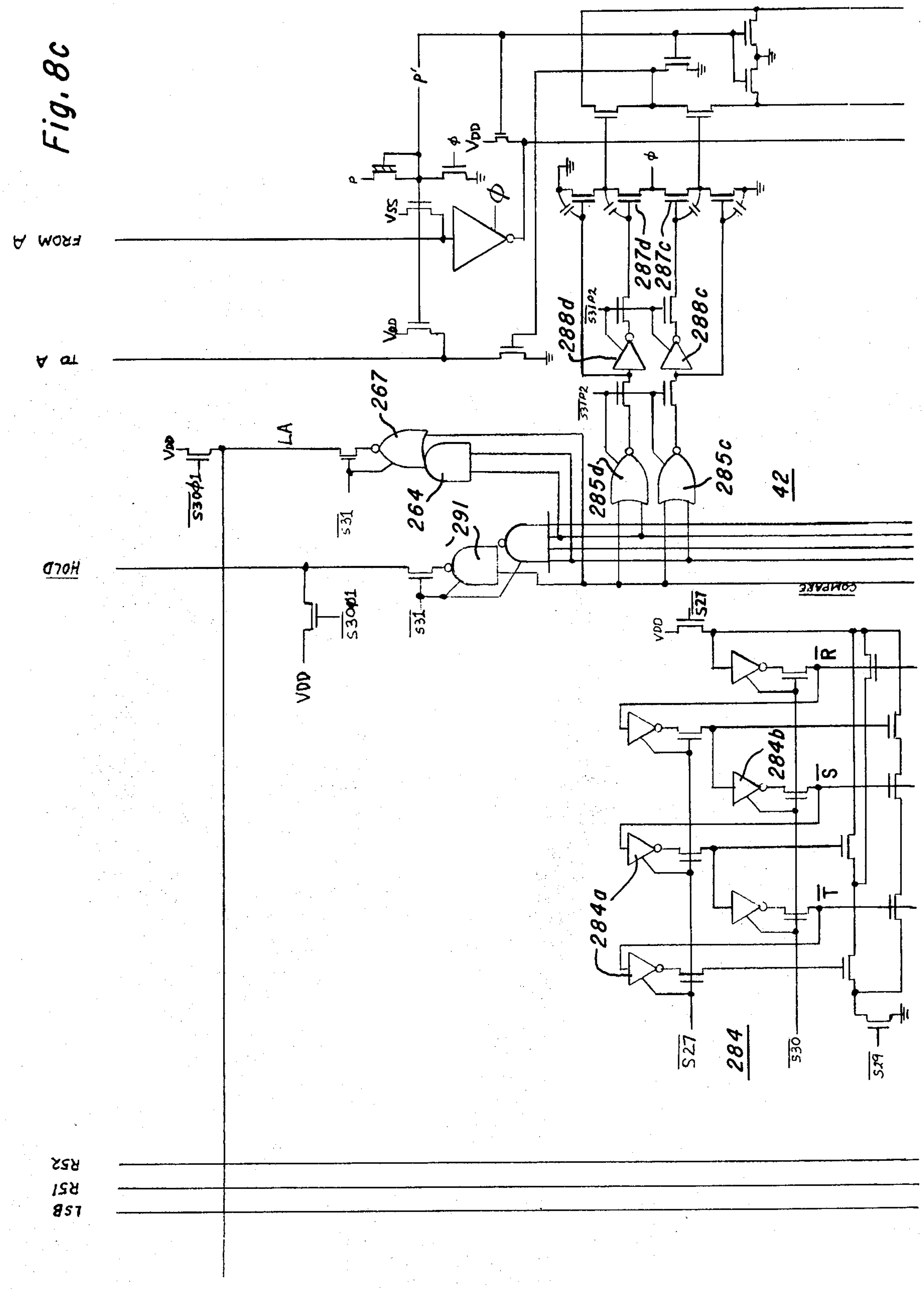
Figure 8D:
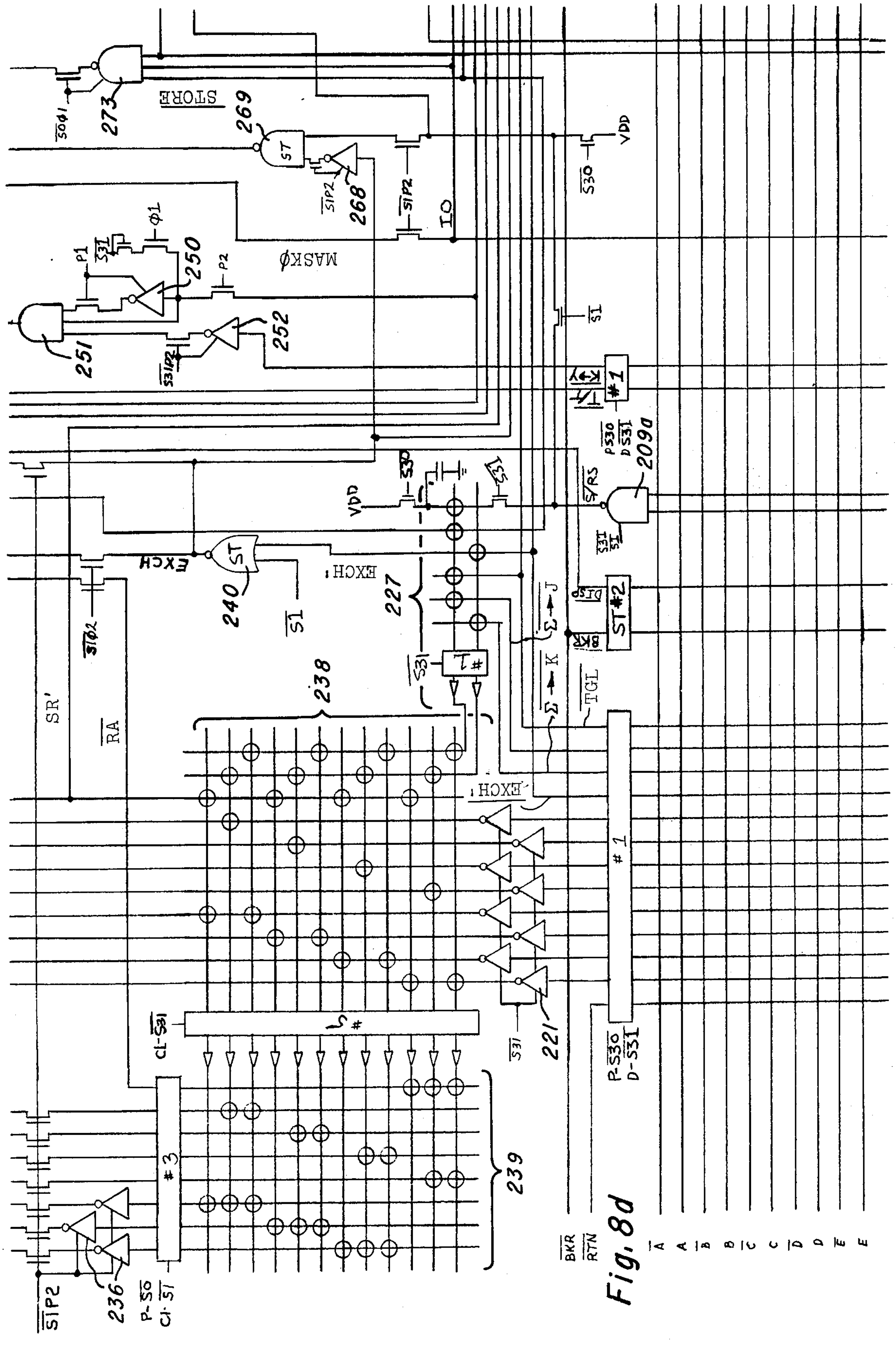
Figure 8E:
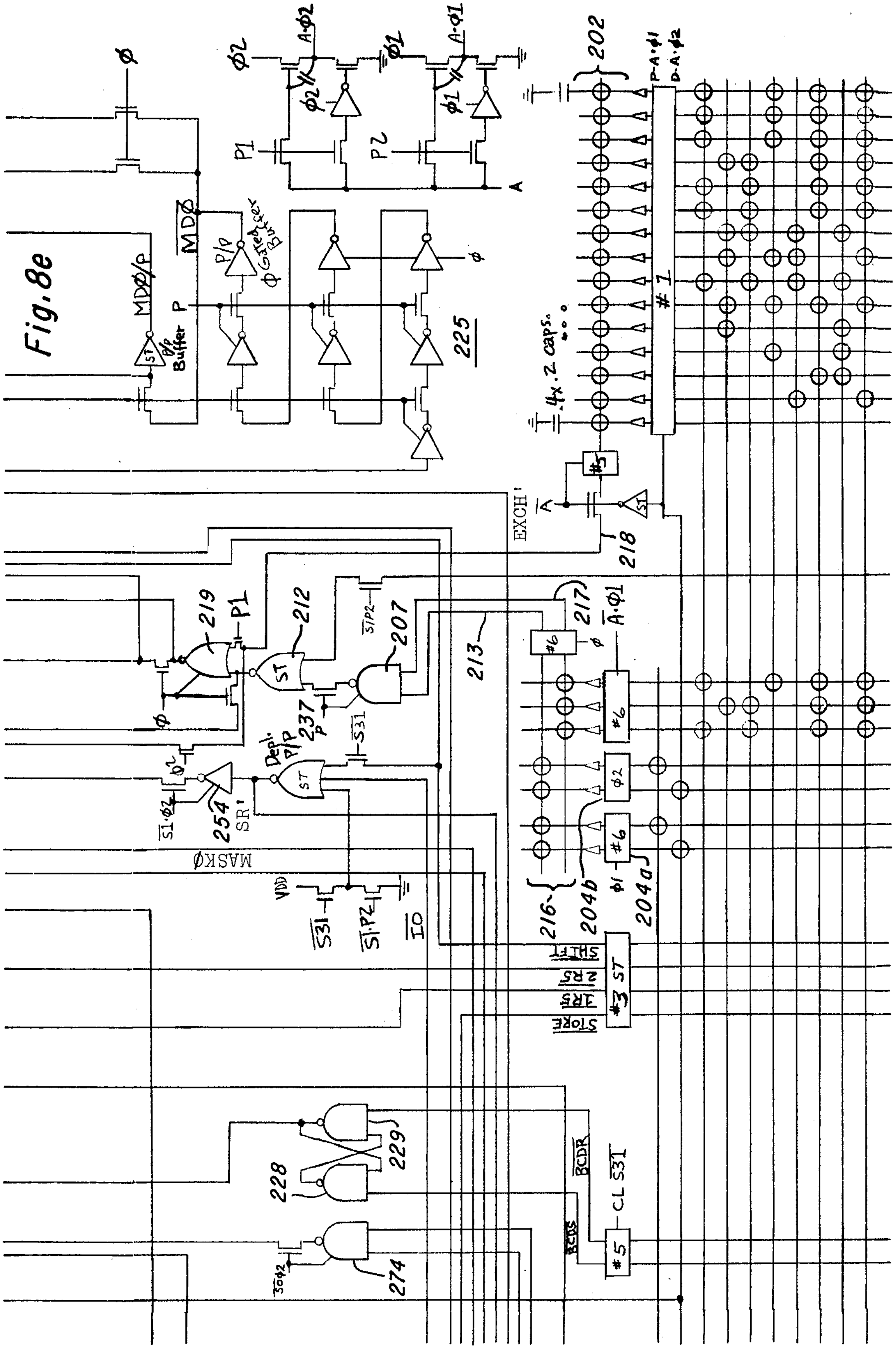
Figure 8F:
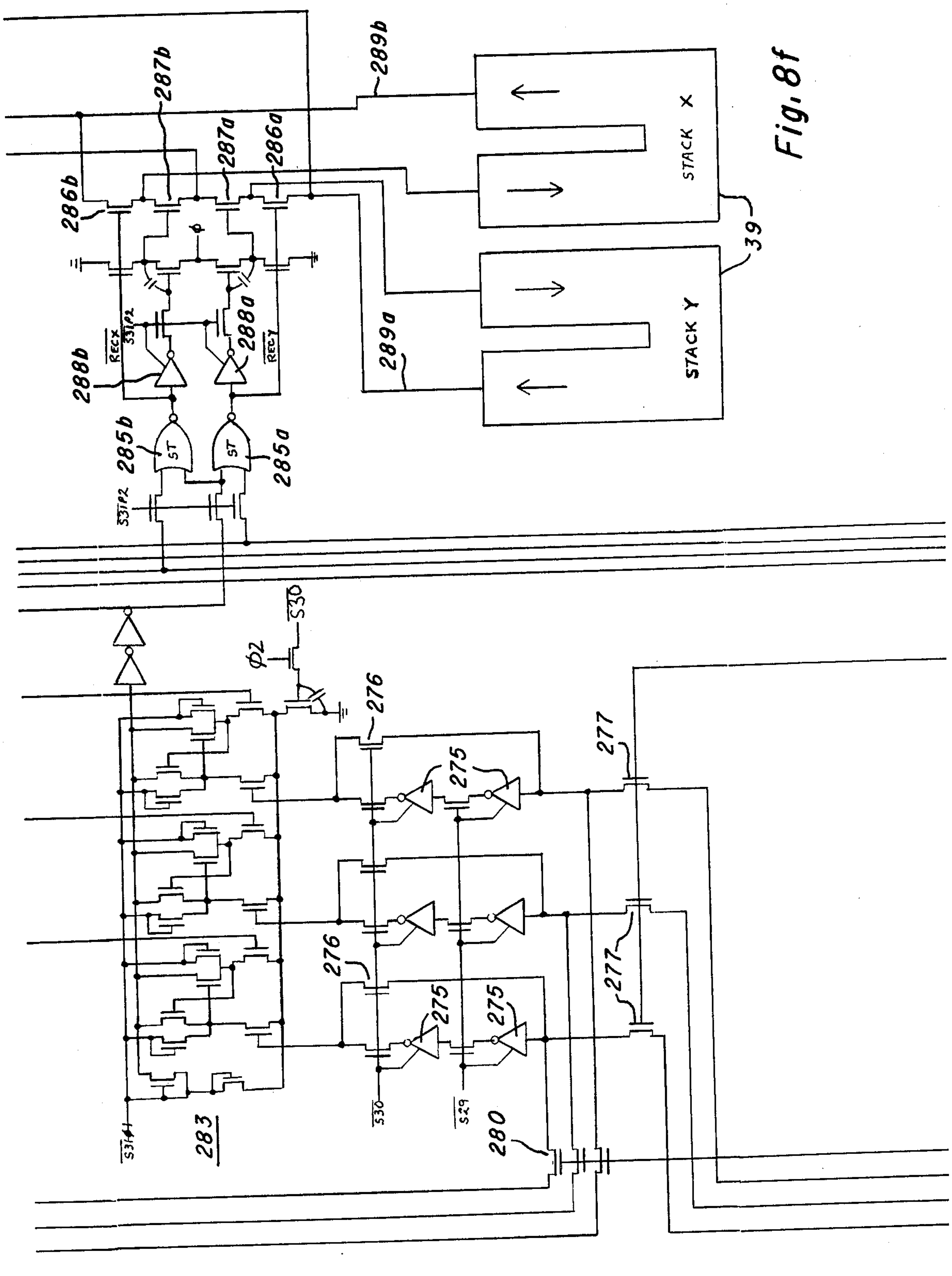
Figure 8G:
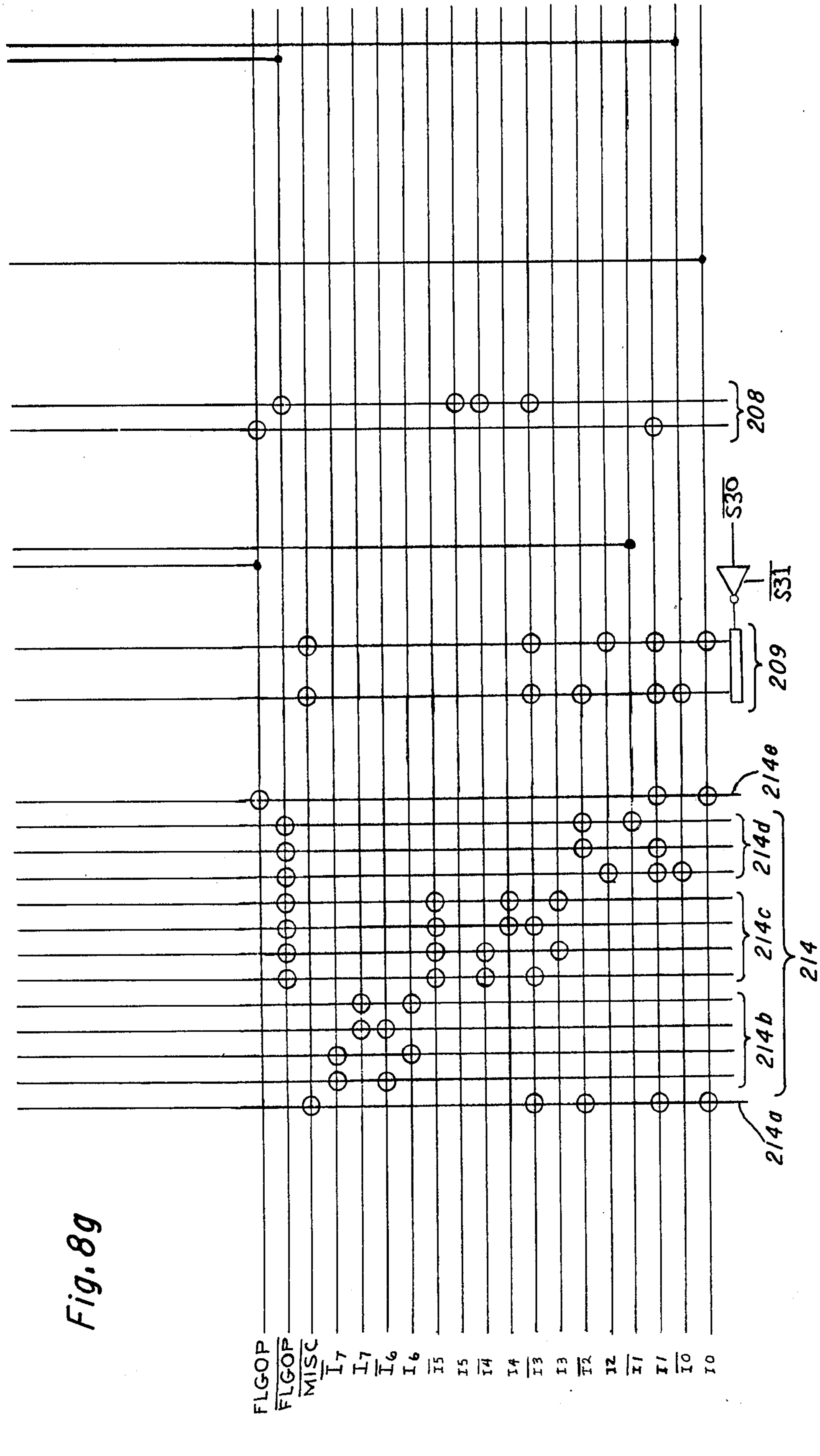
Figure 8H:
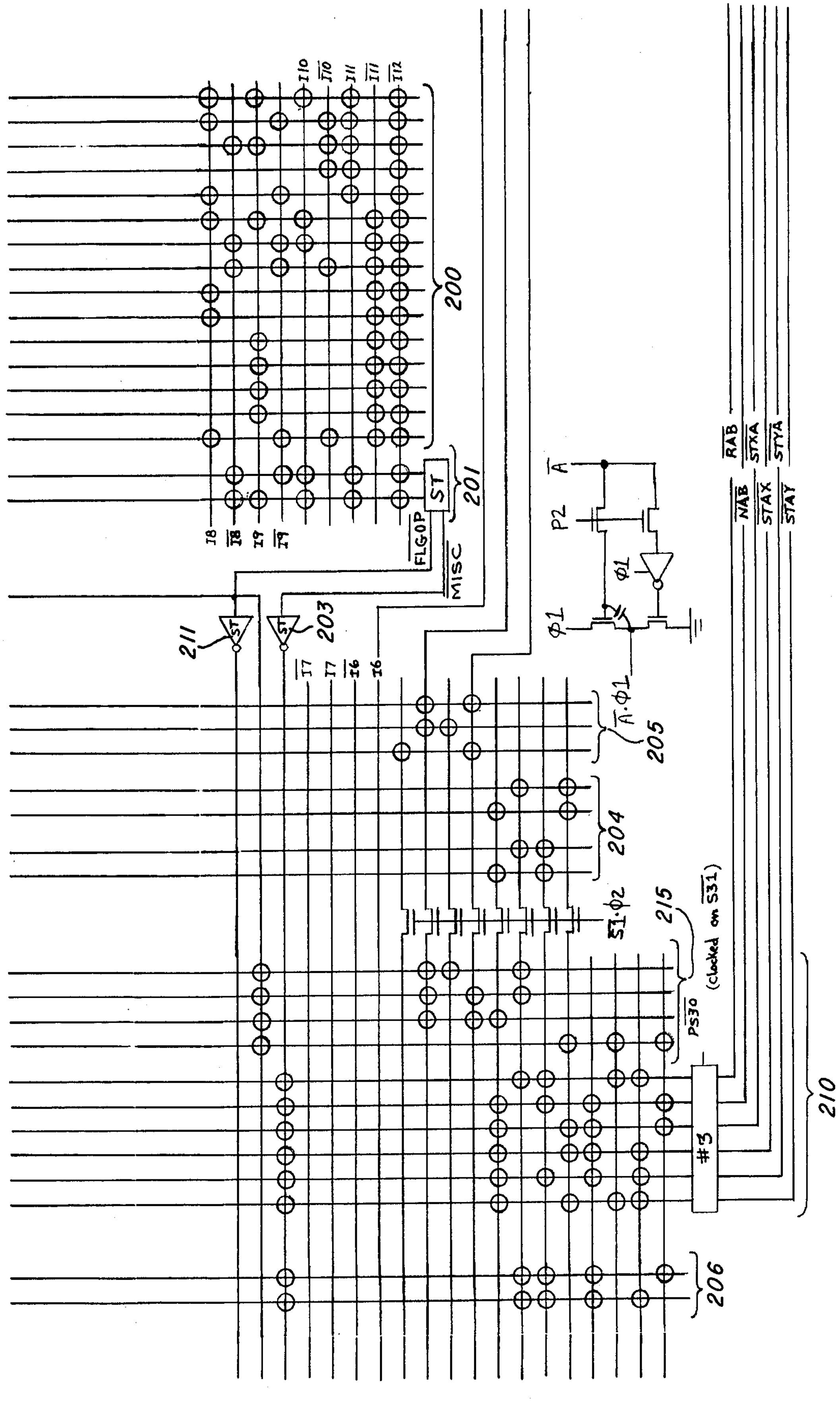
Figure 8I:
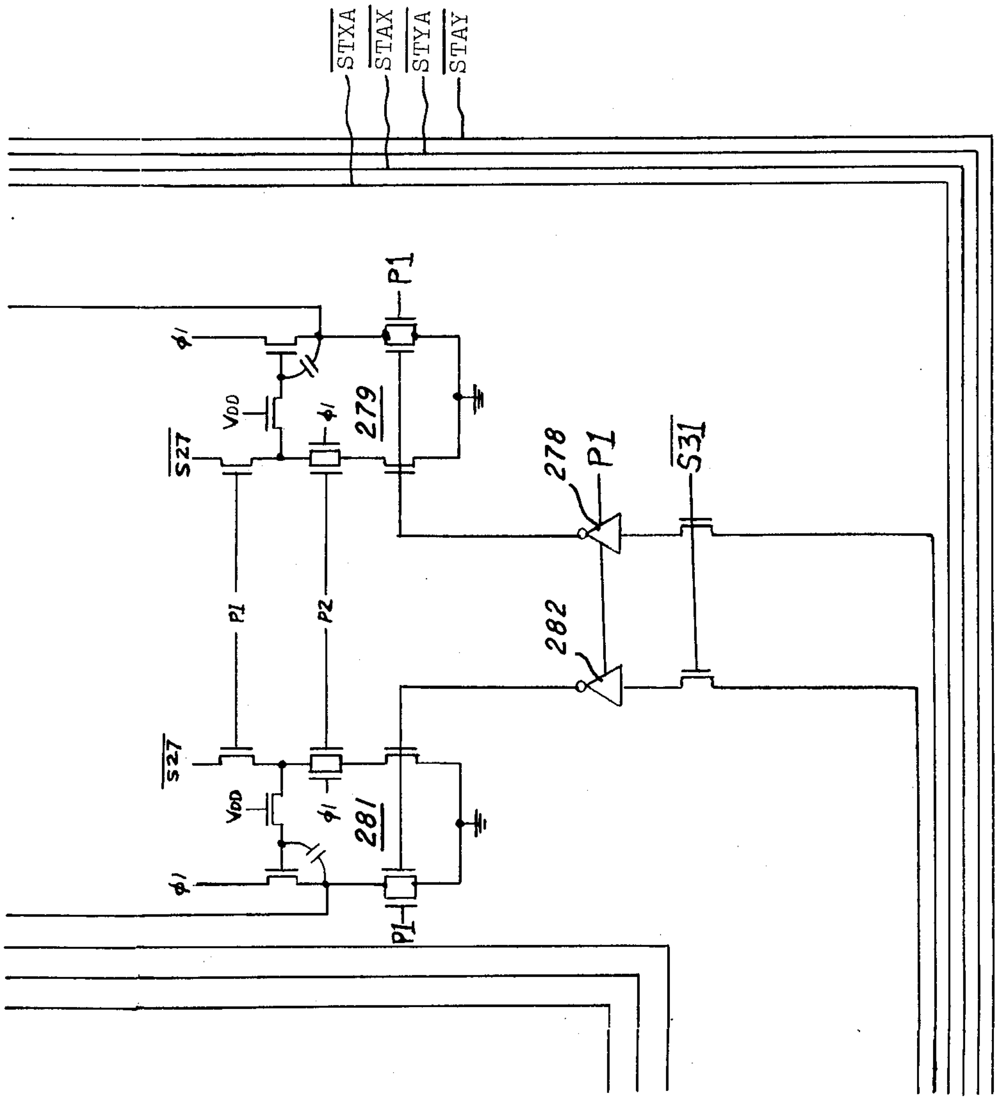

Referring now to FIG. 7, there is shown the logic diagram of the program counter 32*a*, the branch logic 32*b*, subroutine stack 33, condition latch 41, test logic, and ROM 30 along the interconnecting circuitry. The details of ROM 30 are not shown in detail in FIG. 7, however, ROM 30 is of the virtual ground type disclosed in U.S. Pat. No. 3,934,233 by Roger J. Fisher granted Jan. 20, 1976. Using the virtual ground read-only-memory of U.S. Pat. No. 3,934,233 permits the size of the ROM to be significantly reduced in comparison with the ROM's typically used in the prior art by using one ground or $V_{ss}$ line for five or more P defusions. Lines $A_0$–$A_{10}$ supply, in parallel, at time S22.$\phi$1, the eleven bit address for addressing ROM 30. Address lines $A_0$–$A_6$ address the X address decoder disclosed in U.S. Pat. No. 3,934,233 while address lines $A_7$–$A_{10}$ address the Y address decoder of U.S. Pat. No. 3,934,233. Lines $I_{12}$–$I_0$ provide, in parallel, the instruction word corresponding to the address appearing on address lines $A_0$–$A_{10}$. The false logic instruction word is clocked out of ROM 30 at S29.$\phi$2 by gates 111 and inverted to true logic by inverters 110. Address lines $A_{10}$–$A_0$ are loaded from program counter 32*a* at S22.$\phi$1 by gates 112, unless the power up clear latch 162 has inserted a logical one into complex gate 113, which in turn inhibits conduction by gates 112. The power up clear latch 162 is preferably incorporated in clock 45 and comprises a latch which preferentically enters a first state for generating the logical one to complex gate 113 when power is initially applied to the system. The state of the latch changes when the clocks turn on sufficiently to change a capacitor associated with the reset input to the latch.

Gates 114 unconditionally precharge address lines $A_0$–$A_{10}$ to Vdd at S21.$\phi$2 of each instruction cycle and when power up-clear logic finally inserts a zero into complex gate 113, the address previously received by ROM 30 is $00000000000_2$. Thus, power up-clear logic effectively forces the ROM to branch to the very first location contained therein. This automatic branch to $000_{16}$ using the ROM precharge gates 114 in combination with gates 113 is an important feature of this invention which permits the operational registers 38 and storage register 39 along with the remaining logic circuitry to be prepared for numeric operations in accordance with instruction words loaded into ROM 30 beginning at location $000_{16}$ rather than using dedicated circuitry therefore or requiring an address to be jammed into program counter 32*a* after the state of the PUC signal changes.

Program counter 32*a* comprises an eleven bit shift register, having twenty-two inverter stages 115 and gates 116 for precharging the stages, for forming an address register. A serial input to program counter 32*a* is received on line 117 and a serial output is communicated via line 118 to add-one circuit 119. Gates 143 interconnect the eleven stages of program counter 32*a* in series. Add-one circuit 119 is a simplified serial add-one circuit comprising a NAND gate 119*a*, input of which is connected to line 118 and an output of which is connected to inverter 119*b*. The output from inverter 119*b* is communicated to another input of NAND gate 119*a*, to the gate electrode of transistor 119*c* and the source electrode of transistor 119*d*. Line 118 is further connected to the source electrode of transistor 119*c* and the gate electrode of transistor 119*d*. The drain electrodes of transistors 119*c* and 119*d* are connected together and normally provide the previous eleven bit program counter address incremented by the number one on line 120. The junction between the output of NAND gate 119*a* and the input of inverter 119*b* is further interconnected with the HOLD signal generated by gate 500 (FIG. 11) and gate 291 (FIG. 8) to inhibit incrementing the previous counter address by add-one circuit 119.

The output from add-one circuit 119 normally recirculates via line 120 and gate 121 back to the input of program counter 32*a* on line 117. Gate 121 is responsive to the output from NAND gate 130 and is normally conductive except when inhibited by a $\overline{\text{RETURN OR KB BRANCH}}$ (Branch to R5) commands. Program counter 32*a* may also be loaded with either ten or eleven bits of the instruction word appearing at gates 110 via lines 122 and gates 123 and 124. When a conditional branch instruction word is decoded and branch logic 32*b* determines that the condition has been satisfied, the new branch address is loaded from the $I_0$–$I_9$ bits of the instruction word into the $A_0$–$A_9$ bits of program counter 32*a* via lines 122 and gates 123. When an unconditional branch instruction word (CALL) is decoded, gate 124 is caused to conduct at the same time as gates 123, thereby inserting eleven bits from the instruction word ($I_0$–$I_{10}$) into program counter 32*a*. The ten or eleven bits from the instruction word are loaded into program counter 32*a* after the prior ROM address plus one has recirculated serially via lines 117, 120 and gate 121.

THE SUBROUTINE STACK

The subroutine stack 33 is a three-level stack of eleven bit shift registers 33*a*, 33*b*, and 33*c*, each comprised of twenty-two inverter stages 125. Except when subroutine stack 33 is either outputting a return address to program counter 32*a* or receiving an address from program counter 32*a*, the eleven bit addresses stored therein are recirculated via gates 126. Gates 126 normally received a logical zero (i.e., are made conductive) from NAND gate 137, which provides a logical one output only upon receiving either a $\overline{\text{RETURN}}$ signal from NAND gate 135 or a $\overline{\text{CALL}}$ signal from NAND gate 136.

When an unconditional branch instruction is decoded by branch logic 32*b*, the $\overline{\text{CALL}}$ signal goes to zero permitting the present ROM address plus one to be loaded into subroutine stack register 33*a* via line 120 and gate 127 from add-one circuit 119. Addresses previously loaded into subroutine stack/registers 33*a* and 33*b* are shifted to registers 33*b* and 33*c*, respectively, by gates 128. Gates 127 and 128 are responsive to the $\overline{\text{CALL}}$ signal. If an address had previously been loaded into subroutine stack register 33*c*, it would have been lost upon the execution of another unconditional branch instruction.

Upon the decoding of a "Return" (RTN) instruction by decoder 214 (FIG. 8), the $\overline{\text{RETURN}}$ signal from NAND gate 135 goes to logical zero, thereby causing the output of NAND gate 130 to become a logical one, interrupting the normal insertion of an up-dated address via line 120 when gate 121 becomes nonconductive and forcing the contents of subroutine stack register 33*a* to be inserted into program counter 32*a* via gate 129 and line 117. Gates 131 cause the contents of subroutine stack register 33*b* to be inserted into register 33*a* and the contents of register 33*c* to be inserted into register 33*b* upon the execution of a return instruction. Gates 131 are responsive to the $\overline{\text{RETURN}}$ signal from NAND gate 135.

THE BRANCH LOGIC AND CONDITION LATCH

Branch logic 32B and condition latch 41 cooperate to control gates 123 and 124 in program counter *32a* for inserting the address portion of a branch instruction word into program counter *32a*. NAND gates 132 form the latch circuit of the condition latch 41 and are responsive to an $\overline{\text{ADDER COND SET}}$ signal from gate 401 (FIG. 10) and a LOAD R5 signal from decoder 508*c* (FIG. 11) for letting the latch. The latch is reset by either a Return or by such instruction, as is explained subsequently. Complex gates 133 are responsive to COND and $\overline{\text{COND}}$ signals produced by NAND gates 132, a $\overline{\text{PREG}}$ signal from NAND gate 146 and the $I_{10}$, $\overline{I_{10}}$, $I_{11}$ and $I_{12}$ bits which are derived from ROM 30, the $\overline{I_{10}}$ bit via inverter 134. OR gates 133*a* and 133*b* both provide a logical one output only when the state of the condition bit matches the state of the $I_{10}$ bit. Thus, the output from OR gates 133*a* and 133*b* along the $I_{12}$ and $I_{11}$ bits and the $\overline{\text{PREG}}$ signals are supplied to AND gate 133*c* which provides a logical one output only when (1) $I_{11}$ and $I_{12}$ indicates that a conditional branch instruction has been outputted from ROM 30, (2) the state of the $I_{10}$ bit and COND match and (3) $\overline{\text{PREG}}$ is a logical one indicating that the PREG test circuitry is not activated. The test circuitry and the $\overline{\text{PREG}}$ and $\overline{\text{TIRG}}$ signals associated therewith are described subsequently.

NAND gate 136 is responsive to the $I_{12}$ and the $\overline{I_{11}}$ bits and to $\overline{\text{PREG}}$ thereby providing a $\overline{\text{CALL}}$ signal to NAND gates 137 and 138 and to gates 127 and 128 unless the test circuitry has been activated. NAND gate 135 is responsive to the RTN signal from decoder 214*a* (FIG. 8) via inverter 159 and to the $\overline{\text{PREG}}$ signal for generating the $\overline{\text{RETURN}}$ signal which is a logical zero if (1) a "return" instruction has been decoded and (2) the PREG test circuitry has not been activated.

NAND gate 138 is responsive to $\overline{\text{CALL}}$ from NAND gate 136 and to $\overline{\text{TIRG}}$ for generating a CALL signal which is normally a logical zero unless (1) an unconditional branch (call) instruction has been decoded or (2) the test circuitry has been activated. NAND gate 139*a* which normally receives an S20.P1 clock signal via gate 149 in addition to the $\overline{\text{CALL}}$ signal from NAND gate 138, provides a $\overline{\text{CALL}}$ signal at S20.P1 to complex gates 139*b*. NAND gate 139*a* is responsive to an S30.P1 clock signal in gate 150 in lieu of the S20.P1 signal if the test circuitry is activated. Complex gates 139*b* output the $\overline{\text{CALL}}$ signal at S21.$\phi$1 to gate 124, unless the test circuitry is activated, in which case the CALL signal is supplied to gate 124 at S31.$\phi$1. OR gate 133*d* is responsive to the output from AND gate 133*c* and to CALL from NAND gate 138, thereby producing a logical one output upon the occurrence of either: (1) a condition/$I_{10}$ match on a conditional branch instruction, or (2) the CALL signal (on an unconditional branch instruction or PREG test mode operation). The output of OR gate 133*d* is supplied to NAND gate 133*e* along with a normal S20.P1 signal from gate 149 (or S30.P1 during TIRG test operation). NAND gate 133*e*, in conjunction with gates 140, provide a $\overline{\text{BRANCH}}$ signal at S21.$\phi$1 (S30.P1 in test mode) to gates 123 for inserting the $I_0$–$I_9$ bits of the instruction word into program counter *32a*.

Inverter 142 outputs a RETURN signal from the RTN signal received from decoder 214*a* (FIG. 8).

Gates 141 are responsive to the $I_{12}$ branch bit, the RETURN signal from inverter 142 and the S20.$\phi$1 signal fro resetting the condition latch 141 upon the occurrence of either (1) a branch instruction (e.g., $I_{12}=1$) or (2) upon a "return" instruction.

Considering now the timing of the addressing operations of program counter *32a* during normal operations, the address stored in program counter *32a* is incremented in add-one circuit 119. The incremented address is circulated back into the program counter *32a* during S2–S12.$\phi$1 when gates 143 in program counter *32a* are clocked. Thus, the incremented address in program counter *32a* is updated by state time S12 of an instruction cycle and will normally be clocked into ROM 30 at the following S22.$\phi$1 by gates 112 for reading out the next instruction word. If a conditional BRANCH (and the condition is satisfied) operation is indicated by the present instruction word read from ROM 30 (at the previous S29.$\phi$2), the present address in program counter *32a* is still incremented by add-one circuit 119 during S2–S12, but the address portion of the BRANCH instruction word is jammed into program counter *32a* by the action gates 123 and 124 at S21.$\phi$1, thereby inserting a new address one state time before the new address is to be clocked at S22.$\phi$1 into ROM 30. This one state time is sufficient to precharge and conditionally discharge the inverters 115 making up the stages of program counter *32a*. During a CALL operation, the incremented address is stored in the subroutine register *33a*, and a new address from the $I_0$–$I_{10}$ bit of the CALL instruction word is clocked into program register *32a*, a manner similar to the inputting of a BRANCH address.

THE TEST CIRCUITRY

Figure 13:
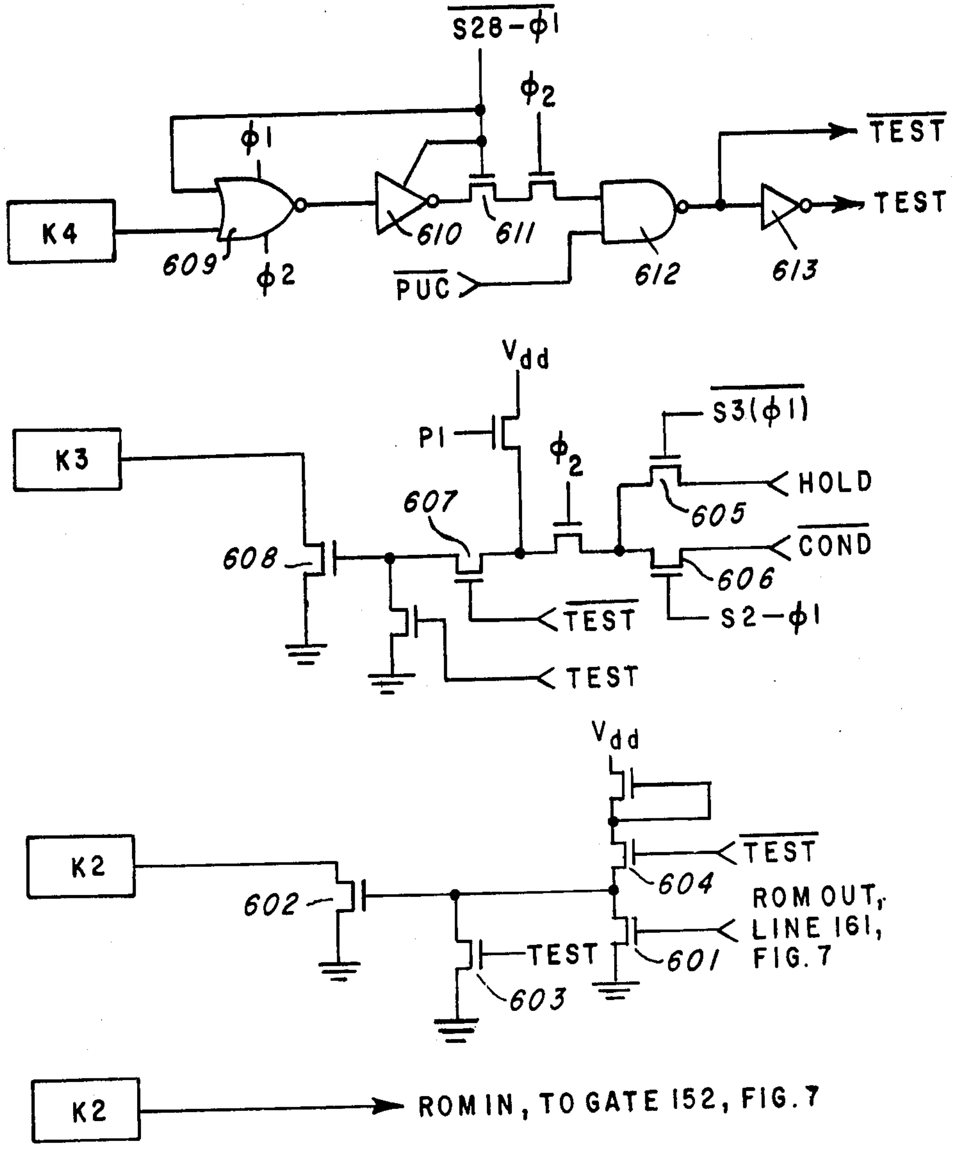
FIG. 13 is a logic diagram of circuits used to interconnect the test circuitry of FIG. 7 with the K1–K4 keyboard line pins of FIG. 11.

NAND gate 146 is responsive to TEST AND K1 signals which are clocked on $\overline{\text{S31.}\phi\text{1}}$ to provide at its output $\overline{\text{PREG}}$. NAND gate 147 is likewise responsive to TEST and K1 but is clocked at $\overline{\text{SO.}\phi\text{1}}$ to provide $\overline{\text{TIRG}}$ which is inverted to TIRG by inverter 148. PREG is generated when a ROM address is desired to be inputted directly to program counter *32a* via keyboard line K1 for test purposes. TIRG is also generated if the instruction word at the aforementioned address is desired to be serially readout of the chip on line K2 during test operations. The output from inverter 148 is supplied to gate 149 which supplies the S20.P1 clock signal to NAND gates 133*e* and 139*a*, the S20.P1 clock signal being the clock signal used during non-TIRG test operations. The TIRG signal, besides being applied as an input to NAND gate 138 is also supplied to gate 150 for supplying the S30.P1 clock signal to NAND gates 139*a* and 139*e*, the S30.P1 clock signal being provided during $\overline{\text{TIRG}}$ test operations. PREG is inverted by inverter 151 whose output is connected to gate 145, which is in line 117. Gate 145 is conductive, except during test mode operations, normally permitting the incremented address to recirculate on line 117. Thus, gate 145 inhibits the incremented address outputted from add-one circuit 119 from being inserted into program counter *32a* during test mode operations. Instead, the address to be inserted on line 117 during test mode operations is received from keyboard line K1 (FIG. 11) via gate 152 which is responsive to $\overline{\text{PREG}}$. The output from program counter *32a* is supplied to keyboard line K2 (FIG. 11) via line 118, inverter 153 and gates 601 and 602 (FIG. 13). K2 receives, as it will be subsequently shown, the $I_0$–$I_{10}$ bits of the instruction word addressed in ROM 30 during state times S2–S12 of TRIG test mode operations. Accordingly, the output from program counter 32*a* on line 118 is clocked at S2–S12 to inverter 153 via gate 154. The $I_{11}$ and $I_{12}$ bits of the instruction word are also outputted to K2, these bits being outputted during S13 and S14 via gates 155 and 156, respectively, which provide the $I_{11}$ and $I_{12}$ bits to the input of inverter 153.

As will be shown, the aforementioned PREG and TIRG test circuitry permits the instruction words implemented ROM 30 to be read out of the chip on line K2 according to addresses inserted into the chip via line K1 when the calculator has been put into a test mode via input signals which are discussed with reference to FIG. 13. Once in the PREG test mode, an address may be inserted into program counter 32*a* from K1 via gate 152. This insertion would be timed to be inserted into program counter 32*a* in the same manner as an updated address from add-one circuit 119. Any branching which might occur at the same time a PREG test operation address is inserted into program counter 32*a* (according to the previously addressed instruction word) is inhibited by the $\overline{\text{PREG}}$ inputs to AND gate 133*c* and NAND gate 136. Thus, as the old address is shifting out of the program counter 32*a* on line 118, an externally supplied address is being inputted from K1 via gate and 152 and line 117 during the same instruction cycle. The incremented address is blocked by the action gate 145. This externally supplied address is then used to address ROM 30 at the following S22.φ1.

If the chip is also placed into the TIRG test mode (in addition to PREG), the $I_0$–$I_{10}$ bits of the instruction word are clocked intp program counter 32*a* via gates 124 and 123 at S31.φ1, it being remembered that the CALL S21φ1 and BRANCH S21.φ1 signals are automatically activated at S31φ1 during TIRG test mode operations. The $I_0$–$I_{10}$ bits instruction word are then shifted out of program counter 32*a* at (S2–S12), φ1 via line 118, gate 154 and inverter 153. At the same time a new address is inputted from K1 via gate 152. Thus, during each instruction cycle, an external source may be used to address ROM 30 and the code contained in ROM 30 at that address is read out via K2, the $I_0$–$I_{10}$ bits being provided by program counter 32*a* and the $I_{11}$ and $I_{12}$ bits being provided by gates 155 and 156. It should be evident that the entire contents of the ROM 30 may be checked in approximately 2,000 instruction cycles whereas if the contents of ROM 30 were to be checked by requiring the calculator to perform all possible instructions, it should be evident that that technique would require significantly more than 2,000 instruction cycles.

Additionally, the state of the condition latch 41 is outputted as $\overline{\text{COND}}$ to keyboard line K3 (FIG. 11) via an inverter 160, responsive to latch 41, and gates 605–608 (FIG. 13). Similarly, HOLD is outputted to keyboard line K3 during test mode operations via gates 605, 607 and 608 (FIG. 13).

Referring now to FIG. 13, there is shown the test logic associated with keyboard lines K1–K4. The K1–K4 pins depicted in FIG. 13 are the same pins as the K1–K4 pins depicted in FIG. 11. The address received on line K1 is directly connected to the input to gate 152 (FIG. 7). The instruction word received from the ROM is outputted via gates 601 and 602 to pad K2. Gates 603 and 604, which are responsive to TEST and $\overline{\text{TEST}}$, respectively, isolate the instruction word output from line K2 except during test operations.

Pin K4 is responsive to a Vdd signal for producing the TEST signal. Pin K4 supplies one input to NOR gate 609. The other input to NOR gate 609 is derived S28.φ1. The output from NOR gate 609 is supplied through an inverter 610 and gate 611 to NAND gate 612. The other input of NAND 612 is responsive to the power up clear signal, $\overline{\text{PUC}}$. The output of NAND gate 612 provides the $\overline{\text{TEST}}$ signal and via inverter 613 the TEST signal.

Pin K3 is responsive to the HOLD and $\overline{\text{COND}}$ signals produced by the calculator when in a test mode. Accordingly the HOLD and $\overline{\text{COND}}$ signals are provided via gates 605 and 606, respectively, clocked at state times S3 and S2, respectively, to a gate 604 which is responsive to $\overline{\text{TEST}}$. The output from gate 607 drives a gate 608 for providing a signal to pin K3 during test operations indicative of HOLD and $\overline{\text{COND}}$.

THE INSTRUCTION WORD DECODER LOGIC

The instruction word decoder logic 31 is shown in FIG. 8. Referring now to FIG. 8, a decoder 200, which decodes the mask portion of instruction field, receives from inverters 110 (FIG. 7) the mask field (MF) of the instruction word, i.e., bits $I_{11}$–$I_8$, and their complements $\overline{I_{11}}$–$\overline{I_8}$. Decoder 200 is also responsive to the B-E (and complements $\overline{B}$–$\overline{E}$) outputs from state time generator 68 (FIG. 11), which provides a binary representation of which one of the 32 state times this system is operating in. Since there are sixteen digits in a data word and since the first digit, (DO) starts imputting at $S_0$, then the second digit begins inputting at $S_2$ and so on. Decoder 200 decodes the aforementioned bits to produce the masks MANT, LLSD, etc (FIG. 6*b*). In addition, decoder 200 decodes the $\overline{I_{12}}$ bit, thereby disabling decoder 200 when $I_{12}$ is a logical zero ($I_{12}$ is a logical one then), when a conditional or unconditional branch instruction has been outputted from ROM 30 (FIG. 7). Decoder 200 decodes the twelve mask codes which are explained with reference to FIG. 6. Remembering that a mask code indicates which bits of a data word are to be operated on by arithmetic unit 40 and which are to be merely recirculated by register selector gates 43, it is desirable that when a particular mask field has been decoded by decoder 200 that a mask signal be generated during the state times at which the particular digit of a word is to be operated on by arithmetic unit 40 in accordance with the mask codes defined in FIG. 6. Therefore, decoder 200 is responsive not only to the MF field (bits $I_{11}$–$I_8$ of the instruction word), but also to the binary representation of which one of the 32 state times the system is operating in. Since the digits are outputted only at even state times, as aforementioned, decoder 200 need not be responsive to the least significant bit from state time generator 48 on line A or $\overline{A}$.

Decoder 201, which is associated with decoder 200, is responsive to the $I_{11}$–$I_8$ bits of the instruction word and their complements, $\overline{I_{11}}$–$\overline{I_8}$ and in addition the $\overline{I_{12}}$ bit to disable the decoder 201 when a conditional or unconditional branch instruction has been outputted from ROM 30 (FIG. 7). Decoder 201 decodes the miscellaneous (MISC) and flag operation (FLGOP) codes which also occupy the MF field, as is explained with reference to TABLE I, Sections 6 and 7. As will be seen, the outputs from decoder 201, MISC (via inverter 203) and $\overline{\text{FLGOP}}$ (as well as FLGOP via inverter 211), are applied as inputs into several other decoders for disabling or enabling signals during miscellaneous or flag operations.

Decoder 210 receives bits $I_0$–$I_3$ and their complements $\overline{I_0}$–$\overline{I_3}$ of the instruction word and it is enabled only during miscellaneous operations by MISC which is derived from decoder 201 via inverter 203. Decoder 210 decodes the stack instructions, ($\overline{STAY}$, $\overline{STAX}$, $\overline{STYA}$, and $\overline{STXA}$) and the address buffer instruction ($\overline{NAB}$ and $\overline{RAB}$), which are explained in TABLE I, Section 6.

Decoders 204 and 205 decode the bit and digit defining bits, respectively, for the flag instructions (see TABLE I, Section 7, B and D fields). Decoder 204 is responsive to the A and $\overline{A}$ state time from state time generator 48 (FIG. 11), $\phi 1$ and $\phi 2$ clock pulses (which are applied to separate loads 204*a* and 204*b* associated with decoder 204) and the flag bit defining bits $I_2$–$I_3$ of the B field of the flag instruction (see TABLE I, Section 7). The $I_2$–$I_3$ bits define which bit of four in a digit is selected and decoder 204 provides enabling signal when there is a match between (1) the bit selected and (2) the time at which that bit enters arithmetic unit 40 as denied by the P1 and P2 clocks and by whether the state time is odd or even as defined by state time A. Decoder 205 decodes the digit selected (as defined by bits $I_4$–$I_5$ of the flag instruction, see TABLE I, Section 7) and is responsive to the B–E and $\overline{B-E}$ outputs from state time generator 48 (FIG. 11) for generating an enabling signal when there is a match between (1) the digit selected and (2) the time at which that digit enters arithmetic unit 40. The output from decoder 204 is nanded in decoder 216 onto line 213 and the output from decoder 205 is nanded in decoder 216 onto line 217. Lines 213 and 217 are applied to NAND gate 207 whose output is connected to input of NOR gate 212. The other input of NOR gate 212 is $\overline{FLGOP}$ from decoder 201 and thus NOR gate 212 provides a logical one output upon the decoding of flag operation instruction during the time that the bit selected in decoder 204 within the digit selected in decoder 205 is outputted from the operational registers 38 into arithmetic unit 40. The output from the mask field decoder 200 is applied to decoder 202 for performing a NAND operation thereby providing an output on line 218 of a logical zero except when (1) a mask operation has been decoded and (2) the state time counter 48 indicates that the selected bits are to be inputted to arithmetic unit 40. The outputs of NOR gates 212 and 218 are applied to the inputs of NOR gate 219 which outputs a logical one except during either (1) arithmetic mask operations decoded by decoder 200, or (2) flag bit mask operations decoded by decoders 204 and 205. It should be appreciated that the arithmetic masks and flag masks are generated slightly ahead of the time the selected digit or bit is outputted from an operational register to provide sufficient time for the MOS gates to be actuated. The output from NOR gate 219 is outputted through a series of gates 220 providing a signal $\overline{MSK\ \phi}$ which is outputted to the arithmetic unit one $\phi$ time before the corresponding data is inputted to the adder. The output from NOR gate 219 is also inverted by an inverter 222 to provide a MASK $\phi$ signal to mask delay generator 225, NAND gate 230, and gate 223, inverter 250 and gate 251.

A mask delay generator 225, whose function is more fully described with respect to the operational register selector gates 43, comprises a series of clocked inverters for providing a delayed mask signal in both true and false logic, the MD $\phi$/P signal being two state times behind the MASK $\phi$ signal provided by inverter 222. The $\overline{MD\phi}$ signal is one $\phi$ time earlier than the normal MD $\phi$/P signal and an $\overline{MDP}$ signal is provided which provides a P clock during the occurrence of an MD$\phi$/P signal.

Decoder 215 is responsive to the $\overline{FLGOP}$ signal and the $I_0$–$I_5$ bits (and their complements) of the instruction word for decoding the $\overline{STORE}$ signal (see TABLE I, Section 3, the LN field), the $\overline{SHIFT}$ signal, the $\overline{IR5}$ signal and the $\overline{2R5}$ signal (see TABLE I, Section 5, K field). Decoder 206 is responsive to the MISC signal and the $I_0$–$I_2$ bits instruction word for generating the BCDS and BCDR signals, which are indicative of whether the arithmetic unit is to BCD correct (see TABLE I, Section 6). These signals are applied to separate NAND gates 228 and 229 which are arranged as a latch. The output from this latch is the HEX signal which is indicative of whether the adder is to add in hexidecimal or is to BCD correct.

Decoder 208 is generally responsive to selected $I_0$–$I_4$ bits of the instruction word and provides a T/T output and a $\overline{K \rightarrow Y}$ output. The $\overline{T/T}$ signal is generated during flag operations when a flag is to be tested or toggled while the $\overline{K \rightarrow Y}$ signal is generated during non flag operations when the number one is desired to be loaded into the least significant masked digit position in the Y input of arithmetic unit 40. The $\overline{K \rightarrow Y}$ signal is inverted by inverter 252 and applied to one input of AND gate 251. AND gate 251 is also responsive to the MASK $\phi$ signal from inverter 222 and to a delayed $\overline{MASK\ \phi}$ signal supplied by inverter 250. Thus, upon occurrence of a K→Y signal and a MASK $\phi$ signal, AND gate 251 is effective for inserting a one into the least significant bit of the least significant digit immediately following the beginning of the MASK $\phi$ signal. The $\overline{T/T}$ signal, as will subsequently be seen, is also used to insert a one into the appropriate bit position in the Y input to arithmetic unit 40; thus the T/T is inverted by inverter 224 and applied as an input to NOR gate 226. The other input to NOR gate 226 is from the output of AND gate 251. NOR gate 226 drives a series of gates 231 which are effective for inserting the aforementioned one into the appropriate bit position in the Y input to the arithmetic unit 40.

Decoder 209 decodes the $\overline{BRK}$ signal which causes a branch to occur in branch logic 32*b*, the branch location being defined by the contents of R5 register 34 (FIG. 10). Referring again to FIG. 7, the $\overline{BKR}$ signal is supplied as an input to NAND gate 130 interrupting the normal address recirculation path via lines 120 and 117 for the updated address. BKR also closes gate 157 for inserting the contents of R5 register 34 via inverter 158 onto line 117 for insertion into program counter 32*a* via gate 145. Returning to FIG. 8, NAND gate 209*a* generates the S/RS signal which is generated during flag operations for setting or resetting a flag and the DISP signal which is generated during display operations.

Decoder 214 is responsive to the $I_7$–$I_0$ bits of the instruction word and to FLGOP, $\overline{FLGOP}$, and MISC signals for generating the signals used to operate the various register selector gates and register recirculation gates. Decoder section 214*a* generates the $\overline{RTN}$ (return) signal which is supplied to inverter 142 and to NAND gate 135 (FIG. 7). Decoder section 214*b* generators AX-DX signals and section 214*c* generates AY-DY signals, which are inverted by inverters 221. AX-DX and AY-DY signals are supplied to NAND gates 231*a*–231*d* and 232*a*–232*d*, respectively, and are indicative of which ones of the operational registers A–D are to be interconnected with the X and Y inputs to the arithmetic unity using the register selector gates 43

(FIG. 9). NAND gates 231a–231d are also responsive to the GMASK signal on line 234 and to the $\overline{STORE}$ signal generated by decoder 215. NAND gates 232a–232d are also responsive to GMASK signal on line 296. The purpose of the $\overline{STORE}$ and GMASK signals, in respect to these aforementioned NAND gates, and the timing interactions of these gates with respect to movement data within the various operational registers, between the operational registers and with arithmetic unit via register selector gates 43 will be explained subsequently with reference to FIG. 9. The 214d portion of decoder 214 decodes the $I_0$–$I_2$ bits of the instruction word, those bits corresponding to the L and LN fields in the instruction words control the operations under mask control (Table I, Section 5) for generating the $\overline{EXCH}$, $\Sigma \to K$ and $\Sigma \to J$ signals. The $\Sigma \to J$ signal is indicative of a decoded instruction indicating that the results from the arithmetic unit 40 on line $\Sigma'$ is to go to the register defined by the J field and similarly the $\Sigma \to K$ signal indicates that the results from the arithmetic unit 40 on line $\ominus'$ is to go the register defined by the K field, or neither field, in which case a binary 10 occurs in the L field, which is simply not decoded by decoder 214 (See Table I, Section 5). Decoder 214e is responsive to the FLGOP and $I_1$ and $I_0$ bits of the instruction word for decoding the $\overline{TGL}$ (TOGGLE) signal which is used invert a selected flag bit.

The EXCH, $\overline{\Sigma \to X}$, $\overline{\Sigma \to Y}$, $\overline{TGL}$, $\overline{STORE}$, and $\overline{S/RS}$ signals are supplied to a decoder 227 whose outputs are supplied to decoder 238 along with the AX-DX and AY-DY signals from inverters 221 and the SR' signal from NOR gate 237. The outputs from decoder 238 are applied as inputs to decoder 239 for decoding the recirculation signals $\overline{RA}$, $\overline{RB}$, $\overline{RC}$, and $\overline{RD}$ and the adder output signals $\overline{\Sigma A}$, $\overline{\Sigma B}$, $\overline{\Sigma C}$, and $\overline{\Sigma D}$. The $\overline{RB}$-$\overline{RD}$ recirculation signals are inverted to true logic by inverters 236. The RB-RD signals are supplied to NOR gates 235b–235d, respectively, along with a $\overline{RECMASK}$ signal from NAND gate 247 for producing $\overline{RECB}$-$\overline{RECD}$ signals. The recirculation signal $\overline{RA}$ is supplied to an input of OR gate 244 along with the EXCH' signal derived from decoder 214 via NAND gate 240, which is also responsive to $\overline{S1}$. The output of OR gate 244 supplied to a NAND gate 247 via an inverter 248. The output of NAND gate 245 is supplied to NAND gate 246 for producing a $\overline{RECA}$ signal. NAND gate 246 is also responsive to the $\overline{LA}$ (Load A) signal from inverter 249 indicating that the contents of one of the storage registers is to be outputted to operational register A.

The $\overline{\Sigma A}$-$\overline{\Sigma D}$ outputs from decoder 239 are supplied to NAND gates 233a–233d, respectively, for generating $\overline{\Sigma \to A}$-$\overline{\Sigma \to D}$ signals which are used to control selector gates 43 for determining to which one of the operational registers A–D the result outputted on line $\Sigma'$ from arithmetic unit 40 is to be communicated. NAND gates 233a–233d are also responsive to the MD signal from the output of the mask delay generator on line 253.

The right shift (SR') signal is generated by a NOR gate 237 which is responsive to the $\overline{SHIFT}$ signal from decoder 215 and to the $\overline{I_0}$ bit from the decoded instruction word. The SR' signal, besides being supplied to decoder 238, is also communicated to a NAND gate 230 for supplying an SR signal to register selector gates 43. The SR signal supplied to the register selector gates is under mask control and therefore NAND gate 230 is also responsive to the MASK$\phi$ signal from the output of inverter 222. The SR' signal is further communicated to inputs or OR gate 253 via an inverter 254. OR gate 253 is responsive to AND gate 223. AND gate 223 is responsive to a logical zero signal supplied at S 31$\phi$2, to a logical one signal supplied at A1$\phi$2 and to OR gate 294. OR gate 294 is responsive to the output from NOR gate 212 and to the mask signal on line 218. NAND gate 247 is responsive to the output of OR gate 253 and to MD$\phi$/P via line 253 from the output of the mask delay generator 225 for producing the $\overline{RECMASK}$ signal, which is provided to inverter 248 and NOR gates 235b–235d.

OR gate 243 is responsive to the $\overline{MASK\phi}$ output of NOR gate 219 and to a SHIFT signal from decoder 214 via inverter 255. The output of OR gate 243 is supplied to AND gate 256 along with MD$\phi$ from mask delay generator 225. AND gate 257 is responsive to the output from NAND gate 241, to $\overline{SHIFT}$ from decoder 215 and to $\overline{MASK\phi}$ from NOR gate 219. The outputs of AND gates 256 and 257 are supplied to NOR gate 259 which drives gate 295 for generating the GMASK signal on line 296 which supplied as an input to NAND gates 231a–231d and 232a–232d.

NAND gate 241 is responsive to the MD$\phi$/P signal on line 253 and to the EXCH signal from NAND gate 240. OR gate 242 is responsive to the $\overline{SHIFT}$ signal from decoder 215, the $I_0$ bit of the instruction word and the $\overline{MD\phi}$ signal from mask delay generator 225. The $\overline{MD\phi}$ signal is generated one $\phi$ time before than the normal MD$\phi$/P signal by mask delay generator 225. The output from OR gate 242 and the output from NAND gate 241 are supplied to a NAND gate 260 for generating an SLRC' signal. The SLRC' signal is inverted by inverter 261 and is clocked through a series of gates 262 along with the SLRC' signal for generating the SLRC and $\overline{SLRC}$ signals on lines 263 and 264, respectively. The SLRC and $\overline{SLRC}$ signals cooperate with gates 321a–321d and 320a–320d, respectively, in the register selector gates 43 (FIG. 9) and with gates 230 and 336a–d to control right or normal shifting of data as is more fully described hereinafter.

The TGL and $\overline{EXCH}'$ signals from decoder 214d are supplied to a NAND gate 274 for supplying a TGEXCH signal on line 265 to arithmetic unit 40. The load A (LA) signal supplied to inverter 249 is generated as is now explained. AND gate 266 is responsive to the $\overline{STXA}$ and $\overline{STYA}$ signals from decoder 210. A NOR gate 267 is responsive to the output from AND gate 266 and to a $\overline{COMPARE}$ signal from comparison gates 238 for generating the LA signal.

A NAND gate 234 is responsive to the MD$\phi$/P signal on line 253 and to the EXCH' signal from inverter 240 for supplying an EXCH signal under mask control to the appropriate register selector gates 43 (FIG. 9). EXCH' from NAND gate 240 is also supplied via an inverter 268 to NAND gate 269. NAND gate 269 is also responsive to the flag set/reset signal $\overline{S/RS}$ from NAND gate 209a. NAND gate 269 controls a gate 270 which connects the output of the arithmetic unit 40 on line $\Sigma'$ with the $\Sigma$ bus which is interconnected with various register selector gates 43 (FIG. 9) and to the storage registers 39. The $\overline{S/RS}$ signal is also supplied to a series of gates 271 for inserting a set or reset flag bit (as defined by $I_0$) via an inverter 272 to register selector gates via a gate 292 which is responsive to the series of gates 271.

NAND GATE 273 is responsive to the $\overline{STORE}$ signal generated by decoder 215, the $I_0$ bit of the instruction word and $\overline{FLGOP}$ from decoder 201 for generating an ADCON signal for arithmetic unit 40. ADCON is a logical one when the arithmetic unit is to add the data or the X and Y inputs and a logical zero when it is to subtract the data on the Y input from the data on the X input.

REGISTER ADDRESS BUFFER

The RAB 44 is a three bit address register shown in FIG. 8, comprising three pairs of inverters 275, the contents of which are normally recycled at S30 via gates 276. RAB 44 is selectively loadable by the $I_4$-$I_6$ bits of an instruction word via gates 277 which are controlled by a series of gates 279 responsive at S31 to a NAB signal received from decoder 210 via inverter 278. RAB 44 is also selectively loadable from the three least significant bits of the number stored in R5 register 34, via gates 280 which are actuated by a series of gates 281 responsive at S31 to a RAB signal from decoder 210 via inverter 282. The output from the three stages of RAB 44 are applied in parallel to the inputs of comparison gates 283 in storage register input/output circuit 42.

STORAGE REGISTER INPUT/OUTPUT CIRCUIT

Storage register input/output circuit 42, shown in FIG. 8, includes a three stage counter 284, each stage of which comprises two inverters, 284*a* and 284*b*. The counter is incremented once each instruction cycle by an S29 signal. The output from the three stage counter is applied on lines $\bar{R}$, $\bar{S}$, and $\bar{T}$ to comparison gates 283.

Comparison gates 283 output the $\overline{COMPARE}$ signal which is normally a logical one, a logical zero being outputted only when the state of the three bit counter 284 matches the state of the three bit number in RAB 44. The output of comparison gates 283 is connected to the inputs of four NOR gates 285*a*-285*d*. These four NOR gates are separately connected to the $\overline{STAY}$, $\overline{STYA}$, $\overline{STAX}$ and $\overline{STXA}$ signals, respectively, generated by decoder 210 and to the $\overline{COMPARE}$ signal from comparison gates 283. Thus, the four NOR gates 285*a*-*d* normally provide a logical zero output, except that a selected one of the NOR gates 285*a*-*d* will provide a logical one output upon the occurrence of (1) the decoding of a storage register operation by PLS 210 and (2) the $\overline{COMPARE}$ becoming a logical zero indicating a match between the contents of counter 284 and RAB 44. NOR gate 285*a* being responsive to the $\overline{STAY}$ and $\overline{COMPARE}$ signals, normally causes the data in the Y group of storage registers 39 to recirculate via gate 286*a* but upon receiving a $\overline{STAY}$ signal plus a $\overline{COMPARE}$ signal (e.g., both logical zeros), NOR gate 285*a* causes (via inverter 288*a*) gate 287*a* to become conductive and causes gate 286*a* to become nonconductive, thereby permitting the selected data word in the Y group storage registers to be read out on open circuited line 289*a* and to be replaced with data being read out of the 38*b* portion of operational register A into the selected storage location in the Y group via gate 287*a*. Similarly, NOR gate 285*b* normally permits recirculation in the X group of storage registers 39 via gate 286*b*, but allows a data word to be read out of operational register A into the X group via gate 287*b* which is controlled by inverter 288*b* which is in turn responsive to NOR gate 285*b*. NOR gates 285*c* and 285*d* are connected to gates 287*c* and 287*d* via inverters 288*c* and 288*d*, respectively, for providing a path for a data word to be inserted into operational register A from a selected storage register 39.

The $\overline{STAY}$, $\overline{STAX}$, $\overline{STYA}$ and $\overline{STXA}$ signals are also provided to NAND gate 290 which provides a logical 1 to NAND gate 291 when a storage register instruction has been decoded. NAND gate 291 is also responsive to COMPARE, thereby providing a logical zero $\overline{HOLD}$ signal whenever a storage register instruction has been decoded and there exists a mismatch between RAB 44 and the counter 284. The eight storage registers in each of the X and Y groups of storage registers 39 are conventional shift registers and therefore are not depicted in detail herein.

THE OPERATIONAL REGISTER SELECTOR GATES

Referring now to FIG. 9, there is shown a schematic diagram depicting the operational register selector gates. As can be seen from FIG. 9, the operational register selector gates preferably comprise a plurality of MOS transfer gates generally controlled by logic gates 230-235, 246 and 262.

As previously discussed, the operational registers A-D are divided each into two portions, a 38A portion and a 38B portion. The 38A portion provides sixty bits of storage for storing fifteen four-bit decimal digits. The 38B portions provide four bits of storage for one decimal digit. The stages of operational registers are not shown in detail, although convention 21 stages may be utilized especially if the operational registers are of the architecture depicted in FIG. 13.

At state times $S_0$, the $D_0$-$D_{14}$ digits of a data word are stored in the 38A portion of an operational register, while the $D_{15}$ digit is stored in the 38B portion of an operational register. A digit of a data word is clocked in two state times, so at state time $S_2$ the $D_{15}$ and $D_0$-$D_{13}$ digits are stored in the 38A portion while the $D_{14}$ digit is stored in the 38B portion when the data is merely recirculating via gates **316*a*-316*d*. As can be seen, there are two outputs from each operational register 38 connecting that register with the X input on line 302 or the Y input on line 303 to the arithmetic unit 40. The normal output is on line 301*a*-301*d* via gates 320*a*-320*d* and another output is on lines 305*a*-305*d*** via gates 321*a*-321*d*. The outputs from gates **320*a*-320*d*** and 321*a*-321*d* are each respectively connected to a common point 306*a*-306*d* before being interconnected by gates 310*a*-310*d* and 311*a*-311*d* with lines 302 and 303. Gates 320*a*-320*d* are responsive to the $\overline{SLRC}$ signal from line 263 (FIG. 8) while gates **221*a*-221*d* are responsive to the SLRC signal from line 264 (FIG. 8). The SLRC signal on line 263 is normally a logical 0, but becomes a logical 1 when a left shift command has been decoded by instruction word decoder logic 31** and the mask delay MD is enabled (e.g., a logical 1) or an exchange operation is indicated and MD is enabled. Thus, gates 320*a*-320*d* are normally conducting while gate 321*a*-321*d* are normally nonconducting except during the aforementioned operations. As can be seen, the normal outputs from the operational registers 38 is by lines 301*a*-301*d* to common points **306*a*-306*d***.

When a data word is not being outputted from an operation register 38, it is recirculated; and even during many outputting operations the data word also recirculates. The normal recirculation path is through gates 316*a*-316*d* for operational registers A-D. Gates 316*a*-316*d* are responsive to the $\overline{RECA}$-$\overline{RECD}$ signals generated by NAND gate 246 and NOR gates 235*b*-235*d*, respectively (FIG. 8). The recirculation gates 316*a*-316*d* connect the output of the 38B portions on line 305a–306d with the inputs to the 38A portions on lines 307a–307d.

When an entire data word is outputted to the arithmetic unit 40, the $D_0$ digit is outputted from the 38A portion while the $D_{15}$ digit is recirculated via gates 316a–316d to the 38A portion and is subsequently outputted therefrom as the last digit of the data word. Since arithmetic unit 40 has a two state time delay, the $D_0$ digit from the arithmetic unit is inputted to the 38A portion after the $D_{15}$ digit has recirculated.

Recalling that during arithmetic operations, shifting operations, and exchange operations either all or a selected portion of the data word stored in an operational register 38 may be operated on according to the indicated operation (the selected portions being operated on is dictated according to the mask field of the decoded instruction word) the operational register selector gates 43 are arranged so as to permit the nonselected portions of the data words to be recirculated while the selected portions are either shifted or read into and out of the arithmetic unit 40 or exchanged as required by the decoded instruction word.

Since the normal output from the operational registers is on lines 301a–301d, the MASK$\phi$ signal provided by inverter 222 (FIG. 8), occurs as a selected digit or digits to be operated on under a selected mask (FIG. 6) is outputted from the 38A portion. Actually, MASK$\phi$ is provided one $\phi$ time early to set up the MOS gates in time. However, because gates 321a–321d control the output from the 38B portion of operational registers A–D during the aforementioned right shift for exchange operations, a digit desired to be unmasked appears at the output of the 38B porton (e.g., the time needed to cycle through the 38B portion) later than it would have been outputted on lines 301a–301d. Thus, mask delay generator 225 (FIG. 8) delays MASK$\phi$ two state times providing an MD$\phi$/P signal which is used in controlling gates 246 and 235b–235d by controlling the RECMASK signal applied thereto except during right shift operations.

Considering now right shifting of a data word under mask control, for instance, a right shift operation to be accomplished under the MANT (FIG. 6) mask of a data word in operational register A, the $D_{15}$, $D_0$ and $D_1$ digits are first recirculated via gate 316a. Then gate 316a is opened and the $D_3$ digit being outputted from the 38A portion of operational register A is recirculated on line 301a and by gates 230a, 335a, and 336a back to the input of operational register A on line 307a. During this time, the $D_2$ digit was loaded into the 38B portion and changed to a binary 0000 by gates 308a and 309a and temporarily stored there until it is reinserted into the data word at the most significant digit under mask control at which time gates 335a and 336a are turned off and gate 316a is again turned on. Thus, it can be seen that all the digits within the MANT mask, that is the $D_2$–$D_{12}$, have been right shifted one digit, the original least significant digit being lost and a 0000 being loaded into the most significant digit. Gates 336a–336d are controlled by the RECMASK signal from NAND gate 230 (FIG. 8) which is responsive to the MASK$\phi$ and SR′ (right shift) signals. As can be seen, the recirculation gates normally operate on a two state time delay mask, but during right shift operations, must operate on a non-delayed mask. Gates 337a–337d are controlled by the respective register selector logic gates 231a–231d (FIG. 8) which are responsive to the GMASK signal on line 234 (a delayed mask in this case), $\overline{\text{STORE}}$ from decoder 215 (FIG. 8). Gates 308a–308d are responsive to the signals from NAND gates 231a–231d while gates 309a–309d are responsive to the $\overline{\text{SR}}$ signal from NAND gate 230 (FIG. 8).

During a left shift of data in operational A under the MANT mask, for instance, the $D_{15}$, $D_0$, and $D_1$ digits are recirculated by gate 316a. Thus, at the beginning of state time $S_6$, the $D_2$ digit is ready to be shifted out of portion 38B of operational register A; at this time the SLRC signal on line 263 (FIG. 8) changes to a binary one at the aforementioned two state times later than the normal MASK$\phi$ signal, and the output from the 38B portion is then applied by gates 321a and 310a to the X input of arithmetic unit 40. Recirculation gates 316a is likewise opened two state times later than a normal mask (e.g., MD controls the RECMASK signal generated by NAND gate 247). The output on Σ′ line 410 (FIG. 10) from the arithmetic unit 40 is, at the same time, applied by gates 270 (FIG. 8) and 312a to the input of operational register A. Since arithmetic unit 40 has four bits of delay associated therewith and since no data has been inputted to arithmetic unit 40, arithmetic unit 40 subsequently outputs 38a portion of operational register A on line 307a. Sine no data is being inputted into the Y input of arithmetic unit 40, arithmetic unit 40 does not alter the data being entered on the X input but merely acts as four bits of delay during a left shift operation. After the most significant digit under mask control is read out of portion 38B, the recirculation mode is re-established by gate 316a and the SLRC signals revert back to a binary zero. Thus, a 0000 is being inserted into the least significant digit under mask control and the most significant digit has been lost, the intervening digits being left shifted one digit.

During the aforementioned left shift operations, it can be seen that gates 310a–310d must be enabled on a mask delayed two state times. However, during normal arithmetic operations when data is being read out on lines 301a–301d, gates 310a–310d and similarly gates 311a–311d (which control inputting of data to the Y input of arithmetic unit 40) must be operable on a normal mask signal or a delayed mask signal, depending on the type of operation being accomplished. Thus, the NAND gates 231a–231d and 232a–232d (FIG. 8) controlling the various selector gates 310a–310d and 311a and 311d are enabled by the GMASK signal on line 234 (FIG. 8) from NAND gate 259 (FIG. 8) on the normal mask for all operations except exchange and left shift when enabled on the delayed mask MD$\phi$/P. The register selector gates 312a–312d, which control the inputting of data words into the operational registers 38 via Σ line 304 and gate 270 (FIG. 8) from the output of arithmetic unit 40 online Σ′, are controlled by NAND gates 233a–233d (FIG. 8) which are enabled only on a delayed mask because the result from arithmetic unit 40 on line Σ′ is delayed one digit (two state times) due to two-state time delay of arithmetic unit 40. NAND gates 231a–231d are also inhibited by the $\overline{\text{STORE}}$ signal from decoder 209, so that the register receiving the data word, i.e., the register defined by the J field in the instruction word and decoded by decoders 238 and 239 (FIG. 8), is inhibited from entering the arithmetic unit 40. In addition during a store operation the output from one register is applied to the arithmetic unit 40, the output from the other being inhibited by the $\overline{\text{STORE}}$ signal; thus, the adder does not alter the number being inputted and outputs the data word back to the other register, thereby storing the contents of one register in both registers.

Gates 234 (FIG. 8) and gates 314 and 315 are utilized during an exchange operation. Considering an exchange between register A and register B under mask control, the digits normally recirculate via gates 316*a*–316*d* until the delayed mask comes up, at which time gates 321*a–d* become conductive and recirculation gates 316*a* and 316*b* become nonconductive. Gates 321*a* and 321*d* are now made conductive because the SLRC signal applied thereto now becomes a logical zero upon the occurrence of an exchange operation and delayed mask signal. The output from register B is then applied by line 305*b* and gates 321*b* and 311*b* to the Y input of the arithmetic unit 40. Gate 338*b* is controlled by NAND gate 232*b* by the aforementioned delayed mask GMASK signal on line 234 (FIG. 8). In addition to going to arithmetic unit 40, the contents of operational register B appearing on the Y input to arithmetic unit 40 is communicated back to the A register by gate 315, which is actuated on a delayed mask by NAND gate 234 (FIG. 8). The output from the A register is conveyed by line 305*a* and gates 321*a* and 314 to line 304. Line 304 ($\Sigma$) is normally connected to the $\Sigma'$ line of arithmetic unit 401 however, during an exchange operation and aforementioned flag set and reset operations, line 304 is disconnected from the $\Sigma'$ line of arithmetic unit 40 by the action of gate 270 (FIG.8). Line 304 is disconnected from arithmetic unit during an exchange operation, for example, because the data being applied to line 304 from operational register A by gate 314 would otherwise be garbled by the data exiting from arithmetic unit 40. Thus the output from operational register A now on line 346 is conveyed to the input of operational register B via gate 312*b*. Gate 270 (FIG. 8) is controlled by NAND gate 269 (FIG. 8) which is responsive to the S/RS signal and to the EXCH generated by inverter 268 (FIG. 8).

As can be seen, gates 310*a*–310*d* control which one of the operational registers A–D is to be applied to the X input of the arithmetic unit 40 on line 302 via common points 306*a*–306*d*, respectively, while gates 311*a*–211*d* control which one of the operational registers A–D is to be interconnected with the Y input of the arithmetic unit 40 on line 303 via common points 306*a*–306*d*, respectively. Similarly, gates 312*a*–312*d* permit the interconnection of the output of arithmetic unit 40 on line 304 with any one of the four operational registers A–D. Permitting all the operational registers to be connected to either of the inputs or the output of arithmetic unit 40 is an important feature of the invention permitting greater flexibility in programming the calculator.

It should also be noted that during the aforementioned store and exchange operations that the exchanges and stores may be accomplished under mask control thereby providing more increased flexibility in the programming of the electronic calculator enclosed herein. This novel feature may be advantageously used, for example, when it is desired to use all sixteen digits of a data word during an arithmetic operation. Then, for example, the three mot significant digits of the data word (which are normally used for flag storage; see FIG. 6*a*) may be stored in either another operational register 38 or a storage register 39 and the thirteen digits of data word normally available for arithmetic storage is expanded to sixteen digits for performing arithmetic operations. This is highly advantageous to have more than the usual number of digits of numeric data available during certain calculations to assure that the final result is accurate; that is to say, that to assure that the final result is accurate to ten decimal places, intermediate answers to twelve or thirteen decimal places are occasionally required. The novel selector gate system 43 shown herein permits use of such greater capacity registers during such calculations without the necessity of having such large capacity registers being permanently implemented into the calculator.

ARITHMETIC UNIT

Referring now to FIG. 10, there is shown a schematic diagram depicting the arithmetic unit 40 implemented on chip 10. Arithmetic unit 40 is responsive to the HEX signal from NAND gate 229 (FIG. 8) for indicating whether arithmetic unit 40 is to be operated in binary coded decimal or hexadecimal. The HEX signal is applied to NOR gate 411 along with a logical one from $\overline{S27}$ to S1. Thus NOR gate 411 outputs in false logic a $\overline{HEX}$ signal indicating either that hexidecimal signal $\overline{BCDR}$ has been decoded in decoder 206 (FIG. 8) or that the data then entering BCD corrector 408 on line 409 then corresponds to flag bits at which time the BCD corrector 408 is automatically disabled from state time S27 through S1. The output from NOR gate 411 is applied to NAND gate 407 for disabling the BCD corrector 408 and NAND gate 406 for disabling illegal BCD code detector.

The adder 405 of arithmetic unit 40 operates on three serial data imputs, 403, 404, and 416. Inputs 403 and 404 correspond to the aforementioned X and Y inputs, which are selectively couplable to the operational registers A–D by the operational registers selector gate 43. The other input, 416, contains a CARRY/$\overline{BORROW}$ bit from complex gate 417.

ADCON (from NAND gate 273, FIG. 8) provides a SUB signal, via inverter 418 and an ADD signal via another inverter 419. Adder 405 is caused to perform a subtraction function using the two's complement technique. The two's complement is accomplished by inverting each of the bits in the subtrahend and adding a binary one to each digit on line 416 unless a borrow operation was accomplished for the prior digit.

When operating in the addition mode, adder 405 receives the Y input at gate 421 in true logic while gates 422 and 423 receive the Y input in false logic. When the inputs are inverted for two's complement subtraction, however, gate 421 receives the Y input in false logic while gates 422 and 423 receive the Y input in true logic. The conversion between true and false logic and the inversion effected for two's complment subtraction is accomplished by gates 420 and 424 and inverters 425. Gates 420 conduct during two's complement subtraction and are responsive to the ADD signal outputted by inverter 419 while gates 424 are conductive during addition operations and are responsive to the SUB signal outputted by inventer 418.

The output from adder 405 is directed on line 426 to a two stage shift register 415 and thereon by line 409 to one input of BCD corrector 408. A CARRY signal on line 427 from adder 405 is directed to NOR gate 428 and complex gate 402. Complex gate 406 determines whether an illegal BCD digit has been produced during the addition (or two's complement subtraction) of digits being entered adder 405 on lines 403 and 404, and outputs a logical one to NAND gate 428 upon detection of an illegal BCD code (unless disabled by $\overline{HEX}$) in register 415. Thus, NOR gate 428 outputs a correct signal which is a logical zero when either a carry signal is on line 427 or the aforementioned illegal BCD code has been detected by complex gate 406. Complex gate 417 is responsive to SUB, ADD, CORRECT, a C/B RESET signal and the C/B RESET signal norred with the carry signal on line 427 by NOR gate 429. The output from complex gate 417 is a logical one if (1) adder 405 is operating in an addition mode, NOR gate 428 indicates that a carry is required and C/B RESET is at zero or (2) adder 405 is operating in a subtraction mode and either a reset or a carry is indicated. During two's complement subtraction a carry indication occurs whenever the subtrahend is smaller than the minuend while a no carry indication indicates that the subtrahend is larger than the minuend, i.e., a borrow must occur and thus a zero is inserted on line 416, thereby not inserting the one normally added to the least significant bit during two's complement subtraction. Thus complex gate 417 produces a logic zero when an add mode and either no carry or a reset is indicated or when in a subtract mode and no reset or no carry are indicated. A reset condition is indicated by a logical one on C/B RESET. C/B RESET is generated by NAND gate 412 which is responsive to $\overline{SO.\phi 1}$ and to the output of NAND gate 413. NAND gate 413 is responsive to MSK$\phi$ from inverter 434 and a delayed $\overline{MSK\phi}$ supplied by inverter 414.

Complex gates 430 are responsive to CORRECT, ADD, SUB, the carry signal on line 427, and to A and P1 clocks, determining whether or not an illegal BCD code or carry condition was detected by gate 428 for causing BCD corrector 408 to add a decimal six for addition or add a ten for subtraction. For example, the addition of decimal numbers X=5 and Y=3 in the adder 405 produces binary output 1000 on line 426 which is a valid 8 in BCD. But adding X=5 and Y=7 produces an output 1100, which is invalid in BCD. Adding six (0110) to 1100 in BCD corrector 408 produces an output on line 410 of 0010. The carry is accomplished by the gates 417, 428 and 406 and the 0010 (a decimal 2) outputted from the BCD corrector 408 is of course the correct result. Since the least significant bit of each digit outputted by adder 405 need not be corrected, the least significant bit enters corrector 408 before complex gate 406 tests at $\phi$1 of every odd state time for an illegal BCD code.

A binary six or ten is produced by complex gate 430 depending on whether an addition or subtraction operation is performed. The output complex gate 430 is applied to NAND gate 407 for inserting six or ten, as indicated, so long as gate 407 is not disabled by the $\overline{HEX}$ indicating that hexadecimal arithmetic is required and so long as that adder 405 is operating in the addition mode and a carry is indicated by NOR gate 428 or that adder 405 is operating in a subtraction mode and line 427 indicates that no carry was accomplished. The aforementioned C/B RESET line 436 forces complex gate 417 to insert a one during subtraction operations in the very first bit operated on by adder 405 and inhibits an insertion of a one in the very first bit during addition operations, thereby inhibiting any inaccuracies occuring due to numbers previously existing in arithmetic unit 40 prior to insertion of desired data.

Complex gate 402 is responsive to SUB, ADD, line 427 and $\overline{CORRECT}$ thereby producing a one at its output when either (1) gate 428 indicates a carry condition during addition operations or (2) line 427 indicates a borrow condition (no carry) during subtraction operations. The output of complex gate 402 is applied to NAND gate 401, which in turn produces the $\overline{ADDER\ CONDITION\ SET}$ signal to condition latch 41 (FIG. 7).

NAND gate 401 is disabled by C/B STROBE from NOR gate 437 except at the end of a mask operation unless a toggle or exchange operation is indicated in which case NAND gate 401 is disabled by C/B STROBE regardless of the end of a mask operation being encountered. Accordingly, NOR gate 437 is responsive to TGLEXCH from NAND gate 274 (FIG. 8) and to a mask trailing edge circuit 438.

$\overline{ADDER\ CONDITION\ SET}$ is a logical zero when a carry or borrow exists for the first digit after the mask. This indicates an overflow from the mask field for producing an error indication, for instance, or for indicating a desired logical condition, depending on where in a program the overflow occurs. $\overline{ADDER\ CONDITION\ SET}$ therefor also produces a logical zero if a tested flag has been set.

REGISTER R5

R5 Register 34 is depicted in FIG. 10. Register R5 is an eight bit shift register which may be selectively loaded from either the serial output from arithmetic unit 40 on line 410 via gate 467 or may be loaded on lines KR1–3 and KR5–7 via gates 478 from keyboard logic 35 (at which times the MSB of each digit in Register R5 34 is loaded with a zero via gates 479 according to the keyboard code indicated in Table II). Data stored in R5 Register 34 may be selectively loaded into the Y input of arithmetic unit 40 via line 451 and inerter 452, or into program 32*a* (FIG. 7) via inverter 453, line 449 and inverter 158 (FIG. 7) or into RAB 44 via inverter 463. The capability of R5 Register 34 to supply addresses for program counter 32*b* or RAB 44 is an important feature of this invention providing for indirect addressing of program counter 32*b* and RAB 44.

R5 Register 34 includes sixteen inverters 454 arranged in eight stages of two inverters 454 each. Each pair of inverters 454 comprising a stage are connected via gates 448 and are connectable via recirculation gates 455, for permitting recirculation of the bit stored in each stage of R5 Register 34. Gates 450 connect the stages to permit shifting of data between the stages of R5 Register 34 in a shift register mode. R5 Register 34 normally operates in the shift register mode, receiving and storing the two least significant digits of the adder output under control of the MDP signal received via NAND gates 461 and 465*a* unless register R5 34 is loaded on lines KR1–KR3 and KR5–KR7 from keyboard logic 35 in response to a "LOAD R5" signal on line 457. R5 Register 34 also operates in a recirculation mode when a "Branch to R5" instruction has been decoded as denoted by BKR from decoder 209 (FIG. 8). Thus, recirculation gates 455 are controlled by a NAND gate 456 which is responsive to NAND gate 465*a*, $\overline{BKR}$ and LOAD R5.

The output from register R5 34 is communicated to the Y input of adder 405 via line 451 when inverter 452 is enabled by a NAND gate 458 and gate 459 and to Branch Logic 32*b* via line 449. As will be seen, NAND gate 458 and gate 459 are controlled in response to the presence of $\overline{1R5}$ or and $\overline{2R5}$ signals from decoder 215 (FIG. 8). The three least significant bits of R5 Register 34 are loadable into RAB 44 in parallel via inverters 463.

The $\overline{1R5}$ and $\overline{2R5}$ signals are applied to input of two NAND gates 460 and 461. NAND gate 461 is also responsive to a $\overline{FLGOP}$ signal from inverter 462, to the $\overline{1DP}$ signal provided by mask delay generator 225 FIG. 8) and a $\overline{MD}$ signal generated by inverter 463. Thus the output from NAND gate 461 is normally a logical one, however, a logical zero will occur when upon a $\overline{MDP}$ signal if $\overline{1R5}$, $\overline{2R5}$, and $\overline{FLGOP}$ are all a logical one, the zero output occuring for only one P time. A logical zero from NAND gate 461 is communicated through complex gates 464 to latch 465 comprising gates 465a and 465b, setting latch 465 so that the output from gate 465a is a logical one and the output from gate 465b is a logical zero. A logical zero from gate 465b enables gate 466, which in turn enables gate 467, permitting R5 Register 34 to function as a shift register and to insert the first eight bits reading out of arithmetic unit 40 on line 402 into R5 Register 34 via gate 467. As will be seen, latch 465 is reset to its normal state with a zero appearing on output of gate 465a and a one appearing on the output of 465b four state times later after R5 Register 34 has been loaded with the two least significant digits outputted on line 402. It should be noted that NAND gate 461 is operated on a delayed mask because the data being outputted on line 431 is two state times behind a normal mask.

NAND gate 468 is responsive to the $\overline{MSK\phi}$ signal from gates 220 received via inverter 434, a delayed $\overline{MSK\phi}$ signal from inverter 469 and the output from NAND gate 460, thus the output from NAND gate 468 is normally a one, but a zero occurs for one P time upon the occurrence of a $\overline{MSK\phi}$ signal and either a $\overline{1R5}$ or $\overline{R5}$ signal, thus setting latch 465a via gate 464 in much the same manner as NAND gate 461. The latch, now being set, outputs a logical one from gate 465a and a zero at gate 465b, and causes the output from gate 458 to go to a logical zero, NAND gate 458b being responsive to the output from NAND gates 465a and 460. The output from NAND gate 458 enables inverter 452 thereby inserting either 4 or 8 bits of data stored in R5 register 34 into the Y input of adder 405, the bits being inserted until latch 465 is reset to its normal reset state. Latch 465 remains in a set condition for either two or four state times, depending on whether (1) one digit is to be loaded from R5 Register 34 into the Y input of adder 405 according to a $\overline{1R5}$ signal or (2) two digits from R5 Register 34 is to be loaded into the Y input of adder 405 according to a $\overline{2R5}$ signal.

The resetting of latch 465 back to its normal condition is effected by dual speed shift register 440, which is responsive to the outputs from NAND 461 and 468 for resetting latch 465 two or four state times after the conditions occurring at the aforementioned gates set the latch. Two speed shift register 440 normally requires four state times for a bit to cycle therethrough, except when the $\overline{1R5}$ signal is a logical zero indicating that only one four bit digit is to be shifted R5 Register 34 into the Y input of adder 405, thus requiring that the latch to be reset after two state times.

Dual speed shift register 440 includes a NAND gate 470, a series of six inverters 471–476 and another NAND gate 477. The NAND gate 470, the inverters 471–476 and NAND a gate 477 are coupled in series with clocking gates 470a–476a disposed between adjacent stages. Gate 470a between NAND gate 470 and inverter 471 is clocked at $\phi 1$ and similarly gate 474a between inverters 474 and 475 is also clocked at $\phi 1$ while gate 472a between inverters 472 and 473 and gate 476a between inverter 476 and NAND gate 477 is selectively clockable at either $\phi 1$ or $\phi 2$. The other clocking gates 471a, 473a and 475a are clocked at P. As can be seen, if gates 472a and 476a are clocked at $\phi 2$ there is a two state time delay in dual speed shift register 440 whereas if gates 472a and 476a are clocked at $\phi 1$ there is a four state time delay. Gates 472a and 476a are selectively clocked at $\phi 1$ and $\phi 2$ depending upon the state of $\overline{1R5}$, gates 472a and 476a being clocked at $\phi 2$ when $\overline{1R5}$ is a logical zero and clocked at $\phi 1$ when $\overline{1R5}$ is a logical one. Thus, clocking gates 472a and 476a are responsive to $\phi 2$ when supplied via gate 441. Gate 441 is responsive to $\overline{1R5}$ inverter to true logic by inverter 442. Clocking gates 472a and 476a are also responsive to $\phi 1$ when supplied via gate 443. Gate 443 is controlled by inverter 444 which is responsive to the output of inverter 442.

SCAN GENERATOR COUNTER AND SEGMENT/KEYBOARD SCAN

The keyboard logic 35, display decoder 46, output register 47, state time generator 48, scan generator counter 36A and segment/keyboard scan 36B are depicted in FIG. 11. The scan generator counter 36A comprises a three-bit shift register, each stage of which is comprised of inverters 501 and 502, the stages providing outputs U, $\overline{U}$, V, $\overline{V}$, W, and $\overline{W}$. Scan generator counter 36A also includes a series of gates 508 which are responsive to the outputs of the inverters. The output of gates 508 is connected to the input of inverter 501 in the first stage of the counter. Inverters 501 and 502 in each stage are interconnected by gates 539 which are clocked at $S0\phi 1$ and the stages of the counter are interconnected by gates 540 clocked at S31P1. Thus, the number contained in scan generator counter 36A is updated once each instruction cycle. The number loaded in the counter is dictated by the pattern of feedback logic gates 508, which produces the output shown at reference A on FIG. 11. As can be seen, counter 36A does not "count" sequentially, but during eight instruction cycle provides the three bit binary representations of zero through seven.

Gates 508 comprise an AND gate 508a which is responsive to $\overline{U}$ and V outputs of counter 36A, an OR gate 508b responsive to the output of AND gate 508a and the W output from counter 36A, an OR gate 508c responsive to the U, $\overline{V}$, and $\overline{W}$ outputs from counter 36A, and a NAND gate 508d which is responsive to the outputs of OR gates 508b and 508c. The state of counter 36A is initialized by a RESET signal on line 505 which inserts a logical one into the 501 inverters of each stage of counter 36A. As can be seen from the table at reference A, on FIG. 11, counter 36A "counts" through the eight different possible binary stages producing the following sequence in binary: 7,6,5,2,4,0,1,3. It is only required that the counter count through the possible eight states; there is no requirement that the eight states be in any particular sequence. Counter 36A is a novel feature of this invention which derives such a nonsequential binary output.

Referring now to Table Va, there is listed the states through which counter 36a counts. As can be seen, all the bits are left shifted on bit and a new bit is inserted during each incrementing cycle, that is, once each instruction cycle. A new bit is generated by feedback logic gates 508 or other such feedback logic means. The pattern of the gates 508 has been described for the three bit counter and may be derived by taking the available signals, i.e., the output of each stage and its inverse, and solving Karnaugh equations for inserting a logical one into the least significant bit position of the next number to be generated in response to decoding an binary 6, 0, 1 or 3. Conversely, a zero is inserted into the least significant bit position of the next number to be generated when an binary 7, 5, 2 or 4 is decoded. Thus, the desired non-sequential pattern of states is generated.

Referring now to Table Vb, there is listed the states through which a four bit non-sequential counter would count, for example. Using a similar decoding scheme, that is, providing a pattern of gates similar to feedback logic gates 508 or other such feedback logic means, the outputs of the four stages and their inverses are used to provide a logical one in the least significant bit position of the next number to be generated in response to decoding a binary 0, 1, 3, 7, 14, 13, 12 or 2. The precise pattern of such gates is not shown in detail herein; however, the pattern may be derived by solving the Karnaugh equations for the aforementioned logical conditions of the feedback logic. It should be evident, moreover, that the non-sequential counter scheme here disclosed is usable with counters having more than four stages.

The segment/keyboard scan 36B is provided by an eight stage shift counter which is arranged as a ring counter for shifting a logical zero to a different stage during each instruction cycle. Each of these stages comprises a pair of inverters, 509 and 510, except for the first stage which comprises a NAND gate **509*a* and an inverter 510. The first stage drives the D segments of the display. The NAND gate 509*a* is responsive to the output of inverter 510 in the last stage and to circuit ground clocked at S31φ1. The eight stages in segment/keyboard scan 36B are interconnected by gates 514 which are clocked at S 30P1. Segment/keyboard scan 36B is further interconnected with the $\overline{\text{RESET}}$ signal on line 505 for inserting a logical one into all stages of the counter, gates 511 being used for inserting the one's into the 509 inverters. Gate 511*a* inserts a zero into the 510 inverter of the first stage, which is equivalent to inserting a one into NAND gate 509*a*. The 509*a* NAND gate is responsive to gate 512 for inserting a zero into the first stage of segment/keyboard scan during the subsequent instruction cycle. The outputs from inverters 510 in each of the stages are connected to an output driver 513** whose output is connected to the pins labeled SEG A–SEG G and SEG P. Thus, one of the segment pins (SEG A–SEG G or SEG P) is enabled during each instruction cycle following the first instruction cycle. The segment drivers also serve as the strobing lines for strobing the keyboard as shown in FIG. 2.

The $\overline{\text{RESET}}$ signal is generated as is now explained. $\overline{\text{DISP}}$, from decoder 209 (FIG. 8), is provided to a latch circuit comprised of inverters 503 and 504. The output of inverter 503, DISP, is supplied the input of an edge detecting circuit comprising an inverter 506 and a NAND gate 507. The edge detecting circuit senses a decoded display instruction for outputting $\overline{\text{RESET}}$ on line 505 to segment/keyboard scan 36B and scan generator counter 36A.

OR gate 515 is responsive to the $\overline{\text{DISP}}$ and REL HOLD signals. NAND gate 500 is responsive to the $\overline{\text{HOLD}}$ signal from NAND gate 219 (FIG. 8) and the output of OR gate 515. The output from NAND gate 500, HOLD, is supplied to the add-one circuit 119 in program counter 32A (FIG. 7). Gates 500 and 515 cooperate with add-one circuit 119 and program counter 32A to stop incrementing the number stored in program counter 32A when either the HOLD signal is generated by NAND gate 291 in response to a non-match between the contents of counter 284 and RAB 44 or upon the decoding of a display instruction until REL HOLD is generated. REL HOLD is generated by PLA 527 indicating that scan generator/counter 36A has cycled through the eight possible states thereof.

KEYBOARD LOGIC

Keyboard logic 35 comprises a decoder 517 which is driven by inverters 518 which are in turn connected by via buffers 516 to chip 10 pins (K1–K5) and conductors 16' (FIG. 2) of X/Y matrix keyboard 12. Inverters 518 normally provide a logical one output of decoder 517 thus the outputs of the decoder 517 are normally at a logical zero. However, when a key is depressed while keyboard row conductors 14 are being scanned by the outputs occurring on SEG A–SEG P, a logical zero is outputed by one of the inverters 518 thus causing a binary representation of the particular one of five keyboard lines (K1–K5) to appear on the three output lines KR5–KR7 from decoder 517. At the same time the KEY DN (key down) signal from decoder from 517 becomes a logical one, indicating that a key has been depressed. Thus, when the KR1–KR3 inputs to R5 Register 34 are loaded from the U–W outputs scan generator counters **36*a*, the KR5–KR7 inputs of R5 Register 34 are derived from the output of decoder 517, thereby producing a unique binary input on lines KR1–KR3 and KR5–KR7 for each key position of the X/Y matrix keyboard 12. The inputs to R5 Register 34 caused by keyboard logic 35 are listed in Table II. The KR1–KR3 and KR5–KR7 inputs to R5 Register 34 are inputted at S30P1 after a key is depressed while the calculator is in a display mode. NAND gate 519 is responsive to DISP, KRY DN and a S30φ1 clock; the output from NAND gate 519 is gated out at S30P1 via gate 520 providing the LOAD R5 signal to line 457 (FIG. 10) in R5 Register 34, thereby effecting the loading of R5 Register 34** with a number from lines KR1–KR3 and KR5–KR7 indicative of a particular key depressed during a display operation.

DISPLAY DECODER

Display decoder 46 receives a data representing numberals to be displayed from operational register A on line 549 and inverts the same by inverter 550. The data from operational register A is of course, in serial format and the least significant bit (in both true and false logic) is first loaded into the two input lines of programmable logic array (PLA) 521 at time P1 of an even state time (E.P1) via gates 522, the next least significant bit being loaded into two other inputs to PLA 521 via gates 523 at P2 of the same state time, the next bit being communicated at P1 of the next following odd state time (O.Pl) to two more inputs to PLA 512 via gates 524 and the most significant bit of a digit being inputted into one input of PLA 512 at the next following P2.

Display decoder 46 is also responsive to the data from operational register B, which indicates where the decimal point is to be displayed among the numerals, whether minus signs are to be provided and which digits are to be blanked according to the codes listed in Table III, which are decoded by inverters 525, 547 and 548 and NOR gate 526 in combination with PLA's 521 and 527. As is shown in Table III, the least significant bit, which is a minus sign indicator, is clocked to inverter 525 via gate 528 at P1 of an even state time (E.P1). The output from inverter 525 is the false logic minus sign which is clocked at O.P2 and E.$\phi$1 to PLA 521 and 527. A logical one in the second least significant bit of a digit from operational register B indicates that a decimal point is provided in that digit; this bit is clocked E.P2 via gate 529 and inverters 547 and 548 to PLA 527. A zero in the most significant bit of digit indicates that the digit is to be displayed (i.e. not blanked). This bit is communicated to NOR gate 526, which also receives a $\overline{\text{DISP}}$ signal from decoder 209 (FIG. 8); this bit is clocked at P2 of odd state times, providing an ENABLE signal in true logic to PLA 527. Of course, if ENABLE is a logical zero, the associated digit position is blanked (with the exception of the decimal point segment). The outputs from PLA 521 are outputted during O.P2 and E.$\phi$1; that is, after four bits of a serial data digit have been decoded in PLA 521, it is then clocked out to PLA 527. PLA 527 is also responsive to the U-W signals (indicating which segment is being scanned) provided by scan generator counter 36*a* and their inverses. Thus PLA 527 and 521 determine whether a logical one or a logical zero should be loaded into output register 47 for each digit received from operational registers A and B during the scan of a particular segment of the display. A logical one from PLA 527 loaded into a stage of output register 47 indicates that the particular character segment scanned by segment/keyboard scan 36*b* in the character position in the display corresponding to that stage of output register 47 should be actuated; a zero, on the other hand, indicates that the segment being scanned should not be actuated for the digit position corresponding to that stage. Decoder 529 "NANDS" the outputs of PLA 547 to provide twelve serial bits of data to a twelve bit shift register in output register 47.

Display decoder 46, being responsive to the contents of operation register A for the numeric information and the contents of register B for the display information, is a novel feature of this invention which reduces the amount of dedicated circuitry required for digit blanking, minus sign indication and decimal place indication. The disclosed system permits the contents of register B to be built up according to codes stored in the read-only-memory for providing the display information, thereby permitting greater flexibility in the numbers displayed. This simplifies, for example, the display of two separate numbers at the same time, one being on the right hand of the display, and the other being on the left hand side of the display and simplifies placing the negative sign adjacent to negative numbers displayed, as opposed to being on the left hand of the display as typically done in prior art display systems.

PLA 527 is also responsive to a decimal point blanking signal provided by an inverter 551 clocked at O.P2. Inverter 551 is responsive to the $\overline{\text{DISP}}$ signal from decoder 209 (FIG. 8). The ENABLE signal from NOR gate 526 is effective for disabling segments A-G of the display characters for blanking purposes. The decimal point blanking signal from inverter 551 is applied to a programmable gate 536 in decoder 527 for blanking the decimal point segment of the display. If programmable gate 536 is not programmed, then the decimal point segment in the display will actuate even when the calculator is in a nondisplaying (e.g., calculating) mode. This novel feature of the invention permits the decimal point segments of the display to appear to the operator of the electronic calculator to randomly light during calculations. This is particularly useful during long calculations, which require a second or more to accomplish, so as that the operator knows that some function is being performed and so to make the calculation time appear shorter. If the calculator is not implemented with long calculational programs, then gate 536 may be programmed to eliminate actuating the decimal point segments during calculations.

OUTPUT REGISTER

Output register 47 comprises a twelve stage shift register, each stage comprising a pair of inverters 530 and 531. Output register 47 is loaded once each instruction cycle from PLA 527 via decoder 529. During the first instruction cycle of a display cycle, the HOLD signal from NAND gate 500 inhibits incrementing of the program counter 32*a*, the D segments in the display are decoded by display decoder 46 and output register 47 is loaded with the codes for strobing the D segments of the display. Since the contents of output register 47 is not provided to the display until the following instruction cycle, keyboard/segment scan 36*b* is arranged to start scanning during the instruction cycle following the decoding of a display instruction. First the D segments are energized in appropriate digit positions for one instruction cycle, followed by the A segments during the next instruction cycle, followed by the B segments and so forth as the logical zero steps through keyboard/segment scan 36*b*.

The calculator clock (FIG. 3) is responsive to the decoding of a display instruction by decoder 209 (FIG. 8) for slowing down the clock during display operations. The clock must be slowed down during display operations if a VLED display is used because, given the time required to turn on a VLED, and the normal clock frequency of the calculator disclosed herein, the duty cycle of the display would be approximately 65%; however, with the normal clock frequency reduced by one-fourth, the duty cycle improves to approximately 95%. Even at this reduced speed the segments are scanned at a rate faster than that which the human eye may discern and therefore the segments appear to be constantly actuated. To make the display constantly actuated, a display instruction word is typically followed by a conditional branch instruction word to branch back to the address of the display instruction until the condition latch 41 has been set by a $\overline{\text{LOAD}}$ $\overline{\text{R5}}$ signal indicating that the operator is inserting new data. Moreover, in the embodiment depicted herein, preferably two display destructions are used as a pair (as denoted by reference A in FIG. 11) because the keyboard line KS7 is not strobbed until the first display cycle has been accomplished; recalling that the keyboard is responsive to an input only during the display cycle instruction as provided by NAND gate 519, the keyboard would not be sensitive to keys on the KS7 line unless two display instructions followed each other. Alternatively, of course, a trailing edge circuit could be built into the DISP signal applied to NAND gate 519 for delaying that signal one instruction.

Each of the inverters 531 in output register 47 is connected either to an inverter 553 or a NAND gate 534 or 535 via a gate 532 clocked at S30$\phi$2. Inverters 533 and NAND gates 534 and 535 are precharged to $V_{ss}$ at S30P1. The stage of output register 47 corresponding to the least significant digit (D1) is connected by a NAND gate 535 to a depletion mode device 537 for supplying a $V_{DISP}$ voltage to the pin of chip 10 (D1/SEG P) which is connected to the common electrode of the display device in the least significant character position. NAND gate 535 is also interconnected with the output of the inverter 510 in the stage of segment/keyboard scan **36*b* corresponding to segment P. Further, the driver 513 corresponding to segment P is connected at its output to the depletion load device 537 corresponding to the least significant digit position of output register 47. This permits a reduction in the number of pins used on chip 10; however, then decimal point segment (segment P) may not be actuated in the least significant digit position. The interconnection between inverter 510 and NAND gate 535** assures that the current is not sourced and sinked at the same time at the D1/SEG P pin.

Similarly, the stage corresponding most significant digit (D12) in output register 47 is also interconnected via NAND gate 534 to its depletion load device 537, thereby permitting the connection of the D12 and segment D outputs to a common pin. Thus, NAND gate 534 is also responsive to an output from inverter 510 in the segment D stage of segment/keyboard scan **36*b*. The remaining digit positions in output register 47, D2–D11 are interconnected with the appropriate pins on chip 10 via inverters 533 and gates 532 interconnecting the outputs from inverters 531 with depletion load devices 537**. Thus, for the D1 least significant character position all segments in the display except the P segment are energizable, for the D2–011 character positions all segments are energizable and for the D12 character position all segments except the D segment are energizable.

The outputs from NAND gates 534 and 535 and the output from inverters 533 are each provided to gates 538 in addition to gates 537. Gates 538 selectively interconnect the twelve display output pins (D1/SEG P-D12/SEG D) with feedback circuit 541. Feedback circuit 541 is connected with driver 513 in keyboard/segment scan 36B for maintaining a constant voltage across an actuated VLED.

STATE TIME GENERATOR

State time generator 48 is responsive to the calculator clocks $\phi$1, P1, $\phi$2 for providing a binary representation of which one of the 32 state times of the calculator is on lines A–E in true logic and lines $\overline{A-E}$ in false logic. While state time generator 48 is shown here with five stages for counting 32 possible states, it soon will be seen that state time generator 40A is expandable and reduceable to count through 2N possible states where N is equal the number of stages in the state time generator.

The first stage of state time generator 48 comprises two inverters, **542*a* and 543*a* which are arranged in series with gate 544*a*, which is clocked at time $\phi$1, forming a latch. The 543*a* gate provides the true logic A output and the output of the 542*a* gate provides the false logic $\overline{A}$ output. The output of gate 544 *a* is connected by gate 545*a* to an inverter 551*a*. The output of inverter 551*a* is used to (1) provide a CARRY indication to the other stages of the state time generator 48 indicating a CARRY condition and (2) is clocked by gate 552*a* at time P2 back to the input of inverter 543*a* for changing the state of the latch. The aforementioned gates and inverters having an "a" subscript comprise the stage in state time generator 48 corresponding to the lease significant bit. The stages in stage time generator 48 corresponding to the more significant bits are identical to the aforementioned stage except that (1) the subscripts for the gate and inverter numbers are changed to correspond to the more significant bit outputs and (2) the output from inverter 551 is clocked to the input of inverter 543 at time P2 only if a CARRY signal, i.e., a logical one, occurs at the output of inverter (s) 551 in all the preceeding less significant bit stages. Thus, gate 552*b* is responsive to not only the P2 clock signal but also the output of inverter 551*a* which is supplied by an inverter 553*a* to a gate 554*a*. Similarly, gate 552*c*, in a third stage of stage time generator 48, is responsive not only to the P2 clock signal, but also the outputs of inverters 551*a* and 551*b* via NAND gate 553*b* and gate 554*b***.

State time generator 48 operates as is now described. Assuming that state time generator 48 is at time 00011, then inverters **543*a*, 551*a*, 543*b*, 551*b*, 542*c*, 542*d*, and 542*e* are all outputting a logical one while inverters 542*a*, 542*b*, 543*c*, 551*c*, 543*d*, 551*d*, 543*e*, and 551*e* are all outputting a logical zero. At time P2, however inverter 551*a* inserts a logical one into inverter 543*a*, thus changing the output from 543*a* to a logical zero; inverter 551*b*, likewise inserts a logical one into inverter 543*b* because inverter 553*a* is outputting a logical zero, thereby causing gate 554*a* to conduct the P2 timing signal. Also, at the same time P2, inverter 551*c* inserts a logical zero into inverter 543*c* because the outputs from inverters 551*a* and 551*b* are both a logical one and the output from NAND gate 553*b* is a logical zero, thereby permitting gate 552*c* to conduct at time P2. Thus the C output becomes a logical one while the B and A outputs become logical zeros. The D and E outputs remain unchanged because NAND gate 553*c* and 553*d* both provide a logical one output, there being at least one logical zero input thereto, thus gate 554*c* and 554*d* will not conduct the P2 clock unless through to gates 552*d* and 552*e***.

As can be seen, state time generator 48 is easily expandable by providing additional stages of the type shown and described by conditionally clocking the P2 pulses to the 552 gates, condition being tested by a NAND gate 553 which is responsive to the outputs from inverters 551 in each of the less significant bit stages.

The outputs from the stages of the state time generator on lines A–E and A–E provided to a decoder 555 for providing outputs corresponding to the particular state times required by the logic circuitry shown in FIGS. 6–11. While state time generator decoder 555 is not shown with the gates being programmed, the gates would be programmed to provide indications of, for instance, the $S_0$, $S_{30}$, and $S_{31}$ state times required by the logic circuitry depicted in the FIGS. 7–11.

REGISTER CONFIGURATION

Figure 14:
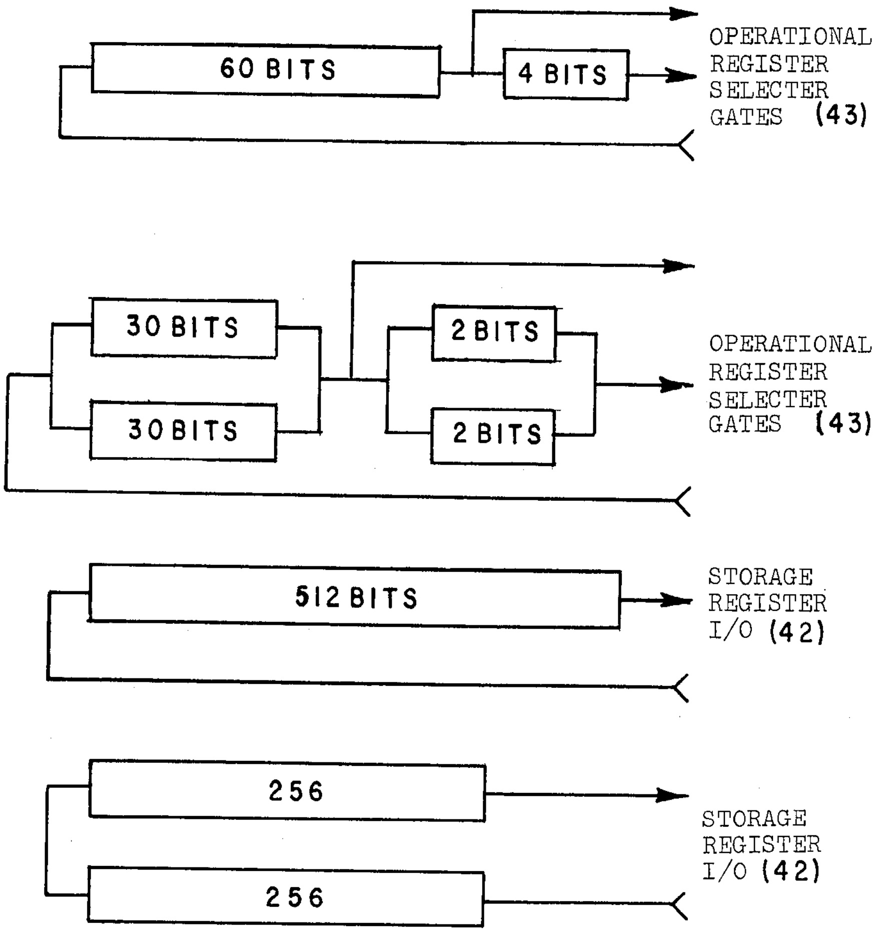
FIG. 14 depicts alternate embodiments of register architecture for the operational and storage registers of the system.

As has been previously discussed, the operational registers 38 and the storage registers 39 are generally comprised of long shift registers, the stages of which are of known design. It should be evident, however, that given the 0.625 microsecond basic clock frequency, that the shift registers of the operational registers 38 or storage registers 39 must be able to accommodate at a high bit rate and further must be able to clock one bit from one stage to a following stage in two clock cycles. While it is presently known how to implement a shift register being able to accommodate such clock rates on such a low number of clock cycles (for instance, R5 Register 34 is of such a design), the design of the stages in the operational registers 38 and storage 39 can be simplified if the bit rate were halved and there were our clock cycles to transfer a bit between adjacent tages. Referring now to FIG. 14, there is shown at 4(*a*) and 14(*c*) the operational and storage registers rranged as 60 and 512 bit shift register respectively. Iowever, utilizing the register architecture depicted in 'IGS. 14(*b*) and 14(*d*) permits four clock cycles to be sed for transferring a bit between adjacent stages in a hift register at one half the speed of the registers deicted in FIGS. 14(*a*) and 14(*c*). The pairs of 30 bit and 56 bit shift registers of FIGS. 14(*b*) and 14(*d*) which ave common outputs and inputs, are clocked on differnt phases of the same clock, i.e., one register of a pair nay be clocked on a P1 clock while the other is clocked n a P2 clock conversely, one register of a pair may be locked on a $\phi 1$ clock while the other is clocked on a 2 clock. In any event, the outputs and inputs of a egister pair tied in common with the intervening stages eing of conventional design. Moreover, the data tream at the inputs and outputs of the register pairs of 'IGS. 14(*b*) and 14(*d*) are equivalent to that of FIGS. 4(*a*) and 14(*d*) respectively. These pairs of registers is n important feature of this invention permitting the use f ordinary shift register stages in a shift register having high bit rate and a low number of clock cycles to ransfer a bit between stages thereof.

Having described the invention in connection with ertain specific embodiments thereof, further modification may now suggest itself to those skilled in the art. It s to be understood that this invention is not limited to he specific embodiments disclosed, except as set forth n the appended claims.

TABLE I

NSTRUCTIONS:

. Branch on condition - See FIG. 12(a). Program counter branches to location defined by A field (10 bits) only if C bit is the same state as is COND. in the condition latch.

. Branch Unconditionally (CALL) - See FIG. 12(b). Program counter branches to location defined by A field (11 bits). Incremented address being branched from is stored in subroutine stack.

. Branch to R5 - See FIG. 12(c). Program counter branches to location defined by contents of R5 Register. Field Q is ingored.

. Return - See FIG. 12(d). Program counter branches to location defined by the last address to be stored in subroutine stack. Field Q is ignored.

. Operations under Mask Control - See FIG. 12(e)

| | | |
|---|---|---|
| 4F | | One of twelve masks. See FIG. 6b |
| | 00 | Operational Register A |
| | 01 | Operational Register B |
| | 10 | Operational Register C |
| | 11 | Operational Register D |
|  | 000 | A is added to or substracted from contents of register defined by J |
| | 001 | B is added to or substracted from contents of register defined by J |
| | 010 | C is added to or substracted from contents of register defined by J |
| | 011 | D is added to or substracted from contents of register defined by J |
| | 100 | Decimal one is added to or substracted from contents of register defined by J |
| | 101 | Register defined by J is right on left shifted one digit |
| | 110 | R5 (LSD) is added to, substracted from or stored in the Register defined by J |
| | 111 | R5 (both digits) is added to, substracted from or stored in the Register defined by J |
| | 00 | Arithmetic result to register defined by J |
| | 01 | Arithmetic result to register defined by K(K = 000-011 only) |
| | 10 | Arithmetic result suppressed (K = 000-100 only) or shift |

TABLE I-continued

INSTRUCTIONS:

| | | |
|---|---|---|
| | | operation (K = 101) |
| | 11 | See LN field explanation |
| N | 0 | Add (Left Shift) |
| | 1 | Substract (Right Shift) |
| LN | 110 | Register to A Register exchange (J = 00 only). Content of Register A is exchanged with contents of an operational register defined by K (K = 000,001,010 or 011 only). Any exchange instruction using a mask involving D15 cannot be followed by a register instruction using a mask involving D0. |
| LN | 111 (cont) | Register to Register Store. Content of register defined by K (K = 000,001,010,011,110 or 111 only) is stored in register defined by J. |
| | 111 | If K is 100, decimal one is stored in LSD and zero in all other digits in register defined by J (mask control digits only effected). |

6. Non-Mask Operations (misc). - See FIG. 12(f). Unless otherwise specified, instruction is not dependent on content of Q.

| P Field | |
|---|---|
| 0000 | STYA - Contents of one Y group storage register defined by RAB is loaded into register A |
| 0001 | NAB - LSD of Q are stored in RAB |
| 0010 | See "branch to R5" location instruction |
| 0011 | See "return" instruction |
| 0100 | STAX - Content of register A is loaded into the X group storage register defined by RAB |
| 0101 | STAX - Contents of the X group storage register defined by RAB is loaded into Register A |
| 0110 | STAY - Contents of Register A is loaded into the Y group storage register defined by RAB |
| 0111 | DISP - Register A and Register B are outputted to the display decoder and the keyboard is scanned. A closed keyboard switch loads K5 and sets condition latch. |
| 1000 | BCDS - BCD set - enables BCD corrector in arithmetic unit |
| 1001 | BCDR - BCD reset - disables BCD corrector in arithmetic unit which then functions hexadecimal. |
| 1010 | RAB - LSD of R5 (3 bits) is stored in RAB |
| 1011-1111 | Not Used |

7. Non-Mask Operations (Flag Operations) - See FIG. 12(g)
The Flag Operation - Toggle, set, reset and test - are performed by arithmetic unit on flag address in register J, digit D and bit B. Flag test sets the condition latch if the flag is set; otherwise the condition latch is not affected. Toggle flag changes 1 to 0 or 0 to 1.

| | | |
|---|---|---|
| | | REG. |
| J | 00 | A |
| | 01 | B |
| | 10 | C |
| | 11 | D |
| | | DIGIT |
| D | 01 | $D_{13}$ |
| | 10 | $D_{14}$ |
| | 11 | $D_{15}$ |
| | | BIT |
| B | 01 | LSB |
| | 01 | LSB |
| | 10 | LSB |
| | 11 | MSB |
| F | 00 | Set Flag |
| | 01 | Reset Flag |
| | 10 | Test Flag |
| | 11 | Toggle Flag |

TABLE II

EIGHT BIT R5 REGISTER

| MSD | | | | LSD | | | |
|---|---|---|---|---|---|---|---|
| KR8 | KR7 | KR6 | KR5 | KR4 | KR3 | KR2 | KR1 |
| | R | | | | KS | | |

| K | KEYBOARD LINE ACTUATED |
|---|---|
| 001 | K1 |
| 010 | K2 |
| 011 | K3 |
| 100 | K4 |
| 101 | K5 |

| K | SEGMENT SCAN LINE ACTUATED | |
|---|---|---|
| 000 | KS0 | (SEG E) |
| 001 | KS1 | (SEG F) |
| 010 | KS2 | (SEG B) |
| 011 | KS3 | (SEG G) |
| 100 | KS4 | (SEG C) |
| 101 | KS5 | (SEG A) |
| 110 | KS6 | (SEG D/D12) |
| 111 | KS7 | (SEG P/D1) |

TABLE III

| REGISTER B DIGIT CONTROL CODE | FUNCTION |
|---|---|
| 1XXX | Display digit is blanked in the corresponding digit position. |
| 0XX1 | Turns on minus sign (Segment G) in corresponding digit position. |
| XX1X | Turns on decimal point and digit specified by register A in corresponding digit position. |
| 0XX0 | Turns on digit specified by Register A in corresponding digit position. |

TABLE IV

| INST. WORD ADDRESS (FOR COLUMN 0 IN HEX) | INSTRUCTION WORD (IN HEXADECIMAL) 0 | 1 | 2 | 3 | 4 | 5 | 6 | 7 | 8 | 9 | A | B | C | D | E | F | 10 |
|---|---|---|---|---|---|---|---|---|---|---|---|---|---|---|---|---|---|
| 000 | 1213 | 1124 | 13E8 | 1884 | 0CAE | 1808 | 16F6 | 1606 | 1665 | 1884 | 1124 | 0CAF | 1EE1 | 140C | 071E | 1A8C | 0A28 |
| 011 | 0509 | 198E | 1949 | 19F5 | 194C | 1AED | 1818 | 1A07 | 0CAE | 1DA6 | 1126 | 19F8 | 1124 | 15FF | 1884 | 1124 | 1639 |
| 022 | 1884 | 1834 | 18FA | 0CAE | 1D0C | 1126 | 0C72 | 1E4F | 0C7A | 0C70 | 1F83 | 0DA7 | 0C70 | 1A4F | 0FF1 | 1A78 | 18A0 |
| 033 | 1AE7 | 1958 | 0CAE | 1C69 | 1124 | 1A75 | 1126 | 0CAE | 1FAF | 0C72 | 1E28 | 0F27 | 1A22 | 0827 | 185C | 1874 | 1AE4 |
| 044 | 188C | 1124 | 0CAE | 1C96 | 1840 | 1126 | 0CAE | 1FC5 | 0C72 | 1F56 | 0C93 | 1A5C | 0C8D | 1A8D | 1A13 | 1AEA | 1A68 |
| 055 | 0C38 | 1860 | 0CD8 | 18A8 | 1124 | 0CAE | 1FC6 | 0CA6 | 1A8F | 0C74 | 1A7D | 0C28 | 0CAE | 1A6F | 0CDA | 0CE0 | 18AE |
| 066 | 1124 | 0C91 | 1883 | 0C62 | 186C | 0C7A | 1948 | 1124 | 18F8 | 081F | 08C1 | 1400 | 081F | 0757 | 0E04 | 070F | 1884 |
| 077 | 1308 | 0001 | 1884 | 1126 | 0CAE | 1C84 | 0C75 | 0C72 | 1E22 | 0CB2 | 0CA5 | 1888 | 0E13 | 140C | 0701 | 0C7A | 1889 |
| 088 | 0E04 | 08E0 | 08E0 | 0CEE | 1890 | 0E00 | 0701 | 0E06 | 08E1 | 0ECA | 0E05 | 0CEE | 1E18 | 1885 | 1534 | 1442 | 0707 |
| 099 | 15AE | 1589 | 0C7A | 1F84 | 075F | 1500 | 1884 | 1124 | 0C7A | 1C04 | 1666 | 0CAE | 1884 | 0324 | 1F84 | 1686 | 1600 |
| 0AA | 1884 | 0C24 | 0CAE | 1A6F | 0D1F | 1126 | 140C | 0C39 | 0C3D | 0C52 | 1C89 | 0C38 | 0C0A | 1C89 | 0C3C | 1470 | 1888 |
| 0BB | 0CEC | 0C82 | 1DA9 | 1124 | 1534 | 0CAE | 18C3 | 0CA0 | 0C7A | 18CA | 0CE6 | 0CE2 | 18CA | 0CAE | 1CAF | 080F | 0DFF |
| 0CC | 149E | 0E08 | 0D0F | 08FF | 0F25 | 1478 | 0CE2 | 1806 | 0CA2 | 1C70 | 0C2F | 1E78 | 0820 | 0C2A | 1551 | 0C2E | 1CE1 |
| 0DD | 0C26 | 0C24 | 18E3 | 0C23 | 0C28 | 0CE4 | 0807 | 0E04 | 1412 | 0717 | 07C7 | 0CE2 | 1CF8 | 0CEE | 18F0 | 0CA2 | 1875 |
| 0EE | 146C | 1875 | 0CEA | 18F3 | 0C38 | 0CA2 | 18F7 | 1601 | 18F8 | 15CE | 146C | 1A80 | 0CAE | 0CE0 | 1898 | 1080 | 1400 |
| 0FF | 1410 | 0A0D | 1908 | 0A61 | 1416 | 0A60 | 1423 | 0A61 | 18FF | 0AD9 | 1423 | 1940 | 1461 | 1080 | 1403 | 0427 | 0C30 |
| 110 | 0C34 | 0A45 | 1908 | 0A60 | 1416 | 0A61 | 1423 | 0A60 | 190E | 0C72 | 0E08 | 1910 | 1442 | 0C99 | 0717 | 15A1 | 0F4F |
| 121 | 0E03 | 0CAE | 1939 | 0C82 | 1919 | 0C62 | 0CA5 | 1921 | 0CA1 | 05E1 | 0A3F | 0C7A | 192F | 0C2C | 0CAE | 1934 | 0F67 |
| 132 | 0C78 | 0F08 | 0AC7 | 1403 | 1423 | 0CA2 | 1040 | 0CA1 | 1400 | 1410 | 0A0D | 1A1A | 0A20 | 1947 | 1080 | 0CAE | 1D29 |
| 143 | 1410 | 0CA1 | 0A21 | 1040 | 0E04 | 1940 | 0CAE | 1F98 | 0C82 | 1E1A | 0E08 | 0C80 | 1403 | 0A21 | 1054 | 0220 | 1950 |
| 154 | 0320 | 0404 | 0328 | 1958 | 0EC5 | 0401 | 1947 | 16C3 | 07C7 | 0E09 | 1416 | 0F25 | 1C10 | 0C2E | 1966 | 0C20 | 0CED |
| 165 | 0457 | 0F67 | 0C78 | 0FC9 | 0F25 | 197E | 0CDC | 0F08 | 1489 | 0F25 | 1981 | 071F | 0425 | 0401 | 0501 | 0320 | 08C7 |
| 176 | 0C40 | 0CA4 | 1DEF | 0C0E | 19EC | 17E2 | 179A | 1991 | 0F09 | 0F25 | 106C | 041F | 1745 | 05FF | 05EA | 0C3E | 198E |
| 187 | 0C3A | 0C36 | 196E | 0C3A | 0C32 | 10CA | 0F01 | 1572 | 05F8 | 071F | 152A | 0268 | 0268 | 0368 | 0368 | 0425 | 1099 |
| 198 | 0467 | 0949 | 16C3 | 0368 | 0368 | 1587 | 0CA2 | 1888 | 0568 | 0CA6 | 1888 | 0CA1 | 1465 | 1436 | 1080 | 0CEC | 0C88 |
| 1A9 | 0CA5 | 0CA0 | 0091 | 0C7A | 19AF | 00A7 | 0DA7 | 0C9C | 0C94 | 0CAE | 1985 | 0040 | 0CE2 | 1088 | 0CEE | 102A | 0040 |
| 1BA | 0040 | 0C98 | 192A | 0CA2 | 1934 | 0CA1 | 0C8A | 1DE0 | 0C2E | 1034 | 0097 | 0F3F | 00A5 | 1034 | 0C2C | 1934 | 0A27 |
| 1CB | 0A20 | 0C34 | 0CF2 | 1002 | 0FE1 | 0C38 | 0F20 | 0CF6 | 1006 | 0F20 | 0CF9 | 0CFA | 1009 | 0F20 | 0CA0 | 0CA4 | 0CEE |
| 1DC | 0CE0 | 1962 | 04E7 | 1982 | 050F | 0A3F | 0C89 | 0C9A | 1931 | 0C96 | 19E9 | 0C2C | 1931 | 0C92 | 10C8 | 1934 | 17E3 |
| 1ED | 17C7 | 1991 | 0CDE | 0520 | 1978 | 17E0 | 17CD | 1991 | 0C82 | 1D22 | 0CAE | 1D08 | 0C84 | 1405 | 0C8E | 1E03 | 07CF |
| 1FE | 152A | 0E07 | 0E07 | 1DFF | 075F | 0C86 | 1F88 | 0C8F | 1888 | 0CAE | 0CE0 | 1F18 | 1126 | 140F | 0A01 | 0E04 | 0C8D |
| 20F | 1400 | 0C31 | 0C35 | 1889 | 0191 | 0101 | 0E0A | 0E04 | 08A0 | 0E06 | 1A15 | 0C81 | 1126 | 0101 | 0891 | 0149 | 0109 |
| 220 | 0E0A | 0E04 | 0701 | 152A | 0C70 | 040E | 0268 | 040E | 0D91 | 0F25 | 1E3C | 0C92 | 1E32 | 0C90 | 02A7 | 0240 | 0248 |
| 231 | 0250 | 0C95 | 1888 | 052F | 13EF | 0530 | 1988 | 0C82 | 1C60 | 0C72 | 1A22 | 0C96 | 1E34 | 0225 | 1A42 | 0C92 | 1A48 |
| 242 | 020F | 0409 | 0258 | 07E5 | 00DC | 07F0 | 1F86 | 04CF | 025F | 0807 | 043F | 0228 | 1398 | 0C7A | 0C70 | 1E32 | 0C7C |
| 253 | 0C94 | 0549 | 1688 | 0C96 | 1A5C | 0CEC | 1465 | 0476 | 1388 | 0849 | 0860 | 0768 | 004F | 0F37 | 0C32 | 1E50 | 0C5F |
| 264 | 0861 | 1F38 | 1576 | 1A64 | 1124 | 0CAE | 1C77 | 0C2C | 0C7A | 1A6F | 0C08 | 1124 | 1780 | 0CA6 | 1E78 | 0CA4 | 1A8F |
| 275 | 1407 | 0F20 | 1A8C | 0C74 | 1963 | 1601 | 081F | 1760 | 0FE1 | 1A6F | 0FD9 | 0521 | 0625 | 0401 | 1E85 | 081F | 0717 |
| 286 | 0EC4 | 1867 | 0F25 | 1EA0 | 0F21 | 08E5 | 0E04 | 011F | 1884 | 1407 | 0867 | 0F25 | 1A94 | 0947 | 0865 | 1E9C | 085D |
| 297 | 1A69 | 0FE0 | 0E0A | 0CFA | 1C30 | 011F | 0F01 | 0C21 | 1A86 | 075F | 070E | 0C5A | 1A45 | 0C38 | 0648 | 1EA9 | 0848 |
| 2A8 | 1E7A | 150E | 1A74 | 081F | 0E04 | 07CF | 070E | 0225 | 1E89 | 15A1 | 1666 | 070F | 0E05 | 1601 | 1665 | 1450 | 07CF |
| 2B9 | 08C7 | 1A76 | 0C52 | 1A8F | 17E9 | 0265 | 1A97 | 17F6 | 15AE | 15A1 | 1A37 | 1400 | 0F4F | 0C12 | 08FF | 1ACA | 0CA0 |
| 2CA | 15F5 | 1450 | 0E04 | 07CF | 1676 | 071E | 1606 | 1636 | 1450 | 0E04 | 070F | 15E2 | 0747 | 1400 | 0265 | 1FC5 | 1606 |
| 2DB | 0E04 | 15F9 | 1864 | 156F | 07CE | 1974 | 0C7A | 1FC4 | 0CA8 | 0C30 | 0CAF | 1620 | 0C34 | 0CAF | 1501 | 0CAF | 181D |
| 2EC | 16F0 | 0C62 | 1AF1 | 0CAE | 1948 | 1124 | 0CAE | 183A | 140F | 0225 | 0C16 | 1F00 | 13F0 | 0047 | 0C55 | 15CC | 0E04 |
| 2FD | 0225 | 1F08 | 180C | 0701 | 0E04 | 1808 | 140C | 075F | 15CC | 0CE2 | 1809 | 0C12 | 0225 | 1F0C | 0C40 | 0C7A | 180F |
| 30E | 0CA3 | 079F | 0CA2 | 1883 | 0C8E | 0C86 | 1885 | 1410 | 0A20 | 1882 | 0C82 | 1810 | 0CAE | 0C7A | 1947 | 1124 | 0CAE |

TABLE IV (Cont)

| INST. WORD ADDRESS (FOR COLUMN 0 in HEX) | 0 | 1 | 2 | 3 | 4 | 5 | 6 | 7 | 8 | 9 | A | B | C | D | E | F | 10 |
|---|---|---|---|---|---|---|---|---|---|---|---|---|---|---|---|---|---|
| 31F | 1F73 | 140C | 0C7A | 1F75 | 0C36 | 1E7A | 0F20 | 0C6E | 0C86 | 1F20 | 0C51 | 0C35 | 1634 | 0F04 | 0E71 | 1454 | 0E71 |
| 330 | 0E04 | 1410 | 070F | 0E61 | 1470 | 0C86 | 1F57 | 0C4A | 0C8E | 1F57 | 1534 | 149F | 0F25 | 147A | 0C4E | 1357 | 1920 |
| 341 | 0DC7 | 149E | 0F25 | 00CF | 05FF | 05EA | 0807 | 0E0A | 05EA | 147A | 1410 | 0A01 | 0C44 | 1651 | 0C49 | 0C4C | 052C |
| 352 | 1E7A | 0561 | 1F82 | 0420 | 1553 | 0960 | 0960 | 050F | 0A7F | 0709 | 0809 | 000F | 143F | 0445 | 0A00 | 05F0 | 1872 |
| 363 | 0E09 | 0128 | 0128 | 0E0A | 08E0 | 0CEE | 165F | 00E0 | 0C0E | 1E7A | 0CDA | 185C | 0C06 | 1F50 | 165C | 0968 | 0968 |
| 374 | 1848 | 0C32 | 0C33 | 0C36 | 0C35 | 1450 | 0E04 | 0F51 | 1456 | 0E51 | 0E04 | 0E71 | 145E | 0E61 | 0E04 | 0717 | 0C44 |
| 385 | 0E91 | 1E06 | 1534 | 0C86 | 188E | 0C8E | 0C5D | 1F8E | 0C85 | 149F | 0E09 | 0F25 | 0809 | 1E38 | 0C09 | 0901 | 0550 |
| 396 | 05E4 | 0F02 | 1124 | 0C7A | 1F9E | 1534 | 1442 | 1483 | 0C12 | 18A1 | 0F67 | 0C91 | 1473 | 0C7A | 1987 | 1483 | 16A8 |
| 3A7 | 1486 | 1473 | 0C7A | 18AC | 1466 | 1465 | 0D30 | 1884 | 1124 | 0CE0 | 140C | 15F9 | 0E31 | 1450 | 146A | 0E61 | 1467 |
| 3B8 | 13F6 | 0E71 | 1467 | 1400 | 0CE6 | 0CE7 | 1F86 | 15AE | 0E41 | 1457 | 0E51 | 1467 | 1883 | 0CE0 | 1124 | 0C7A | 1FCA |
| 3C9 | 0CF4 | 0E61 | 1412 | 1410 | 0CE2 | 1CA9 | 07C7 | 07CF | 1606 | 070F | 1600 | 0E71 | 0747 | 1412 | 1500 | 0706 | 1849 |
| 3DA | 0707 | 0301 | 17CA | 17C7 | 1700 | 1795 | 1700 | 17C7 | 1794 | 1704 | 1702 | 16C3 | 03C7 | 0300 | 0347 | 0300 | 0E03 |
| 3EB | 0707 | 15F9 | 0749 | 0C67 | 0807 | 0E03 | 0000 | 0000 | 0000 | 0000 | 0000 | 0000 | 0000 | 0000 | 0000 | 0000 | 0000 |
| 3FC | 0000 | 0000 | 0000 | 0000 | 0A67 | 0F60 | 13F9 | 1410 | 0A47 | 0701 | 0E03 | 0F1F | 0E0A | 0107 | 0E05 | 0F03 | 0707 |
| 40D | 0E41 | 180A | 07C7 | 0651 | 180A | 0CE6 | 1C5E | 0F00 | 185F | 0C00 | 1624 | 0C0E | 1821 | 0A1F | 0065 | 1826 | 0E06 |
| 41E | 024F | 0A7F | 0F03 | 0AC7 | 181E | 0C0C | 0A4F | 027F | 0C49 | 0A0F | 1432 | 0861 | 1C16 | 1572 | 0577 | 0128 | 0C60 |
| 42F | 0578 | 1C10 | 1829 | 0A00 | 0C3A | 1830 | 0C36 | 1830 | 0825 | 1C30 | 0C2A | 1FF8 | 0F20 | 0801 | 0847 | 0F07 | 0F0A |
| 440 | 0F0C | 0F03 | 0A4C | 0CA5 | 0C71 | 0001 | 1C39 | 0C1A | 15C0 | 0262 | 0467 | 0460 | 0264 | 0761 | 1C66 | 0940 | 1C54 |
| 451 | 0061 | 1941 | 0C10 | 0228 | 184C | 0266 | 1560 | 0065 | 1C56 | 1941 | 0E15 | 0E61 | 1747 | 0F05 | 070E | 0EC3 | 1531 |
| 462 | 0A20 | 0C3E | 1861 | 080F | 0E03 | 07C7 | 1412 | 071F | 0F0F | 15CF | 0CE6 | 1C70 | 0E06 | 1671 | 0E04 | 071F | 0E03 |
| 473 | 0707 | 15AE | 1583 | 071E | 075F | 15CC | 071E | 0749 | 0C54 | 0C56 | 0760 | 0C54 | 0567 | 0F0F | 0C39 | 1AAA | 158D |
| 484 | 15F0 | 19A1 | 15C5 | 15C5 | 19A1 | 0C2A | 1897 | 0C36 | 1C6F | 0C32 | 1C97 | 0F21 | 0620 | 0C2F | 188E | 0C36 | 1C97 |
| 495 | 0F01 | 0420 | 0E03 | 0A01 | 0E04 | 0C74 | 0C8D | 0C85 | 031F | 0C7F | 0CA0 | 0C7F | 0C6F | 0C86 | 1CC5 | 03CF | 0E07 |
| 4A6 | 0E07 | 1C45 | 1525 | 0E07 | 0E07 | 18A4 | 0A3F | 1489 | 152E | 0E07 | 0E07 | 18A8 | 0EFF | 0C33 | 0F25 | 1033 | 0A25 |
| 4B7 | 1933 | 0C32 | 1840 | 0C36 | 1033 | 0CAF | 1841 | 0820 | 0C2E | 1C96 | 0F20 | 0F20 | 0F20 | 188E | 03C7 | 0E09 | 0C86 |
| 4C8 | 1C0E | 0C76 | 1C98 | 0E07 | 0E07 | 18DE | 0A3F | 0C36 | 0C3A | 1C0E | 0820 | 0C2F | 1807 | 0821 | 18FC | 0820 | 0C22 |
| 4D9 | 0C26 | 1C0E | 0C2A | 180F | 1461 | 1410 | 0A20 | 0E04 | 0A21 | 1432 | 0C76 | 1C98 | 0861 | 1CF9 | 0128 | 18E5 | 0F25 |
| 4EA | 1CFC | 0C2F | 18FF | 0C20 | 0C78 | 1572 | 003F | 0067 | 0C58 | 0009 | 0025 | 0007 | 1CFC | 0F37 | 0509 | 0025 | 1913 |
| 4FB | 0CAC | 031F | 157C | 05FF | 0F25 | 1033 | 1049 | 0F25 | 1933 | 0CAF | 0C7A | 1C18 | 1388 | 1119 | 0C7A | 1000 | 031F |
| 50C | 1320 | 0CAF | 1010 | 1357 | 0857 | 0CEC | 1070 | 0809 | 0891 | 0C12 | 1019 | 0021 | 0A37 | 0C1A | 191C | 0CE0 | 0C16 |
| 51D | 101F | 0CEC | 0C7A | 1922 | 0CE8 | 071F | 1119 | 1056 | 0C76 | 1931 | 0420 | 0C32 | 192F | 0349 | 0E0A | 0361 | 1031 |
| 52E | 0E09 | 035F | 0E0A | 0E07 | 0E07 | 0E03 | 0E0A | 15A1 | 0E41 | 1450 | 0749 | 0C54 | 1576 | 0709 | 0C12 | 193F | 0C67 |
| 53F | 0A67 | 0C7E | 1048 | 05C7 | 03E0 | 03E0 | 03E0 | 05E5 | 1060 | 0C04 | 0821 | 1574 | 1574 | 0C2F | 1948 | 0404 | 1961 |
| 550 | 1575 | 02C7 | 0220 | 0A54 | 1957 | 02E0 | 1953 | 02E5 | 1962 | 0221 | 03C7 | 0717 | 1588 | 0324 | 1936 | 031F | 1962 |
| 561 | 1575 | 0A65 | 1968 | 0A25 | 1968 | 0A65 | 1961 | 0226 | 02A6 | 0C06 | 197A | 0C16 | 1974 | 0460 | 0C02 | 1973 | 0C13 |
| 572 | 0E07 | 0F03 | 0821 | 0220 | 0760 | 0C50 | 0C5C | 0F03 | 0561 | 0441 | 0A07 | 0E03 | 1590 | 0220 | 0C16 | 1F7E | 0525 |
| 583 | 1049 | 15C1 | 0821 | 1982 | 0801 | 1982 | 0716 | 0349 | 0C61 | 0347 | 15C5 | 0C16 | 109C | 03A8 | 0265 | 1904 | 0C60 |
| 594 | 1597 | 0226 | 1960 | 0215 | 1903 | 0211 | 0360 | 1997 | 1550 | 03A8 | 0C16 | 1041 | 1597 | 0C39 | 0025 | 1949 | 0226 |
| 5A5 | 15C5 | 0225 | 1942 | 0701 | 0C3A | 0C39 | 1FA6 | 0707 | 1900 | 13E0 | 030F | 0001 | 0591 | 0C3F | 1942 | 0547 | 0849 |
| 5B6 | 0511 | 0561 | 1FA6 | 0320 | 1987 | 0201 | 0027 | 0C16 | 18E6 | 0521 | 0525 | 19C3 | 0C15 | 0E03 | 026D | 0C16 | 1FF6 |
| 5C7 | 0521 | 19C3 | 0527 | 0C14 | 0E03 | 0C34 | 070E | 0C3A | 1901 | 0C13 | 056F | 0C39 | 0C56 | 19EE | 0C16 | 0513 | 19F3 |
| 5D8 | 0545 | 19C0 | 0791 | 0C12 | 1964 | 0C52 | 1C60 | 0200 | 19C0 | 0209 | 075F | 1941 | 0C52 | 10FF | 0208 | 141C | 0220 |
| 5E9 | 0360 | 1560 | 0324 | 1052 | 141C | 0C16 | 19C0 | 0513 | 10CC | 0545 | 0265 | 10CA | 0220 | 1580 | 1901 | 0C38 | 075F |
| 5FA | 1401 | 154F | 0517 | 0C52 | 1941 | 13E0 | 0C38 | 0C3A | 1406 | 0225 | 1FF0 | 0C17 | 078F | 0247 | 000A | 0C11 | 0C52 |
| 60B | 1A00 | 0C10 | 0C91 | 0012 | 0C96 | 1E26 | 0508 | 1FE8 | 0201 | 0591 | 0544 | 15C0 | 0245 | 10F2 | 0C3A | 1E2F | 0220 |
| 61C | 0441 | 19E6 | 02AD | 02A5 | 10F2 | 0065 | 1A18 | 0368 | 15C5 | 1A1C | 0560 | 1424 | 0C17 | 050E | 0509 | 1A13 | 0389 |
| 62D | 0220 | 0360 | 1A2C | 0025 | 19F2 | 0360 | 0228 | 0225 | 1A2E | 15C5 | 1A2E | 1501 | 17F7 | 0701 | 0245 | 1041 | 13E0 |
| 63E | 05A1 | 1E48 | 05A1 | 1E44 | 0520 | 1A3E | 0C96 | 1A47 | 0520 | 0260 | 0C91 | 0449 | 0507 | 0978 | 0501 | 0591 | 1A5E |
| 64F | 0360 | 0320 | 1A5D | 0361 | 0361 | 0308 | 0385 | 1A52 | 0309 | 0312 | 1A5A | 0A45 | 1A4F | 03AA | 036D | 0365 | 1A53 |
| 660 | 1580 | 0017 | 094F | 053F | 19F2 | 0C30 | 0C32 | 1EA0 | 17F7 | 0507 | 0501 | 0C10 | 0225 | 1FE9 | 1584 | 0349 | 0C32 |
| 671 | 1A75 | 0067 | 0225 | 10FA | 031E | 0301 | 080F | 0821 | 1EC6 | 0821 | 1E00 | 0821 | 1E07 | 0821 | 1E0C | 0027 | 1741 |
| 682 | 031E | 0C32 | 1A90 | 0310 | 1E95 | 0310 | 028F | 0216 | 1741 | 0216 | 0250 | 1A65 | 0217 | 0358 | 0287 | 1741 | 0216 |
| 693 | 0212 | 1A8E | 0860 | 02E0 | 02E5 | 1A75 | 0C32 | 10FA | 1A87 | 0707 | 0209 | 1580 | 071E | 0C96 | 1A43 | 0C10 | 0787 |
| 6A4 | 0507 | 007F | 0560 | 0260 | 0507 | 007F | 070E | 1601 | 1001 | 1686 | 1560 | 0001 | 0C62 | 1FEA | 0009 | 0C09 | 05AF |
| 6B5 | 1A6E | 0707 | 0701 | 1707 | 1795 | 0328 | 1707 | 1700 | 1707 | 1700 | 0328 | 1700 | 1795 | 0328 | 0328 | 0328 | 0E03 |
| 6C6 | 170F | 1795 | 1794 | 0328 | 179A | 17CA | 1700 | 17C7 | 16C3 | 1A82 | 170C | 1700 | 0328 | 1795 | 1795 | 0328 | 1AC0 |
| 6D7 | 1700 | 1700 | 16C3 | 1707 | 16C6 | 1704 | 1700 | 16C2 | 1AA2 | 1124 | 0AFF | 0C76 | 0C7A | 1F52 | 0C3F | 1747 | 1304 |
| 6E8 | 0300 | 1549 | 1776 | 1536 | 1304 | 0300 | 0C12 | 1AF1 | 0313 | 0001 | 1300 | 0380 | 0355 | 1FF9 | 0C43 | 0C36 | 1A67 |
| 6F9 | 03A5 | 1FFF | 0361 | 0C36 | 1AFF | 0C13 | 0C32 | 0F25 | 1540 | 0340 | 1F07 | 0313 | 0C13 | 0FA3 | 0390 | 1F04 | 0353 |
| 70A | 0C36 | 0317 | 00C7 | 031E | 0349 | 0391 | 0047 | 0C7A | 1F15 | 1785 | 181A | 17A0 | 03C5 | 1F27 | 0303 | 031F | 0C7A |
| 71B | 1421 | 1741 | 0312 | 1765 | 03EA | 1611 | 1740 | 0306 | 030F | 1741 | 0361 | 1811 | 0443 | 0225 | 1811 | 030F | 0C3A |
| 72C | 1632 | 0C71 | 1831 | 130A | 0353 | 0316 | 1580 | 156F | 0C74 | 1F60 | 0716 | 1541 | 0757 | 1600 | 0C11 | 156F | 0C36 |
| 73D | 1846 | 13F4 | 0C35 | 1634 | 15FF | 156F | 0C76 | 1646 | 1546 | 0C01 | 0C42 | 1454 | 0C10 | 080F | 0F7F | 1384 | 1580 |
| 74E | 1F50 | 0313 | 0353 | 1307 | 1776 | 0DC7 | 0C36 | 1F5C | 1356 | 1500 | 1639 | 0C76 | 1F65 | 1600 | 0C16 | 0225 | 1F61 |
| 75F | 15FF | 0C38 | 1544 | 1500 | 1240 | 0C7A | 184A | 0C32 | 1560 | 137A | 154F | 0757 | 1500 | 0C11 | 0747 | 0C42 | 1474 |
| 770 | 1304 | 0001 | 0757 | 1501 | 1747 | 1A4A | 0201 | 03AF | 0300 | 0245 | 1C4C | 0C16 | 194C | 0C32 | 1A64 | 0701 | 0C19 |
| 781 | 0C0A | 194C | 0C18 | 194C | 0301 | 0A0F | 0821 | 1F92 | 0821 | 1F9C | 0027 | 0421 | 1A41 | 1709 | 1700 | 1700 | 1A0A |
| 792 | 170C | 170C | 1707 | 170C | 1720 | 1707 | 1702 | 1700 | 0328 | 1A6E | 170A | 170C | 170C | 1A99 | 0317 | 0A0F | 0320 |
| 7A3 | 0821 | 1A62 | 0820 | 0E03 | 1572 | 0A7F | 1A0C | 0920 | 0A0E | 0429 | 1C6F | 1F6F | 0C42 | 1C71 | 1700 | 170C | 1707 |
| 7B4 | 170F | 1709 | 170F | 1792 | 1795 | 0001 | 0328 | 1794 | 0757 | 1A01 | 1704 | 170C | 1794 | 1700 | 1709 | 1707 | 1795 |
| 7C5 | 17CA | 1889 | 0328 | 140F | 17CA | 0326 | 16F0 | 1700 | 0326 | 16E1 | 1700 | 0326 | 16F2 | 032F | 16F3 | 1700 | 0324 |
| 7D6 | 16F4 | 0328 | 16F5 | 1700 | 170C | 1700 | 1700 | 0324 | 0320 | 0320 | 0320 | 0320 | 0320 | 0320 | 0320 | 0320 | 0520 |
| 7E7 | 19C3 | 0C16 | 0301 | 1FFE | 0321 | 0C15 | 1FF4 | 0521 | 1FF3 | 0266 | 0C1F | 1959 | 0027 | 0C74 | 1901 | 0C31 | 0C12 |
| 7F8 | 16F4 | 0C74 | 0E03 | 0000 | 0000 | 0000 | 0000 | 0000 | 0000 | 0000 | 0000 | 0000 | 0C10 | 0000 | 0000 | 0000 | 0030 |

TABLE Va

| |
|---|
| 111 |
| 110 |
| 101 |
| 010 |
| 100 |
| 000 |
| 001 |
| 011 |

TABLE Vb

| |
|---|
| 1111 |
| 1110 |
| 1101 |
| 1011 |
| 0110 |
| 1100 |
| 1001 |
| 0010 |
| 0101 |
| 1010 |
| 0100 |
| 1000 |
| 0000 |
| 0001 |
| 0011 |
| 0111 |

What is claimed is:

1. A non-sequential counter having $2^N$ unique states, said counter being responsive to an incrementing signal for changing the state of said counter, said counter comprising:

(a) 2 N inverters (b) gating means interconnecting said inverters in series to form an N-stage shift register for storing N bits of data, said gating means being responsive to said incrementing signal for causing the data stored in said shift register to shift; and (c) feedback logic means responsive to the output of each of said inverters and to said incrementing signal for inserting into a first stage of the shift register a bit corresponding to the least significant bit of the next state to be generated by the counter, a logical one bit being inserted into said first stage in response to a first $2^N/2$ binary output states of said inverters and a logical zero being inserted into said first stage in response to a second $2^N/2$ binary output states of said inverters.

2. The non-sequential counter according to claim 1 wherein N is an integer number less than five.

3. A non-sequential counter having eight unique states, said counter being responsive to an incrementing signal for changing the state of said counter, said counter comprising:

(a) six inverters:

(b) gating means interconnecting first, second, third, fourth, fifth and sixth inverters in series to form a three stage shift register for storing three bits of data, said gating means being responsive to said incrementing signal for causing the data stored in said shift register to shift; and (c) feedback logic means responsive to said incrementing signal for inserting into a first stage of the register the least significant bit of the next state to be generated, said logic means comprising:

(i) an AND gate responsive to the output of said first inverter and said fourth inverter;

(ii) a first OR gate responsive to the output of said AND gate and to said sixth inverter;

(iii) a second OR gate responsive to the output of said second inverter, said third inverter and said fifth inverter; and (iv) a NAND gate responsive to the outputs of said first and second OR gates.

4. A three stage non-sequential counter responsive to an incrementing signal for changing the state of said counter, said counter counting through eight unique states and comprising:

(a) a three stage shift register for storing three bits of data;

(b) means responsive to said incrementing signal for causing bits stored in said shift register to shift; and (c) feedback logic means responsive to a binary 6, 0, 1 and 3 in said counter for inserting a logical one bit corresponding to the least significant bit of the next state to be generated into a first stage of the register and further responsive to a binary 7, 5, 2 and 4 in said counter for inserting a logical zero bit corresponding to the least significant bit of the next state to be generated into the first stage of the register.

5. A four stage non-sequential counter having sixteen unique states and being responsive to an incrementing signal for changing the state of said counter, said counter comprising:

(a) a four stage shift register for storing four bits of data;

(b) means responsive to said incrementing signal for causing bits stored in said shift register to shift; and (c) feedback logic means responsive to a binary 0, 1, 3, 7, 14, 13, 12 and 2 in said counter for inserting a logical one bit corresponding to the least significant bit of the next state to be generated into a first stage of said register and responsive to a binary 4, 5, 6, 8, 9, 10, 11 and 15 for inserting a logical zero bit corresponding to the least significant bit of the next state to be genrated into the first stage of said register.

* * * * *